United States Patent
Hall

(10) Patent No.: US 10,410,552 B2
(45) Date of Patent: *Sep. 10, 2019

(54) MODULAR DISPLAY PANEL

(71) Applicant: Ultravision Technologies, LLC, Dallas, TX (US)

(72) Inventor: William Y. Hall, Dallas, TX (US)

(73) Assignee: ULTRAVISION TECHNOLOGIES, LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/004,084

(22) Filed: Jun. 8, 2018

(65) Prior Publication Data

US 2018/0322816 A1 Nov. 8, 2018

Related U.S. Application Data

(63) Continuation of application No. 15/962,572, filed on Apr. 25, 2018, which is a continuation of application
(Continued)

(51) Int. Cl.
*G09F 13/22* (2006.01)
*G06F 3/14* (2006.01)
(Continued)

(52) U.S. Cl.
CPC .............. *G09F 13/22* (2013.01); *F21K 9/20* (2016.08); *F21K 9/90* (2013.01); *F21V 23/023* (2013.01);
(Continued)

(58) Field of Classification Search
None
See application file for complete search history.

(56) References Cited

U.S. PATENT DOCUMENTS

| 1,816,254 A | 7/1931 | Heath |
| 3,150,455 A | 9/1964 | Indorf |

(Continued)

FOREIGN PATENT DOCUMENTS

| CN | 2520549 Y | 11/2002 |
| CN | 2544372 Y | 4/2003 |

(Continued)

OTHER PUBLICATIONS

Lang, Justin, Buyers Guide, "LED Display Panels," PLSN.com, Nov. 2013, 2 pages.
(Continued)

*Primary Examiner* — Kristina N Junge
(74) *Attorney, Agent, or Firm* — Slater Matsil, LLP

(57) ABSTRACT

In one embodiment, modular light emitting diode (LED) display panel includes a plurality of LEDs is attached to a printed circuit board. A power supply is coupled to the plurality of LEDs and configured to receive direct current (DC) power. A scan controller is coupled to the plurality of LEDs, where the scan controller is configured to control operation of the plurality of LEDs in order to display received media. A housing is attached to the printed circuit board, and includes an outer major surface of the modular LED display panel and is configured to be exposed to an external environment without a protective cabinet. A waterproof integrated data and power connector is electrically coupled to the power supply, the scan controller, and to the plurality of LEDs. The modular LED display panel has an ingress protection rating of IP 65 or higher, and is cooled passively without fans.

28 Claims, 64 Drawing Sheets

Related U.S. Application Data

No. 15/885,284, filed on Jan. 31, 2018, which is a continuation of application No. 15/866,294, filed on Jan. 9, 2018, now Pat. No. 9,978,294, which is a continuation of application No. 15/369,304, filed on Dec. 5, 2016, now Pat. No. 9,916,782, which is a continuation of application No. 15/162,439, filed on May 23, 2016, now Pat. No. 9,513,863, which is a continuation of application No. 14/850,632, filed on Sep. 10, 2015, now Pat. No. 9,349,306, which is a continuation of application No. 14/444,719, filed on Jul. 28, 2014, now Pat. No. 9,134,773.

(60) Provisional application No. 62/025,463, filed on Jul. 16, 2014, provisional application No. 61/922,631, filed on Dec. 31, 2013.

(51) Int. Cl.

| | | |
|---|---|---|
| *G06F 3/147* | (2006.01) | |
| *H05K 7/20* | (2006.01) | |
| *H05K 1/18* | (2006.01) | |
| *H05K 5/03* | (2006.01) | |
| *F21V 23/02* | (2006.01) | |
| *F21V 31/00* | (2006.01) | |
| *G06F 1/16* | (2006.01) | |
| *G06F 1/18* | (2006.01) | |
| *G09G 3/32* | (2016.01) | |
| *G09F 9/302* | (2006.01) | |
| *H01B 7/282* | (2006.01) | |
| *H01B 9/00* | (2006.01) | |
| *H01B 11/02* | (2006.01) | |
| *H05K 5/00* | (2006.01) | |
| *H05K 5/02* | (2006.01) | |
| *H05K 7/14* | (2006.01) | |
| *G06F 1/26* | (2006.01) | |
| *F21K 9/20* | (2016.01) | |
| *G06F 1/20* | (2006.01) | |
| *G09G 5/14* | (2006.01) | |
| *F21K 9/90* | (2016.01) | |
| *H05K 3/32* | (2006.01) | |
| *H05K 5/06* | (2006.01) | |
| *G09G 3/00* | (2006.01) | |
| *G06T 1/60* | (2006.01) | |
| *G09G 5/00* | (2006.01) | |
| *H04N 7/00* | (2011.01) | |
| *F21Y 101/00* | (2016.01) | |
| *F21Y 115/10* | (2016.01) | |

(52) U.S. Cl.
CPC .......... *F21V 31/005* (2013.01); *G06F 1/1601* (2013.01); *G06F 1/182* (2013.01); *G06F 1/183* (2013.01); *G06F 1/188* (2013.01); *G06F 1/189* (2013.01); *G06F 1/20* (2013.01); *G06F 1/26* (2013.01); *G06F 3/147* (2013.01); *G06F 3/1423* (2013.01); *G06F 3/1446* (2013.01); *G06T 1/60* (2013.01); *G09F 9/3023* (2013.01); *G09G 3/006* (2013.01); *G09G 3/32* (2013.01); *G09G 5/003* (2013.01); *G09G 5/14* (2013.01); *H01B 7/2825* (2013.01); *H01B 9/003* (2013.01); *H01B 11/02* (2013.01); *H05K 1/181* (2013.01); *H05K 3/32* (2013.01); *H05K 5/0017* (2013.01); *H05K 5/0247* (2013.01); *H05K 5/0256* (2013.01); *H05K 5/03* (2013.01); *H05K 5/06* (2013.01); *H05K 7/1422* (2013.01); *H05K 7/1427* (2013.01); *H05K 7/20* (2013.01); *H05K 7/2039* (2013.01); *H05K 7/20127* (2013.01); *H05K 7/20136* (2013.01); *H05K 7/20954* (2013.01); *H05K 7/20963* (2013.01); *H05K 999/99* (2013.01); *F21Y 2101/00* (2013.01); *F21Y 2115/10* (2016.08); *G09F 2013/222* (2013.01); *G09G 2300/026* (2013.01); *G09G 2300/04* (2013.01); *G09G 2320/029* (2013.01); *G09G 2330/02* (2013.01); *G09G 2330/045* (2013.01); *G09G 2330/10* (2013.01); *G09G 2360/04* (2013.01); *H04N 7/00* (2013.01); *H05K 2201/066* (2013.01); *H05K 2201/10106* (2013.01); *H05K 2201/10128* (2013.01); *Y02P 70/611* (2015.11)

(56) References Cited

U.S. PATENT DOCUMENTS

| | | |
|---|---|---|
| 4,457,090 A | 7/1984 | McDonough |
| 4,497,125 A | 2/1985 | Hutchinson |
| 4,637,674 A | 1/1987 | Kobler |
| 4,782,336 A | 11/1988 | Bailey |
| 4,964,231 A | 10/1990 | De Maat et al. |
| 5,036,248 A | 7/1991 | McEwan et al. |
| 5,172,504 A | 12/1992 | De Maat et al. |
| 5,313,729 A | 5/1994 | Sakai et al. |
| 5,341,088 A | 8/1994 | Davis |
| 5,379,202 A | 1/1995 | Daun |
| 5,410,328 A | 4/1995 | Yoksza et al. |
| 5,446,440 A | 8/1995 | Gleason et al. |
| 5,523,769 A | 6/1996 | Lauer et al. |
| 5,563,470 A | 10/1996 | Li |
| 5,600,910 A | 2/1997 | Blackburn |
| 5,722,767 A | 3/1998 | Lin |
| 5,785,415 A | 7/1998 | Matsumura et al. |
| 5,796,376 A | 8/1998 | Banks |
| 5,900,850 A | 5/1999 | Bailey et al. |
| 5,914,698 A | 6/1999 | Nicholson et al. |
| 5,949,581 A | 9/1999 | Kurtenbach et al. |
| 5,990,802 A | 11/1999 | Maskeny |
| 5,991,153 A | 11/1999 | Heady |
| 6,045,240 A | 4/2000 | Hochstein |
| 6,065,854 A | 5/2000 | West et al. |
| 6,114,632 A | 9/2000 | Planas, Sr. et al. |
| 6,150,996 A | 11/2000 | Nicholson et al. |
| 6,162,849 A | 12/2000 | Zhuo et al. |
| 6,169,632 B1 | 1/2001 | Kurtenbach et al. |
| 6,175,342 B1 | 1/2001 | Nicholson et al. |
| 6,208,073 B1 | 3/2001 | Wang et al. |
| 6,237,290 B1 | 5/2001 | Tokimoto et al. |
| 6,314,669 B1 | 11/2001 | Tucker |
| 6,329,593 B1 | 12/2001 | Yang |
| 6,335,829 B1 | 1/2002 | Van De Voorde |
| 6,362,801 B1 | 3/2002 | Yuhara |
| 6,364,507 B1 | 4/2002 | Yang |
| 6,414,650 B1 | 7/2002 | Nicholson et al. |
| 6,441,943 B1 | 8/2002 | Roberts et al. |
| 6,445,373 B1 | 9/2002 | Yamamoto |
| 6,473,002 B1 | 10/2002 | Hutchison |
| 6,550,521 B1 | 4/2003 | McNabb |
| 6,558,021 B2 | 5/2003 | Wu et al. |
| 6,570,548 B2 | 5/2003 | Smith |
| 6,582,100 B1 | 6/2003 | Hochstein et al. |
| 6,595,671 B2 | 7/2003 | Lefebvre et al. |
| 6,608,264 B1 | 8/2003 | Fouladpour |
| 6,634,124 B1 | 10/2003 | Bierschbach |
| 6,657,605 B1 | 12/2003 | Boldt, Jr. et al. |
| 6,677,918 B2 | 1/2004 | Yuhara et al. |
| 6,693,551 B2 | 2/2004 | Pederson |
| 6,731,077 B1 | 5/2004 | Cheng |
| 6,737,983 B1 | 5/2004 | Temple |
| 6,741,222 B1 | 5/2004 | Tucker |
| 6,810,612 B2 | 11/2004 | Huang |
| 6,813,853 B1 | 11/2004 | Tucker |
| 6,819,303 B1 | 11/2004 | Berger et al. |
| 6,834,001 B2 | 12/2004 | Myono |

(56) References Cited

U.S. PATENT DOCUMENTS

| | | |
|---|---|---|
| 6,924,973 B2 | 8/2005 | Kim |
| 6,932,495 B2 | 8/2005 | Sloan et al. |
| 6,956,541 B2 | 10/2005 | Mcclintock |
| 6,956,545 B2 | 10/2005 | Mcclintock et al. |
| 6,998,538 B1 | 2/2006 | Fetterolf, Sr. et al. |
| 7,055,271 B2 | 6/2006 | Lutz et al. |
| 7,064,674 B2 | 6/2006 | Pederson |
| 7,072,407 B2 | 7/2006 | Schurig |
| 7,080,927 B2 | 7/2006 | Feuerborn et al. |
| 7,086,188 B2 | 8/2006 | Tsao |
| 7,091,933 B2 | 8/2006 | McClintock et al. |
| 7,102,601 B2 | 9/2006 | Devos et al. |
| 7,131,226 B2 | 11/2006 | Gray et al. |
| 7,138,659 B2 | 11/2006 | Raos et al. |
| 7,144,748 B2 | 12/2006 | Popovich |
| 7,161,558 B1 | 1/2007 | Eidem et al. |
| 7,170,480 B2 | 1/2007 | Boldt, Jr. et al. |
| 7,191,506 B2 | 3/2007 | Gray et al. |
| 7,204,602 B2 | 4/2007 | Archer |
| 7,207,693 B2 | 4/2007 | Ratcliffe |
| 7,210,957 B2 | 5/2007 | Mrakovich et al. |
| 7,220,022 B2 | 5/2007 | Allen et al. |
| 7,244,044 B2 | 7/2007 | Liao |
| 7,244,058 B2 | 7/2007 | DiPenti et al. |
| 7,245,279 B2 | 7/2007 | Wang |
| 7,267,459 B2 | 9/2007 | Matheson |
| 7,268,501 B1 | 9/2007 | Chen |
| 7,287,878 B2 | 10/2007 | Miller |
| 7,311,431 B2 | 12/2007 | Chew et al. |
| 7,319,408 B2 | 1/2008 | Temple |
| 7,325,955 B2 | 2/2008 | Lucas et al. |
| 7,334,361 B2 | 2/2008 | Schrimpf et al. |
| 7,336,195 B2 | 2/2008 | Van De Ven |
| 7,355,562 B2 | 4/2008 | Schubert et al. |
| 7,377,669 B2 | 5/2008 | Farmer et al. |
| 7,450,085 B2 | 11/2008 | Thielemans et al. |
| 7,473,020 B2 | 1/2009 | Pickering |
| 7,495,576 B2 | 2/2009 | Maskeny et al. |
| 7,502,950 B1 | 3/2009 | Brands |
| 7,520,628 B1 | 4/2009 | Sloan et al. |
| 7,543,976 B2 | 6/2009 | Abogabir |
| 7,549,777 B2 | 6/2009 | Huang |
| 7,557,781 B2 | 7/2009 | Chuang et al. |
| 7,572,043 B2 | 8/2009 | Kolstee et al. |
| 7,576,707 B2 | 8/2009 | Nishimura |
| 7,605,772 B2 | 10/2009 | Syrstad |
| 7,614,771 B2 | 11/2009 | Mckechnie et al. |
| 7,665,874 B2 | 2/2010 | Chadwell et al. |
| 7,674,000 B2 | 3/2010 | Valeno, Jr. et al. |
| 7,688,280 B2 | 3/2010 | Callegari et al. |
| 7,694,444 B2 | 4/2010 | Miller et al. |
| 7,703,941 B2 | 4/2010 | Lee |
| 7,774,968 B2 | 8/2010 | Nearman et al. |
| 7,779,568 B2 | 8/2010 | Gettelfinger et al. |
| 7,797,865 B2 | 9/2010 | Patel et al. |
| 7,823,308 B1 | 11/2010 | Munson et al. |
| 7,868,903 B2 | 1/2011 | Wendler et al. |
| 7,869,198 B1 | 1/2011 | Nearman et al. |
| 7,907,133 B2 | 3/2011 | Joffer et al. |
| 7,926,213 B1 | 4/2011 | Kludt et al. |
| 7,928,968 B2 | 4/2011 | Shon et al. |
| 7,950,174 B2 | 5/2011 | Xu |
| 7,971,378 B2 | 7/2011 | Campoy Odena |
| 7,972,031 B2 | 7/2011 | Ray et al. |
| 7,994,516 B2 | 8/2011 | Chan et al. |
| 8,007,121 B2 | 8/2011 | Elliott et al. |
| 8,016,452 B2 | 9/2011 | Dunn |
| 8,066,403 B2 | 11/2011 | Sanfilippo et al. |
| 8,074,387 B2 | 12/2011 | Mancuso |
| 8,081,145 B2 | 12/2011 | Ronkholz et al. |
| 8,092,046 B2 | 1/2012 | Wu et al. |
| 8,104,204 B1 | 1/2012 | Syrstad |
| 8,111,208 B2 | 2/2012 | Brown |
| 8,113,687 B2 | 2/2012 | Villard et al. |
| 8,115,229 B2 | 2/2012 | Christy |
| 8,122,627 B2 | 2/2012 | Miller |
| 8,130,175 B1 | 3/2012 | Joffer et al. |
| 8,136,277 B2 | 3/2012 | Patterson et al. |
| 8,136,279 B1 | 3/2012 | Nearman et al. |
| 8,154,864 B1 | 4/2012 | Nearman et al. |
| 8,156,672 B2 | 4/2012 | Xu |
| 8,168,990 B2 | 5/2012 | Christy |
| 8,172,097 B2 | 5/2012 | Nearman et al. |
| 8,183,794 B2 | 5/2012 | Grajcar |
| 8,184,114 B2 | 5/2012 | Oh et al. |
| 8,228,261 B2 | 7/2012 | Callegari et al. |
| 8,246,220 B2 | 8/2012 | Epstein et al. |
| 8,269,700 B2 | 9/2012 | Joffer et al. |
| 8,281,344 B1 | 10/2012 | Mathias |
| 8,301,939 B2 | 10/2012 | Gloege et al. |
| 8,314,433 B2 | 11/2012 | Christy |
| 8,344,410 B2 | 1/2013 | Wendler et al. |
| 8,350,788 B1 | 1/2013 | Nearman et al. |
| 8,362,696 B2 | 1/2013 | Zheng |
| 8,368,112 B2 | 2/2013 | Chan et al. |
| D681,263 S | 4/2013 | Van Eekeren et al. |
| 8,410,993 B2 | 4/2013 | Jenks et al. |
| 8,414,149 B2 | 4/2013 | Nearman |
| 8,434,898 B2 | 5/2013 | Sanfilippo et al. |
| 8,465,178 B2 | 6/2013 | Wilcox et al. |
| 8,522,494 B2 | 9/2013 | Ward |
| 8,552,928 B2 | 10/2013 | Wendler et al. |
| 8,558,755 B2 | 10/2013 | Kharrati et al. |
| 8,581,269 B2 | 11/2013 | Kuk et al. |
| 8,599,108 B2 | 12/2013 | Kline et al. |
| 8,604,509 B2 | 12/2013 | Wendler et al. |
| 8,610,779 B2 | 12/2013 | Wu |
| 8,624,425 B2 | 1/2014 | Feng et al. |
| 8,648,774 B2 | 2/2014 | Kline et al. |
| 8,678,612 B2 | 3/2014 | Jasmin, Jr. et al. |
| 8,697,458 B2 | 4/2014 | Nolan et al. |
| 8,702,048 B2 | 4/2014 | Kludt et al. |
| 8,702,262 B2 | 4/2014 | Park et al. |
| 8,714,665 B2 | 5/2014 | Campagna et al. |
| 8,740,408 B2 | 6/2014 | Yoon et al. |
| 8,766,880 B2 | 7/2014 | Kharrati et al. |
| 8,794,795 B2 | 8/2014 | Yaphe et al. |
| 8,803,766 B2 | 8/2014 | Kline et al. |
| 8,824,124 B1 | 9/2014 | Carlson et al. |
| 8,824,125 B1 | 9/2014 | Cox et al. |
| 8,858,028 B2 | 10/2014 | Kim |
| 8,870,395 B2 | 10/2014 | Wu |
| 8,922,458 B2 | 12/2014 | Sefton et al. |
| 8,929,083 B2 | 1/2015 | Cox et al. |
| 8,932,123 B2 | 1/2015 | Murayama et al. |
| 8,963,895 B2 | 2/2015 | Cope et al. |
| 9,013,367 B2 | 4/2015 | Cope |
| 9,018,846 B2 | 4/2015 | Chew |
| 9,047,039 B2 | 6/2015 | Perkins et al. |
| 9,047,791 B2 | 6/2015 | Cox et al. |
| 9,052,085 B2 | 6/2015 | Chan |
| 9,058,755 B2 | 6/2015 | Cope et al. |
| 9,069,519 B1 | 6/2015 | Hall |
| 9,071,809 B2 | 6/2015 | Cope et al. |
| 9,108,261 B1 | 8/2015 | Patrick |
| 9,131,600 B1 | 9/2015 | Hall |
| 9,134,773 B2 | 9/2015 | Hall |
| 9,164,722 B2 | 10/2015 | Hall |
| 9,167,191 B2 | 10/2015 | Kondo et al. |
| 9,195,281 B2 | 11/2015 | Hall |
| 9,207,904 B2 | 12/2015 | Hall |
| 9,228,732 B2 | 1/2016 | Li |
| 9,234,652 B2 | 1/2016 | Wu |
| 9,243,790 B2 | 1/2016 | Speer et al. |
| 9,330,589 B2 | 5/2016 | Cope et al. |
| 9,349,306 B2 | 5/2016 | Hall |
| 9,412,926 B2 | 8/2016 | Keller et al. |
| 9,416,551 B2 | 8/2016 | Hall |
| 9,494,302 B2 | 11/2016 | Shen et al. |
| 9,528,283 B2 | 12/2016 | Hall |
| 9,535,650 B2 | 1/2017 | Hall |
| 9,538,588 B2 | 1/2017 | Mutschelknaus et al. |
| 9,546,781 B2 | 1/2017 | Myers |
| 9,587,814 B2 | 3/2017 | Carney et al. |

(56) References Cited

U.S. PATENT DOCUMENTS

| | | |
|---|---|---|
| 9,615,474 B2 | 4/2017 | He et al. |
| 9,642,272 B1 | 5/2017 | Hall |
| 9,655,267 B2 | 5/2017 | Cope et al. |
| 9,711,690 B2 | 7/2017 | Li et al. |
| 9,863,586 B2 | 1/2018 | Yang et al. |
| 9,916,782 B2 | 3/2018 | Hall |
| 9,964,261 B2 | 5/2018 | Ying et al. |
| 2001/0037591 A1 | 11/2001 | Nicholson et al. |
| 2002/0122134 A1 | 9/2002 | Kalua |
| 2002/0126086 A1 | 9/2002 | Takeuchi et al. |
| 2002/0176267 A1 | 11/2002 | Tanaka et al. |
| 2003/0034963 A1 | 2/2003 | Moon et al. |
| 2003/0058191 A1 | 3/2003 | Yuhara et al. |
| 2003/0058666 A1 | 3/2003 | Myono |
| 2003/0117420 A1 | 6/2003 | Ando et al. |
| 2003/0120236 A1 | 6/2003 | Graef et al. |
| 2003/0146882 A1 | 8/2003 | Ogino et al. |
| 2003/0156406 A1 | 8/2003 | Galli |
| 2003/0156407 A1 | 8/2003 | Galli |
| 2003/0158886 A1 | 8/2003 | Walls et al. |
| 2003/0167666 A1 | 9/2003 | Close |
| 2003/0193816 A1 | 10/2003 | Rahn |
| 2003/0210236 A1 | 11/2003 | Martin et al. |
| 2004/0008155 A1 | 1/2004 | Cok |
| 2004/0040248 A1 | 3/2004 | Vilnes |
| 2004/0090391 A1 | 5/2004 | Kondo |
| 2004/0104871 A1 | 6/2004 | Boldt, Jr. et al. |
| 2004/0123501 A1 | 7/2004 | Safavi et al. |
| 2004/0186723 A1 | 9/2004 | Mizutani et al. |
| 2004/0196049 A1 | 10/2004 | Yano et al. |
| 2004/0222941 A1 | 11/2004 | Wong et al. |
| 2004/0240230 A1 | 12/2004 | Kitajima et al. |
| 2005/0052373 A1 | 3/2005 | Devos et al. |
| 2005/0052374 A1 | 3/2005 | Devos et al. |
| 2005/0052375 A1 | 3/2005 | Devos et al. |
| 2005/0078104 A1 | 4/2005 | Matthies et al. |
| 2005/0081414 A1 | 4/2005 | Lutz et al. |
| 2005/0116667 A1 | 6/2005 | Mueller et al. |
| 2005/0134525 A1 | 6/2005 | Tanghe et al. |
| 2005/0134526 A1 | 6/2005 | Willem et al. |
| 2005/0151708 A1 | 7/2005 | Farmer et al. |
| 2005/0178034 A1 | 8/2005 | Schubert et al. |
| 2005/0189311 A1 | 9/2005 | Colby et al. |
| 2005/0190520 A1 | 9/2005 | Schomaker et al. |
| 2005/0212717 A1 | 9/2005 | Baumstark |
| 2005/0213328 A1 | 9/2005 | Matheson |
| 2005/0231949 A1 | 10/2005 | Kim et al. |
| 2005/0259036 A1 | 11/2005 | Callegari et al. |
| 2005/0259418 A1 | 11/2005 | Callegari et al. |
| 2005/0264471 A1 | 12/2005 | Yamazaki et al. |
| 2006/0017658 A1 | 1/2006 | Biondo et al. |
| 2006/0028594 A1 | 2/2006 | Chou |
| 2006/0031720 A1 | 2/2006 | Choi |
| 2006/0039142 A1 | 2/2006 | Temple |
| 2006/0055641 A1 | 3/2006 | Robertus et al. |
| 2006/0056169 A1 | 3/2006 | Lodhie et al. |
| 2006/0132048 A1 | 6/2006 | Popovich |
| 2006/0139917 A1 | 6/2006 | Ward |
| 2006/0164587 A1 | 7/2006 | Oh |
| 2006/0164758 A1 | 7/2006 | Oh |
| 2006/0170614 A1 | 8/2006 | Tzong et al. |
| 2006/0171148 A1 | 8/2006 | Huang |
| 2006/0185612 A1 | 8/2006 | Bonner et al. |
| 2006/0227003 A1 | 10/2006 | Ven |
| 2006/0241878 A1 | 10/2006 | Jung et al. |
| 2006/0242871 A1 | 11/2006 | Kondo et al. |
| 2006/0243948 A1 | 11/2006 | Ishiwa et al. |
| 2006/0244681 A1 | 11/2006 | Nakajima |
| 2006/0254103 A1 | 11/2006 | Strick et al. |
| 2006/0256033 A1 | 11/2006 | Chan et al. |
| 2006/0262533 A1 | 11/2006 | Lin et al. |
| 2006/0274493 A1 | 12/2006 | Richardson et al. |
| 2006/0279493 A1 | 12/2006 | Syrstad |
| 2007/0000849 A1 | 1/2007 | Lutz et al. |
| 2007/0008259 A1 | 1/2007 | Barker |
| 2007/0068055 A1 | 3/2007 | Segan et al. |
| 2007/0218751 A1 | 9/2007 | Ward |
| 2007/0241988 A1 | 10/2007 | Zerphy et al. |
| 2007/0247842 A1 | 10/2007 | Zampini et al. |
| 2007/0279314 A1 | 12/2007 | Brown |
| 2008/0047184 A1 | 2/2008 | Dean |
| 2008/0060234 A1 | 3/2008 | Chou et al. |
| 2008/0078733 A1 | 4/2008 | Nearman et al. |
| 2008/0130282 A1 | 6/2008 | Negley |
| 2008/0141571 A1 | 6/2008 | Kottwitz |
| 2008/0141572 A1 | 6/2008 | Tomich et al. |
| 2008/0263924 A1 | 10/2008 | Nearman et al. |
| 2008/0266206 A1 | 10/2008 | Nelson et al. |
| 2008/0285087 A1 | 11/2008 | Perkins et al. |
| 2008/0303747 A1 | 12/2008 | Velicescu |
| 2009/0009103 A1 | 1/2009 | Mckechnie et al. |
| 2009/0009945 A1 | 1/2009 | Johnson et al. |
| 2009/0009997 A1 | 1/2009 | Sanfilippo et al. |
| 2009/0015997 A1 | 1/2009 | Barajas et al. |
| 2009/0021497 A1 | 1/2009 | Wendler et al. |
| 2009/0021532 A1 | 1/2009 | Gloege et al. |
| 2009/0024929 A1 | 1/2009 | Gloege et al. |
| 2009/0058760 A1 | 3/2009 | Aoki |
| 2009/0073080 A1 | 3/2009 | Meersman et al. |
| 2009/0096711 A1 | 4/2009 | Jang et al. |
| 2009/0121986 A1 | 5/2009 | Tu et al. |
| 2009/0128461 A1 | 5/2009 | Geldard et al. |
| 2009/0146910 A1 | 6/2009 | Gardner |
| 2009/0146918 A1 | 6/2009 | Kline et al. |
| 2009/0146919 A1 | 6/2009 | Kline et al. |
| 2009/0147028 A1 | 6/2009 | Sefton et al. |
| 2009/0190353 A1 | 7/2009 | Barker |
| 2009/0241388 A1 | 10/2009 | Dunn |
| 2009/0251391 A1 | 10/2009 | Ng et al. |
| 2009/0284978 A1 | 11/2009 | Elliott et al. |
| 2009/0289160 A1 | 11/2009 | Kludt et al. |
| 2009/0296387 A1 | 12/2009 | Reisenauer et al. |
| 2009/0322251 A1 | 12/2009 | Hilgers |
| 2010/0019535 A1 | 1/2010 | Chang et al. |
| 2010/0026973 A1 | 2/2010 | Hemphill et al. |
| 2010/0045689 A1 | 2/2010 | Hsieh |
| 2010/0073914 A1 | 3/2010 | Park et al. |
| 2010/0090934 A1 | 4/2010 | Elliott et al. |
| 2010/0109571 A1 | 5/2010 | Nishino et al. |
| 2010/0123732 A1 | 5/2010 | Jenks et al. |
| 2010/0135022 A1 | 6/2010 | Deguara |
| 2010/0245109 A1 | 9/2010 | Ashoff et al. |
| 2010/0251583 A1 | 10/2010 | Brown et al. |
| 2010/0270582 A1 | 10/2010 | Nolan et al. |
| 2010/0288895 A1 | 11/2010 | Shamie |
| 2010/0295424 A1 | 11/2010 | Alexander |
| 2010/0295760 A1 | 11/2010 | Somerville |
| 2010/0309185 A1 | 12/2010 | Koester et al. |
| 2011/0002129 A1 | 1/2011 | Zheng et al. |
| 2011/0019414 A1 | 1/2011 | Jiang et al. |
| 2011/0025696 A1 | 2/2011 | Wyatt et al. |
| 2011/0031513 A1 | 2/2011 | Hsieh et al. |
| 2011/0051409 A1 | 3/2011 | Nearman |
| 2011/0057215 A1 | 3/2011 | Chen et al. |
| 2011/0072697 A1 | 3/2011 | Miller |
| 2011/0074833 A1 | 3/2011 | Murayama et al. |
| 2011/0085321 A1 | 4/2011 | Eli |
| 2011/0089824 A1 | 4/2011 | Zheng |
| 2011/0090138 A1 | 4/2011 | Zheng |
| 2011/0096568 A1 | 4/2011 | Schattinger et al. |
| 2011/0116232 A1 | 5/2011 | Brown et al. |
| 2011/0133659 A1 | 6/2011 | Li et al. |
| 2011/0134640 A1 | 6/2011 | Bertele |
| 2011/0138663 A1 | 6/2011 | Chen |
| 2011/0140999 A1 | 6/2011 | Beland et al. |
| 2011/0168653 A1 | 7/2011 | Garrett et al. |
| 2011/0181493 A1 | 7/2011 | Williams et al. |
| 2011/0181495 A1 | 7/2011 | Chu et al. |
| 2011/0188235 A1 | 8/2011 | Bollmann |
| 2011/0188981 A1 | 8/2011 | Bonn et al. |
| 2011/0194284 A1 | 8/2011 | Quaal et al. |
| 2011/0205757 A1 | 8/2011 | Whyte |
| 2011/0216482 A1 | 9/2011 | Moscovitch et al. |
| 2011/0219650 A1 | 9/2011 | Wright et al. |

(56) References Cited

U.S. PATENT DOCUMENTS

| | | |
|---|---|---|
| 2011/0235332 A1 | 9/2011 | Cheung |
| 2011/0267328 A1 | 11/2011 | Venkatasubramanian et al. |
| 2011/0267699 A1 | 11/2011 | Wu |
| 2012/0005563 A1 | 1/2012 | Gloege et al. |
| 2012/0019490 A1 | 1/2012 | Huang |
| 2012/0021873 A1 | 1/2012 | Brunner |
| 2012/0062540 A1 | 3/2012 | Quadri et al. |
| 2012/0112235 A1 | 5/2012 | Preuschl et al. |
| 2012/0206277 A1 | 8/2012 | Cai |
| 2012/0218753 A1 | 8/2012 | Joffer et al. |
| 2012/0218758 A1 | 8/2012 | Wang et al. |
| 2012/0236509 A1 | 9/2012 | Cope et al. |
| 2012/0248950 A1 | 10/2012 | Niibori |
| 2012/0299480 A1 | 11/2012 | Peting et al. |
| 2012/0319926 A1 | 12/2012 | Koebrich et al. |
| 2013/0002634 A1 | 1/2013 | Wendler et al. |
| 2013/0027861 A1 | 1/2013 | Rosenau et al. |
| 2013/0182440 A1 | 7/2013 | Ferrie et al. |
| 2013/0200821 A1 | 8/2013 | Yoneoka et al. |
| 2013/0229797 A1 | 9/2013 | Nearman |
| 2013/0271973 A1 | 10/2013 | Rycyna, III |
| 2013/0279161 A1 | 10/2013 | Pickard et al. |
| 2013/0321387 A1 | 12/2013 | Ohe |
| 2014/0085885 A1 | 3/2014 | Hatano |
| 2014/0153241 A1 | 6/2014 | Templeton |
| 2014/0160363 A1 | 6/2014 | Mutschelknaus et al. |
| 2014/0259645 A1 | 9/2014 | Cox et al. |
| 2014/0267784 A1 | 9/2014 | Rykowski |
| 2014/0267896 A1 | 9/2014 | Cox et al. |
| 2014/0268565 A1 | 9/2014 | Cox et al. |
| 2014/0285963 A1 | 9/2014 | Vasilevsky |
| 2014/0301088 A1 | 10/2014 | Lu et al. |
| 2015/0145851 A1 | 5/2015 | Takeda et al. |
| 2015/0205565 A1 | 7/2015 | Koguchi |
| 2016/0086521 A1 | 3/2016 | Hall |

FOREIGN PATENT DOCUMENTS

| | | |
|---|---|---|
| CN | 2549557 Y | 5/2003 |
| CN | 2646812 Y | 10/2004 |
| CN | 1556516 A | 12/2004 |
| CN | 2674579 Y | 1/2005 |
| CN | 2706836 Y | 6/2005 |
| CN | 2727885 Y | 9/2005 |
| CN | 2733499 Y | 10/2005 |
| CN | 2822095 Y | 9/2006 |
| CN | 2824292 Y | 10/2006 |
| CN | 2834111 Y | 11/2006 |
| CN | 2874691 Y | 2/2007 |
| CN | 2899008 Y | 5/2007 |
| CN | 2906921 Y | 5/2007 |
| CN | 200956227 Y | 10/2007 |
| CN | 101250936 A | 8/2008 |
| CN | 101294700 A | 10/2008 |
| CN | 101334953 A | 12/2008 |
| CN | 101404316 A | 4/2009 |
| CN | 201226214 Y | 4/2009 |
| CN | 201229746 Y | 4/2009 |
| CN | 201229747 Y | 4/2009 |
| CN | 201233695 Y | 5/2009 |
| CN | 201262959 Y | 6/2009 |
| CN | 201307381 Y | 9/2009 |
| CN | 201345201 Y | 11/2009 |
| CN | 101629707 A | 1/2010 |
| CN | 101699154 A | 4/2010 |
| CN | 201438351 U | 4/2010 |
| CN | 101701674 A | 5/2010 |
| CN | 201449702 U | 5/2010 |
| CN | 201465466 U | 5/2010 |
| CN | 101355132 B | 6/2010 |
| CN | 101737646 A | 6/2010 |
| CN | 101737648 A | 6/2010 |
| CN | 201539725 U | 8/2010 |
| CN | 201540699 U | 8/2010 |
| CN | 201550216 U | 8/2010 |
| CN | 101834173 A | 9/2010 |
| CN | 201575434 U | 9/2010 |
| CN | 201576411 U | 9/2010 |
| CN | 201576430 U | 9/2010 |
| CN | 201577260 U | 9/2010 |
| CN | 201584129 U | 9/2010 |
| CN | 101887940 A | 11/2010 |
| CN | 201622789 U | 11/2010 |
| CN | 201651984 U | 11/2010 |
| CN | 201655193 U | 11/2010 |
| CN | 201655196 U | 11/2010 |
| CN | 201681560 U | 12/2010 |
| CN | 101640237 B | 1/2011 |
| CN | 201748196 U | 2/2011 |
| CN | 201748199 U | 2/2011 |
| CN | 101546801 B | 3/2011 |
| CN | 201765771 U | 3/2011 |
| CN | 201796561 U | 4/2011 |
| CN | 201803140 U | 4/2011 |
| CN | 201803144 U | 4/2011 |
| CN | 201804915 U | 4/2011 |
| CN | 201812454 U | 4/2011 |
| CN | 201812456 U | 4/2011 |
| CN | 201838265 U | 5/2011 |
| CN | 201845522 U | 5/2011 |
| CN | 102110764 A | 6/2011 |
| CN | 201868043 U | 6/2011 |
| CN | 201868044 U | 6/2011 |
| CN | 102136229 A | 7/2011 |
| CN | 201904981 U | 7/2011 |
| CN | 201910212 U | 7/2011 |
| CN | 102163392 A | 8/2011 |
| CN | 102168702 A | 8/2011 |
| CN | 201916876 U | 8/2011 |
| CN | 201918125 U | 8/2011 |
| CN | 201925281 U | 8/2011 |
| CN | 201946238 U | 8/2011 |
| CN | 201954484 U | 8/2011 |
| CN | 201956020 U | 8/2011 |
| CN | 201965586 U | 9/2011 |
| CN | 201973531 U | 9/2011 |
| CN | 201973623 U | 9/2011 |
| CN | 201975022 U | 9/2011 |
| CN | 201976382 U | 9/2011 |
| CN | 102214783 A | 10/2011 |
| CN | 202012808 U | 10/2011 |
| CN | 202025488 U | 11/2011 |
| CN | 202042136 U | 11/2011 |
| CN | 202049690 U | 11/2011 |
| CN | 202058388 U | 11/2011 |
| CN | 202067478 U | 12/2011 |
| CN | 202084254 U | 12/2011 |
| CN | 102314812 A | 1/2012 |
| CN | 202102651 U | 1/2012 |
| CN | 202134169 U | 2/2012 |
| CN | 102368367 A | 3/2012 |
| CN | 202171165 U | 3/2012 |
| CN | 102418912 A | 4/2012 |
| CN | 202230681 U | 5/2012 |
| CN | 202230682 U | 5/2012 |
| CN | 102509520 A | 6/2012 |
| CN | 202266799 U | 6/2012 |
| CN | 101872828 B | 7/2012 |
| CN | 101872829 B | 7/2012 |
| CN | 102544319 A | 7/2012 |
| CN | 202307009 U | 7/2012 |
| CN | 102623618 A | 8/2012 |
| CN | 102623621 A | 8/2012 |
| CN | 202383944 U | 8/2012 |
| CN | 102682669 A | 9/2012 |
| CN | 102682671 A | 9/2012 |
| CN | 202422683 U | 9/2012 |
| CN | 202423377 U | 9/2012 |
| CN | 102737554 A | 10/2012 |
| CN | 102738366 A | 10/2012 |
| CN | 102760392 A | 10/2012 |
| CN | 202502685 U | 10/2012 |
| CN | 101872827 B | 11/2012 |
| CN | 102800765 A | 11/2012 |

(56) References Cited

FOREIGN PATENT DOCUMENTS

| | | |
|---|---|---|
| CN | 202521184 U | 11/2012 |
| CN | 202523329 U | 11/2012 |
| CN | 202523334 U | 11/2012 |
| CN | 202523337 U | 11/2012 |
| CN | 202523345 U | 11/2012 |
| CN | 202523349 U | 11/2012 |
| CN | 202523351 U | 11/2012 |
| CN | 202523374 U | 11/2012 |
| CN | 202523377 U | 11/2012 |
| CN | 202549195 U | 11/2012 |
| CN | 202563838 U | 11/2012 |
| CN | 202581065 U | 12/2012 |
| CN | 202584617 U | 12/2012 |
| CN | 202584622 U | 12/2012 |
| CN | 202584625 U | 12/2012 |
| CN | 202601717 U | 12/2012 |
| CN | 202602105 U | 12/2012 |
| CN | 202615728 U | 12/2012 |
| CN | 202632682 U | 12/2012 |
| CN | 202646254 U | 1/2013 |
| CN | 202650452 U | 1/2013 |
| CN | 202650463 U | 1/2013 |
| CN | 202656470 U | 1/2013 |
| CN | 202677752 U | 1/2013 |
| CN | 202677753 U | 1/2013 |
| CN | 202679828 U | 1/2013 |
| CN | 202707716 U | 1/2013 |
| CN | 202713825 U | 1/2013 |
| CN | 302301505 S | 1/2013 |
| CN | 302301906 S | 1/2013 |
| CN | 101740706 B | 2/2013 |
| CN | 102185078 B | 2/2013 |
| CN | 102930785 A | 2/2013 |
| CN | 202691652 U | 2/2013 |
| CN | 202736970 U | 2/2013 |
| CN | 202743586 U | 2/2013 |
| CN | 202758554 U | 2/2013 |
| CN | 202758555 U | 2/2013 |
| CN | 103000088 A | 3/2013 |
| CN | 202795924 U | 3/2013 |
| CN | 202816279 U | 3/2013 |
| CN | 202838846 U | 3/2013 |
| CN | 103065559 A | 4/2013 |
| CN | 202855217 U | 4/2013 |
| CN | 202887627 U | 4/2013 |
| CN | 202905030 U | 4/2013 |
| CN | 202905033 U | 4/2013 |
| CN | 202905040 U | 4/2013 |
| CN | 202905058 U | 4/2013 |
| CN | 302417520 S | 4/2013 |
| CN | 302417587 S | 4/2013 |
| CN | 103124483 A | 5/2013 |
| CN | 101976720 B | 6/2013 |
| CN | 103177664 A | 6/2013 |
| CN | 103177665 A | 6/2013 |
| CN | 202976707 U | 6/2013 |
| CN | 101894898 B | 7/2013 |
| CN | 103196051 A | 7/2013 |
| CN | 203038588 U | 7/2013 |
| CN | 203038597 U | 7/2013 |
| CN | 203038598 U | 7/2013 |
| CN | 203038599 U | 7/2013 |
| CN | 203055361 U | 7/2013 |
| CN | 203055365 U | 7/2013 |
| CN | 203102774 U | 7/2013 |
| CN | 203102775 U | 7/2013 |
| CN | 103268738 A | 8/2013 |
| CN | 203136407 U | 8/2013 |
| CN | 203165372 U | 8/2013 |
| CN | 103280164 A | 9/2013 |
| CN | 103280164 B | 9/2013 |
| CN | 203192335 U | 9/2013 |
| CN | 203202526 U | 9/2013 |
| CN | 203231179 U | 9/2013 |
| CN | 103346238 A | 10/2013 |
| CN | 103354067 A | 10/2013 |
| CN | 203232680 U | 10/2013 |
| CN | 203240341 U | 10/2013 |
| CN | 203242660 U | 10/2013 |
| CN | 203250487 U | 10/2013 |
| CN | 203250491 U | 10/2013 |
| CN | 302600355 S | 10/2013 |
| CN | 302607812 S | 10/2013 |
| CN | 302607814 S | 10/2013 |
| CN | 103413497 A | 11/2013 |
| CN | 103456244 A | 12/2013 |
| CN | 103456247 A | 12/2013 |
| CN | 203325368 U | 12/2013 |
| CN | 203336167 U | 12/2013 |
| CN | 203339216 U | 12/2013 |
| CN | 203339217 U | 12/2013 |
| CN | 302682535 S | 12/2013 |
| CN | 203386338 U | 1/2014 |
| CN | 203415183 U | 1/2014 |
| CN | 302705434 S | 1/2014 |
| CN | 302716898 S | 1/2014 |
| CN | 302716899 S | 1/2014 |
| CN | 203490915 U | 3/2014 |
| CN | 203491298 U | 3/2014 |
| CN | 203491299 U | 3/2014 |
| CN | 302761262 S | 3/2014 |
| CN | 302761263 S | 3/2014 |
| CN | 103730068 A | 4/2014 |
| CN | 203526759 U | 4/2014 |
| CN | 203528543 U | 4/2014 |
| CN | 203535913 U | 4/2014 |
| CN | 203571647 U | 4/2014 |
| CN | 203571663 U | 4/2014 |
| CN | 203573584 U | 4/2014 |
| CN | 203573586 U | 4/2014 |
| CN | 203573592 U | 4/2014 |
| CN | 302789638 S | 4/2014 |
| CN | 302790357 S | 4/2014 |
| CN | 302790361 S | 4/2014 |
| CN | 203606693 U | 5/2014 |
| CN | 203607042 U | 5/2014 |
| CN | 203607050 U | 5/2014 |
| CN | 203631082 U | 6/2014 |
| CN | 203644330 U | 6/2014 |
| CN | 103956136 A | 7/2014 |
| CN | 203690339 U | 7/2014 |
| CN | 203743962 U | 7/2014 |
| CN | 302864854 S | 7/2014 |
| CN | 104009145 A | 8/2014 |
| CN | 104009146 A | 8/2014 |
| CN | 203787033 U | 8/2014 |
| CN | 302917815 S | 8/2014 |
| CN | 203849976 U | 9/2014 |
| CN | 203910233 U | 10/2014 |
| CN | 203932101 U | 11/2014 |
| CN | 203950801 U | 11/2014 |
| CN | 203950834 U | 11/2014 |
| CN | 204005499 U | 12/2014 |
| CN | 204117521 U | 1/2015 |
| CN | 204117522 U | 1/2015 |
| CN | 303084137 S | 1/2015 |
| CN | 303084275 S | 1/2015 |
| CN | 204141352 U | 2/2015 |
| CN | 204143784 U | 2/2015 |
| CN | 204229808 U | 3/2015 |
| CN | 102814429 B | 4/2015 |
| CN | 204257141 U | 4/2015 |
| CN | 204285400 U | 4/2015 |
| CN | 204288709 U | 4/2015 |
| CN | 303169413 S | 4/2015 |
| CN | 303169414 S | 4/2015 |
| CN | 303169875 S | 4/2015 |
| CN | 303170948 S | 4/2015 |
| CN | 303227404 S | 5/2015 |
| CN | 204423826 U | 6/2015 |
| CN | 103022318 B | 7/2015 |
| CN | 204463732 U | 7/2015 |
| CN | 204496855 U | 7/2015 |
| CN | 303276898 S | 7/2015 |

(56) References Cited

FOREIGN PATENT DOCUMENTS

| | | |
|---|---|---|
| CN | 303278324 S | 7/2015 |
| CN | 204534276 U | 8/2015 |
| CN | 303316383 S | 8/2015 |
| CN | 303339773 S | 8/2015 |
| CN | 303339774 S | 8/2015 |
| CN | 103032767 B | 9/2015 |
| CN | 103337224 B | 9/2015 |
| CN | 204613541 U | 9/2015 |
| CN | 204634223 U | 9/2015 |
| CN | 204665178 U | 9/2015 |
| CN | 103544896 B | 10/2015 |
| CN | 103557498 B | 10/2015 |
| CN | 204695705 U | 10/2015 |
| CN | 303405173 S | 10/2015 |
| CN | 105447283 A | 3/2016 |
| CN | 103367612 B | 4/2016 |
| CN | 103219447 B | 5/2016 |
| CN | 105632354 A | 6/2016 |
| CN | 205406020 U | 7/2016 |
| CN | 205406022 U | 7/2016 |
| CN | 205408340 U | 7/2016 |
| CN | 103337583 B | 8/2016 |
| CN | 103441209 B | 8/2016 |
| CN | 103794702 B | 8/2016 |
| CN | 205447200 U | 8/2016 |
| CN | 205487176 U | 8/2016 |
| CN | 205487177 U | 8/2016 |
| CN | 303805061 S | 8/2016 |
| CN | 205555209 U | 9/2016 |
| CN | 104143315 B | 11/2016 |
| CN | 103730563 B | 4/2017 |
| CN | 103472817 B | 12/2017 |
| EP | 863496 A2 | 9/1998 |
| EP | 0863496 A2 | 9/1998 |
| EP | 1469450 A1 | 10/2004 |
| EP | 2956925 A1 | 12/2015 |
| GB | 1585394 A | 3/1981 |
| JP | 06337644 A | 12/1994 |
| JP | 0816114 A | 1/1996 |
| JP | 1138905 A | 2/1999 |
| JP | 1152878 A | 2/1999 |
| JP | 2001242796 A | 9/2001 |
| JP | 2001337626 A | 12/2001 |
| JP | 2002368284 A | 12/2002 |
| JP | 2003092195 A | 3/2003 |
| JP | 2004354571 A | 12/2004 |
| JP | 2005062461 A | 3/2005 |
| JP | 2005084683 A | 3/2005 |
| JP | 2006023464 A | 1/2006 |
| JP | 2006221067 A | 8/2006 |
| JP | 2007533066 A | 11/2007 |
| JP | 2010181721 A | 8/2010 |
| KR | 20020069818 A | 9/2002 |
| WO | 0223956 A2 | 3/2002 |
| WO | 2004019657 A2 | 3/2004 |
| WO | 2004042690 A1 | 5/2004 |
| WO | 2005083660 | 9/2005 |
| WO | 2005103564 A1 | 11/2005 |
| WO | 2007061496 A2 | 5/2007 |
| WO | 2007083879 A1 | 7/2007 |
| WO | 2008157262 A2 | 12/2008 |
| WO | 2009000896 A2 | 12/2008 |
| WO | 2011062570 A1 | 5/2011 |
| WO | 2013159655 A1 | 10/2013 |
| WO | 2014005600 | 1/2014 |
| WO | 2015103079 A1 | 7/2015 |

OTHER PUBLICATIONS

Lighthouseled, "Possibilities" and "Specifications," Aug. 9, 2013, 1 page.
Internet Archive Wayback Machine, "Outdoor/Indoor LED Display, LED Screen, LED Panel, LED Video Wall, LED Curtain, LED Strip," https://web.archive.org/web/20130728075831/http://www.szaoto.com:80/product1.html, Jul. 2013, 2 pages.
Internet Archive Wayback Machine, "AOTO M Series Rental LED Display," https://web.archive.org/web/20111211101926/http://www.szaoto.com:80/product13.html, Dec. 11, 2011, 1 page.
Lighthouse Create Impact, "10mm Visual Resolution with Oval LEDs, Bi10-ER, Large Scale LED Panel, A Modular System for Outdoor Applications," Operation Manual, Jul. 2011; Document version 1.3; 33 pages.
Samsung, "User Manual, UD22B," B146-00286A-02, Jul. 2012, 145 pages.
Prismview, A Samsung Electronics Company, "Deploying a Digital Billboard with Prismview, Steps from Contracting Through Installation," White Paper, Aug. 2012, 4 pages.
YESCO Electronics, "The Layered Service Approach for Digital Outdoor Displays," White Paper, YESCO Electronics Service Plans, Aug. 2012, 6 pages.
ACC Silicones, "Clear Silicone Gel," https://web.archive.org/web/20140622080139/https://www.acc-silicones.com/products/gels.ashx, Jun. 22, 2014, 4 pages.
AOTO, Article "AOTO Launches World Highest Resolution Outdoor LED Display—M8 in ISE 2012," http://en.aoto.com/article/detail/201705111014.html, 2012, 3 pages.
Internet Archive Wayback Machine, "AOTO Launches Worl* s Highest-Resolution M3 LED Display in ISE," https://www.szaoto.com:80/news_23.html, Dec. 11, 2011, 1 page.
Barco, "LED Display Systems," LiveDots Product Catalog 2011, http://web.archive.org/web/20120318082027/http:/www.barco.com/Downloads/liveDots/LED_Product_Catalog.pdf, Mar. 18, 2012, 28 pages.
Barco, C11 "Lightweight, Indoor/Outdoor LED Video Display," http://web.archive.org/web/20100526031644/http:/www.barco.com:80/en/product/2258/specs, May 26, 2010, 1 page.
Glux, "BAtn Series," www.glux.com.cn/en, 2013, 2 pages.
"C-5 Rental Display," Installation Manual, Nov. 15, 2011, R5905120, 80 pages.
CYsn, Glux Visual Effects Tech (Shenzhen) Co., Ltd, http://www.glux.cc/business-provide-self-cysn.html, Oct. 1, 2013, 2 pages.
English Translation of Previously cited CN 203607050U, Published on May 21, 2014, Shenzhen Aoto Electronics Co., Ltd., 6 pages.
International Search Report and Written Opinion received in International Application No. PCT/US2014/072373 dated May 27, 2015, 19 pages.
Li Yan, et al., "Potting Process Design of Outdoor LED Display Module," CKNI, Dec. 31, 2006, 1 page.
Luminautics, "LED Display Primer," www.luminautisc.com, 2011, 21 pages.
MOtn, Glux Visual Effects Tech (Shenzhen) Co., Ltd, http://www.glux.cc/business-provide-self-cysn.html, Oct. 1, 2013, 2 pages.
Internet Archive Wayback Machine, AOTO, "News Center," http://szaoto.com/news.html, Dec. 7, 2013, 2013, 3 pages.
Internet Archive Wayback Machine, "AOTO M Series Rental LED Display," https://web.archive.org/web/20130909053329/http://szaoto.com:80/product13.html, Sep. 2013, 1 page.
Daktronics, "Daktronics LED Billboard Technology," www.daktronics.com Nov. 14, 2013, 3 pages.
Daktronics, "The Smarter Approach to Digital Outdoor," Daktronics Digital Billboard Products, 2013, 16 pages.
EKTA, "WOWStrip," www.ekta-led.com, Jun. 19, 2014, 5 pages.
"What is IP? Explained: Ingress Protection rating (IP Rating, IP65-IP68) system," Waterproof TVs Direct; Apr. 11, 2012; http://waterproftvs-direct.co.uk/blog/waterproof-tv/what-is-ip-ip-explained-ingress-protection-rating-ip-rating-ip65-ip68-system.
WOWstrip Semi-Transparent LED Displays product page, http://www.ekta-led.com/prod/68/17/190/, retrieved Jun. 19, 2014, 3 pages.
Osram Opto Semiconductors, "Outdoor Capability of Silicone SMT LEDs used in LED Sign Board Applications," Jan. 31, 2004, 17 pages.
Barco, "Outdoor LED Display Solutions," SLite, www.barco.com, Apr. 2007, 4 pages.
SEfl, Glux Visual Effects Tech (Shenzhen) Co., Ltd, http://www.glux.cc/business-provide-self-cysn.html, Oct. 1, 2013, 2 pages.
Glux, "SEfl Series," www.glux.com.cn, 2013, 1 page.
Sony, "Large LED Display System," 2011, 8 pages.

(56) References Cited

OTHER PUBLICATIONS

UK Intellectual Property Office, Search Report in Application No. GB1518912.9 Mar. 2, 2016, pp. 1-6.
VUEPIX, Product Catalog, 2012, www.vuepix.com, 36 pages.
Xavier, Dominic Michael, "Development of a Large Scale Flexible LED Display Matrix for the Screen Industry," Thesis, Faculty of Built Environment and Engineering, Queensland University of Technology, Feb. 2013, 543 pages.
Yung, K.C., et al., "Thermal Performance of High Brightness LED Array Package on PCB," Nov. 30, 2010, 2 pages.
"DC-DC Converter Tutorial," Maxim Integrated, Tutorial 2031, Nov. 29, 2001, 14 Pages.
"4100 Series Digital Billboard," Installation Manual, Daktronics, DD1914625, Sep. 4, 2011, 51 pages.
"4100 Series Digital Billboard," Daktronics Service Manual, DD1922557, Jan. 4, 2012, 37 pages.
"Barco LiveDots Introduces 14mm Transparent LED Display," Light Sound Journal.com, Jun. 7, 2013, 2 pages.
"Building a DC-DC Power Supply that Works," Maxim Integrated, Tutorial 1897, Sep. 22, 2010, 10 pages.
"Element Labs Introduces Revolutionary Cobra TM Technology Platform," LEDs Magazine, Oct. 24, 2008, 3 pages.
"How to Apply the Acrylic Conformal Coating," MG Chemicals, Mar. 29, 2011, pp. 1-3, Ver. 1.
"Avago Technologies Introduces Industry's First Water Resistant High-Brightness Surface Mount Tricolor LEDs," LED, The Global Information Hub for Lighting Technologies, Products, Materials and Tools, Jan. 28, 2010 7 Pages.
Hu, Run, et al., "Study on the Optical Properties of Conformal Coating Light-Emitting Diode by monte Carlo Simulation," IEEE Photonics technology Letter, Nov. 15, 2011, vol. 23, No. 22, pp. 1673-1675.
LED Industry News, "Multimedia Farms Selects Barco for Portable LED Display Solutions," LIGHTimes Online-LED Industry News, Aug. 3, 2010, pp. 1114-ITC0009454-1114-ITC0009456.
LED,"New Fully IP-65 Rated Indoor/Outdoor LED Display From PixLED," The Global Information Hub for Lighting Technologies, Products, Materials & Tools, Jan. 25, 2012, pp. 1114-ITC0009457-1114-ITC0009463.
Media Planet, "Digital Place-Based Media," Apr. 2010, No. 3, pp. 1114-11C0009079-1114-ITC0009084.
NEMA, "Degrees of Protection Provided by Enclosures (IP Code)," Ansi/IEC 60529-2004 (R2011), NEMA Standards Publication,Nov. 3, 2004, pp. ITC-001872-ITC-001928.
Nichia Corporation, "Nichia Releases SMD LED for Outdoor Displays," LIGHTimes Online—LED Industry News, LED Applications, Single and Multi-Chip Packaged LEDs, Jun. 18, 2012, pp. 1114-ITC0009464-1114-ITC0009466.
Barco, Inc., "C11 Lightweight, indoor/outdoor LED video display," company website product technical specification sheet, M00360-R02-0111-DS Jan. 2011, 2 pages, Kortrijk, Belgium.
Lang, Justin, "LED Display Panels," Buyers Guide, Nov. 2013, pp. 47-49, plsn.com.
Barco, Inc., "Barco LiveDots adds new member to its C-series LED display family," company website news press release, Apr. 8, 2013, 3 pages, Kortrijk, Belgium.
Barco, Inc., "PXL System User Manual," Revised Jun. 15, 2010, 196 pages.
Barco, Inc., "Say hello to our brand-new C8 LED display!," company website news press release, Apr. 8, 2013, 3 pages.
Cheng, Ting et al., "Thermal analysis and optimization of multiple LED packaging based on a general analytical solution," International Journal of Thermal Sciences 49 (2010), pp. 196-201, Elsevier.
Sturm, James C., et al., "Thermal Effects and Scaling in Organic Light-Emitting FLat-Panel Displays," Invited Paper, IEEE Journal of Selected Topics in Quantum Electronics, vol. 4, No. 1, Jan./Feb. 1998, pp. 75-82.
Hughes, Tom, "Understanding Outdoor LED Electronic Signs," Technology Report, Jul. 20, 2001, 20 pages, 9711-6007, Adaptive Micro Systems, Inc.

Waterfire Signs, "Watch What Happens—2008 LED Signs," marketing brochure, Copyright 2007, 20 pages, Time-O-Matic, Danville, Illinois, USA.
PLSN, "Lighting More Than the Torch," Projection, Lights & Staging News, PLSN New Product Guide, p. 22, www.plsn.com, Sep. 2008, Vik, 9.8, pp. 1114-ITC0000408-1114-ITC0000479.
PLSN, "Backfield Scramble at Mile High Stadium," Projection, Lights & Staging News, Road Test: Vectorworks Spotlight 2009, p. 70, www.plsn.com, Oct. 2008, vol. 9.9, pp. 1114-ITC0000304-1114-ITC0000355.
PLSN, "Backfield Scramble at Mile High Stadium," Projection, Lights & Staging News, Road Test: Vectorworks Spotlight 2009, p. 70, www.plsn.com, Oct. 2008, vol. 9.9, pp. 1114-ITC0000356-1114-ITC0000407.
U.S. Appl. No. 61/922,631, pp. 1-75, filed Dec. 31, 2013.
U.S. Appl. No. 62/025,463, pp. 1-184 filed Jul. 16, 2014.
SMD Diodes, "Semi-Transparent Led Curtain," Mar.-Apr. 2011, pp. 1114-ITC0004198-1114-ITC00044202.
Sony, "Large LED Display System," LPU-1601 LED Display Panel Unit, LPU-2001 LED Display Panel Unit, LDC-HD01 LED Display Control Processor, 2011, 1114-ITC0004205-1114-ITC0004212.
Sander, "Full Color LED Unit SDM-P20-OSD4S-88," Jun. 7, 2010, Version 1-5, pp. 1114-11C0009467-1114-ITC0009471.
"Complaint," Re: Certain Light Engines and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 96 pages.
"Exhibit 5 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 4 pages.
"Exhibit 6 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 72 pages.
"Exhibit 7 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 53 pages.
"Exhibit 8 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 26 pages.
"Exhibit 9 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 44 pages.
"Exhibit 10 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 32 pages.
"Exhibit 11 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 32 pages.
"Exhibit 12 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 37 pages.
"Exhibit 13 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 42 pages.

(56) References Cited

OTHER PUBLICATIONS

"Exhibit 14 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 45 pages.

"Exhibit 15 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 41 pages.

"Exhibit 16 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 51 pages.

"Exhibit 17 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 46 pages.

"Exhibit 18 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 50 pages.

"Exhibit 19 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 26 pages.

"Exhibit 20 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 35 pages.

"Exhibit 21of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 38 pages.

"Exhibit 22 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 50 pages.

"Exhibit 23 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 52 pages.

"Exhibit 24 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 33 pages.

"Exhibit 25 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 32 pages.

"Exhibit 26 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 38 pages.

"Exhibit 27 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 14 pages.

"Exhibit 28 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 27 pages.

"Exhibit 29 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 16 pages.

"Exhibit 30 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 14 pages.

"Exhibit 31 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 14 pages.

"Exhibit 32 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 18 pages.

"Exhibit 33 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 15 pages.

"Exhibit 34 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 18 pages.

"Exhibit 35 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 18 pages.

"Exhibit 36 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 17 pages.

"Exhibit 37 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 18 pages.

"Exhibit 38 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 13 pages.

"Exhibit 39 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 14 pages.

"Exhibit 40 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 16 pages.

"Exhibit 41 of Complaint," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Mar. 27, 2018, 20 pages.

(56) References Cited

OTHER PUBLICATIONS

"Exhibit 42 of Complaint," Re: Certain Modular LED Display Panels and Components Thereof, *Ultravision Technologies, Inc. v. Adduci, Mastriani and Schaumberg, L.L.P.*, United States International Trade Commission, IITC Inv. No. 337-TA-1114, Mar. 27, 2018, 37 pages.
"Exhibit 43 of Complaint," Re: Certain Modular LED Display Panels and Components Thereof, *Ultravision Technologies, Inc. v. Adduci, Mastriani and Schaumberg, L.L.P.*, United States International Trade Commission, IITC Inv. No. 337-TA-1114, Mar. 27, 2018, 14 pages.
"Exhibit 44 of Complaint," Re: Certain Modular LED Display Panels and Components Thereof, *Ultravision Technologies, Inc. v. Adduci, Mastriani and Schaumberg, L.L.P.*, United States International Trade Commission, IITC Inv. No. 337-TA-1114, Mar. 27, 2018, 50 pages.
"Exhibit 45 of Complaint," Re: Certain Modular LED Display Panels and Components Thereof, *Ultravision Technologies, Inc. v. Adduci, Mastriani and Schaumberg, L.L.P.*, United States International Trade Commission, IITC Inv. No. 337-TA-1114, Mar. 27, 2018, 36 pages.
"Exhibit 46 of Complaint," Re: Certain Modular LED Display Panels and Components Thereof, *Ultravision Technologies, Inc. v. Adduci, Mastriani and Schaumberg, L.L.P.*, United States International Trade Commission, IITC Inv. No. 337-TA-1114, Mar. 27, 2018, 5 pages.
"Exhibit 47 of Complaint," Re: Certain Modular LED Display Panels and Components Thereof, *Ultravision Technologies, Inc. v. Adduci, Mastriani and Schaumberg, L.L.P.*, United States International Trade Commission, IITC Inv. No. 337-TA-1114, Mar. 27, 2018, 29 pages.
"Exhibit 48 of Complaint," Re: Certain Modular LED Display Panels and Components Thereof, *Ultravision Technologies, Inc. v. Adduci, Mastriani and Schaumberg, L.L.P.*, United States International Trade Commission, IITC Inv. No. 337-TA-1114, Mar. 27, 2018, 4 pages.
"Exhibit 49 of Complaint," Re: Certain Modular LED Display Panels and Components Thereof, *Ultravision Technologies, Inc. v. Adduci, Mastriani and Schaumberg, L.L.P.*, United States International Trade Commission, IITC Inv. No. 337-TA-1114, Mar. 27, 2018, 8 pages.
Cirrus LED Systems, Internet Archive Wayback Machine, "The N2 System Setup & Installation ZERO Lead Time," Outdoor LED Displays—Cirrus LED Systems, https://web.archive.org/web/20131228140224/http://cirrusled.com/, Dec. 28, 2013, 4 Pages.
Cirrus LED Systems, Internet Archive Wayback Machine, "Introducing N2 System Innovative Outdoor LED Display Solution from Cirrus," LED Panels, N2 System—Cirrus LED System, https://web.archive.org/web/20130921080129/http://www.cirrusled.com/products/n2-system Sep. 21, 2013, 3 Pages.
Cirrus LED, Internet Archive Wayback Machine, "Nubis System The Next Generation Reinventing the LED Display," LED Outdoor Display Signs, Electronic Digital Message Sign Billboards, LED Displays Manufacturer, https:/web.archive.org/web/20120213172356/http://www.cirrusled.com:80/, Feb. 13, 2012, 1 Page.
Cirrus N2 LED Displays, Internet Archive Wayback Machine, "LED Panels," Martin Supply Company Inc., https://web.archive.org/web/20130916051706/http://martin-supply.com/category/nubis, Sep. 16, 2013, 2 Pages.
Cirrus LED Systems, Internet Archive Wayback Machine, "The Next Generation of LED Display," Outdoor LED Displays—Cirrus LED Systems, https://web.archive.org/web/20130830230540/http://www.cirrusled.com/, Aug. 30, 2013, 2 pages.
Cirrus LED Systems, Internet Archive Wayback Machine, "N2-19C," 19mm Pixel Pitch LED Sign—Cirrus LED Systems, https://web.archive.org/web/20130921075058/http://www.cirrusled.com/products/n2-system/full-color-rgb/19mm-pixel-pitch-led-sign, Sep. 21, 2013, 2 Pages.
Cirrus Systems, "N2 LED Display System Video," Published on Youtube on Jul. 24, 2013, 62 Pages.
Serial No. EP14875899.8, filed Sep. 18, 2015, pp. 1-59.
Serial No. EP14875899.8, filed Sep. 18, 2015, pp. 60-107.
Serial No. EP14875899.8, filed Sep. 18, 2015, pp. 108-160.
Serial No. EP14875899.8, filed Sep. 18, 2015, pp. 161-222.
Serial No. EP14875899.8, filed Sep. 18, 2015, pp. 223-280.
Serial No. EP14875899.8, filed Sep. 18, 2015, pp. 281-340.
Serial No. EP14875899.8, filed Sep. 18, 2015, pp. 341-405.
Serial No. EP14875899.8, filed Sep. 18, 2015, pp. 406-468.
Serial No. EP14875899.8, filed Sep. 18, 2015, pp. 469-536.
Serial No. EP14875899.8, filed Sep. 18, 2015, pp. 537-595.
Serial No. EP14875899.8, filed Sep. 18, 2015, pp. 596-666.
Serial No. EP14875899.8, filed Sep. 18, 2015, pp. 667-723.
Serial No. EP14875899.8, filed Sep. 18, 2015, pp. 724-787.
Serial No. EP14875899.8, filed Sep. 18, 2015, pp. 788-852.
Serial No. EP14875899.8, filed Sep. 18, 2015, pp. 853-936.
Serial No. EP14875899.8, filed Sep. 18, 2015, pp. 937-998.
Serial No. EP14875899.8, filed Sep. 18, 2015, pp. 999-1049.
Serial No. EP14875899.8, filed Sep. 18, 2015, pp. 1050-1106.
Serial No. EP14875899.8, filed Sep. 18, 2015, pp. 1107-1151.
Serial No. EP14875899.8, filed Sep. 18, 2015, pp. 1152-1216.
Serial No. EP14875899.8, filed Sep. 18, 2015, pp. 1217-1285.
Serial No. EP14875899.8, filed Sep. 18, 2015, p. 1286.
European Patent Office, EP Application No. 14875899.8, "Summons to Attend Oral Proceedings Pursuant to Rule 115(1) EPC," dated Dec. 19, 2018, 15 pages.
Applicant Admitted Prior Art, Shenzhen Only 19×19 Panel, Feb. 17, 2013, pp. 1-8.
Applicant Admitted Prior Art, Shenzhen Only 19×19 Panel, Feb. 17, 2013, pp. 9-14.
Applicant Admitted Prior Art, Shenzhen Only 19×19 Panel, Feb. 17, 2013, pp. 15-19.
Applicant Admitted Prior Art, Shenzhen Only 19×19 Panel, Feb. 17, 2013, p. 20.
Applicant Admitted Prior Art, Shenzhen Only 19×19 Panel, Feb. 17, 2013, pp. 21-23.
Applicant Admitted Prior Art, Shenzhen Only 19×19 Panel, Feb. 17, 2013, pp. 24-32.
Applicant Admitted Prior Art, UltraPanel, Dec. 1, 2012, 15 pages.
"Petition for Inter Partes Review," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board, U.S. Pat. No. 9,349,306, Case No. IPR2019-00347, Nov. 20, 2018, 90 pages.
Petitioner Shenzhen AOTO Electronics Co., Ltd., "Petitioner's Power of Attorney," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board, Inter Partes Review of U.S. Pat. No. 9,349,306, Case No. IPR2019-00347, Nov. 20, 2018, 3 pages.
Petitioner Ledman Optoelectronic Co., Ltd., "Petitioner's Power of Attorney," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board, Inter Partes Review of U.S. Pat. No. 9,349,306, Case No. IPR2019-00347, Nov. 20, 2018, 3 pages.
Petitioner Leyard Optoelectronic Co., "Petitioner's Power of Attorney," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board, Inter Partes Review of U.S. Pat. No. 9,349,306, Case No. IPR2019-00347, Nov. 20, 2018, 3 pages.
Petitioner Shenzhen Liantronics Co., "Petitioner's Power of Attorney," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co.,*

(56) References Cited

OTHER PUBLICATIONS

*Ltd.* Vs *Ultravision Technologies, LLC*, United States Patent and Trademark Office, Before the Patent Trial and Appeal Board , Inter Partes Review of U.S. Pat. No. 9,349,306, Case No. IPR2019-00347, Nov. 20, 2018, 3 pages.
Petitioner Unilumin Group Co. Ltd., "Petitioner's Power of Attorney," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , Inter Partes Review of U.S. Pat. No. 9,349,306, Case No. IPR2019-00347, Nov. 20, 2018, 3 pages.
Petitioner Yaham Optoelectronics Co. Ltd., "Petitioner's Power of Attorney," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , Inter Partes Review of U.S. Pat. No. 9,349,306, Case No. IPR2019-00347, Nov. 20, 2018, 3 pages.
"Exhibit 1001, U.S. Pat. No. 9,349,306 B2" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 83 pages.
"Exhibit 1002, Declaration of Mike Wood," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 90 pages.
"Exhibit 1004, for U.S. Pat. No. 9,349,306" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 5pgs 1-337.
"Exhibit 1004, for U.S. Pat. No. 9,349,306" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, pp. 338-594.
"Exhibit 1005, for U.S. Pat. No. 9,134,773" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, pp. 1-218.
"Exhibit 1005, for U.S. Pat. No. 9,134,773" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, pp. 219-426.
"Exhibit 1005, for U.S. Pat. No. 9,134,773" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, pp. 427-546.
"Exhibit 1006, US 2013/0271973 A1" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 62 pages.
"Exhibit 1007, US 2006/0227003 A1" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 11 pages.
"Exhibit 1008, CN 201449702 U" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 19 pages.
"Exhibit 1009, US 2007/0247842 A1" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 35 pages.
"Exhibit 1010, US 2005/0116667 A1" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 112 pages.
"Exhibit 1011, Joint Claim Construction Chart" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 19 pages.
"Exhibit 1012, Whats What Happens, 2008 LED Signs" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 20 pages.
"Exhibit 1013, for U.S. Pat. No. 9,916,782" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, pp. 1-209.
"Exhibit 1013, for U.S. Pat. No. 9,916,782" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, pp. 210-426.
"Exhibit 1013, for U.S. Pat. No. 9,916,782" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, pp. 427-616.
"Exhibit 1032, Direct Current Definition," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics*

(56) References Cited

OTHER PUBLICATIONS

Co., Ltd.; and Ledman Optoelectronic Co., Ltd. Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 2 pages.
"Exhibit 1033, Alternating Current Definition," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 2 pages.
"Exhibit 1036, What We Do, International Electrotechnical Commission" Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 1 page.
"Exhibit 1040, US 2007/0263381 A1," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 9 pages.
"Exhibit 1041, What is an IP Rating?—Progressive Automations Inc.," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 23 pages.
"Exhibit 1042, LED Display Solutions," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 24 pages.
"Exhibit 1043, LED Video Displays," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 2 pages.
"Exhibit 1044, LED Display Panels by Justin Lang," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 2 pages.
"Exhibit 1045, IPx6 Rated Surface Mount LED," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 2 pages.
"Exhibit 1046, Bi-Weekly Declaration Regarding Asserted Claims," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 6 pages.
"Exhibit 1047, Xin Min Liu Certification of Translation," Re: *Shenzhen AOTO Electronics Co., Ltd.; Leyard Optoelectronic Co.; Shenzhen Liantronics Co., Ltd.; Unilumin Group Co., Ltd.; Yaham Optoelectronics Co., Ltd.; and Ledman Optoelectronic Co., Ltd.* Vs *Ultravision Technologies, LLC*, United States Patent and Trademark Office, Before the Patent Trial and Appeal Board , U.S. Pat. No. 9,349,306, Case No. IPR2019-00347, Nov. 20, 2018, 2 pages.
"Respondents' Identification of Claim Terms Requiring Constructions," Re: Certain Modular LED Display Panels and Components Thereof, *Ultravision Technologies, Inc.* v. *Adduci, Mastriani and Schaumberg, L.L.P.*, United States International Trade Commission, Investigative No. 337-TA-1114, Jul. 26, 2018, 10 pages.
"Complainant Ultravision Technologies, LLC's List of Claim Terms to be Construed," Re: Certain Modular LED Display Panels and Components Thereof, *Ultravision Technologies, Inc.* v. *Adduci, Mastriani and Schaumberg, L.L.P.*, United States International Trade Commission, Investigative No. 337-TA-1114, Jul. 26, 2018, 9 pages.
"Respondents' Identification of Disputed Claim Terms and Proposed Construction," Re: Certain Modular LED Display Panels and Components Thereof, *Ultravision Technologies, Inc.* v. *Adduci, Mastriani and Schaumberg, L.L.P.*, United States International Trade Commission, Investigative No. 337-TA-1114, Aug. 14, 2018, 20 pages.
"Complainant Ultravision Technologies, LLC's Proposed Claim Construction and Supporting Evidence," Re: Certain Modular LED Display Panels and Components Thereof, *Ultravision Technologies, Inc.* v. *Adduci, Mastriani and Schaumberg, L.L.P.*, United States International Trade Commission, Investigative No. 337-TA-1114, Aug. 14, 2018, 22 pages.
"Respondents' Notice of Prior Art," Re: Certain Modular LED Display Panels and Components Thereof, *Ultravision Technologies, Inc.* v. *Adduci, Mastriani and Schaumberg, L.L.P.*, United States International Trade Commission, Investigative No. 337-TA-1114, Sep. 10, 2018, 10 pages.
"Exhibit A—Respondents' Notice of Prior Art (Prior Art Publications)," Re: Certain Modular LED Display Panels and Components Thereof, *Ultravision Technologies, Inc.* v. *Adduci, Mastriani and Schaumberg, L.L.P.*, United States International Trade Commission, ITC Inv. No. 337-TA-1114, Sep. 10, 2018, 26 pages.
"Exhibit B—Respondents' Notice of Prior Art (Prior Art Products)," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 10, 2018, 9 pages.
"Commission Investigative Staff's Notice of Prior Art," Re: Certain Modular LED Display Panels and Components Thereof, *Ultravision Technologies, Inc.* v. *Adduci, Mastriani and Schaumberg, L.L.P.*, United States International Trade Commission, Investigative No. 337-TA-1114, Sep. 10, 2018, 8 pages.
"Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, Investigative No. 337-TA-1114, Sep. 21, 2018, 35 pages.
"Exhibit 4 of Respondents' Combined Supplemental Responses to Opening Contention Interrogatories" Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 44 pages.
"Exhibit 5 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 19 pages.
"Exhibit 7 of Respondents' Combined Supplemental Responses to Opening Contention Interrogatories," Re: Certain Modular LED

(56) References Cited

OTHER PUBLICATIONS

Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 22 pages.
"Exhibit 8 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 51 pages.
"Exhibit 9 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 20 pages.
"Exhibit 10 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 35 pages.
"Exhibit 11 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 24 pages.
"Exhibit 13 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 24 pages.
"Exhibit 14 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 34 pages.
"Exhibit 15 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 48 pages.
"Exhibit 17 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, pp. 1-29.
"Exhibit 17 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, pp. 30-58.
"Exhibit 24 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 40 pages.
"Exhibit 25 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 54 pages.
"Exhibit 26 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 42 pages.
"Exhibit 27 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 41 pages.
"Exhibit 28 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 29 pages.
"Exhibit 29 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 29 pages.
"Exhibit 30 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 44 pages.
"Exhibit 33 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 50 pages.
"Exhibit 40 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 93 pages.
"Exhibit 41 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 223 pages.
"Exhibit 42 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 433 pages.
"Exhibit 44 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 28 pages.
"Exhibit 45 of Respondents' Combined Supplemental Responses to Opening Contention Interrogatories," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Sep. 21, 2018, 31 pages.
"Exhibit 46 of Respondents' Combined Supplemental Responses to Opening Contention Interrogatories," Re: Certain Modular LED Display Panels and Components Thereof, *Ultravision Technologies,*

(56) References Cited

OTHER PUBLICATIONS

*Inc.* v. *Adduci, Mastriani and Schaumberg, L.L.P.*, United States International Trade Commission, IITC Inv. No. 337-TA-1114, Sep. 21, 2018, 31 pages.

"Respondents' Motion for Leave to Amend and Assert Additional Defenses that the Patents are Unenforceable for Inequitable Conduct, Patent Misuse, Unclean Hands, and/or Improper Inventorship" Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Oct. 11, 2018, 30 pages.

"Respondents' Motion for Leave to Supplement the Invalidity Contentions Based on Information Recently Received," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Oct. 23, 2018, 12 pages.

"Declaration of Patrick J. Mccarthy in Support of Respondents' Motion for Leave to Supplement the Invalidity Contentions Based on Information Recently Received," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Oct. 23, 2018, 2 pages.

"Exhibit 3 of Motion for Leave to Supplement the Invalidity Contentions Based on Information Recently Received," Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Oct. 23, 2018, 36 pages.

"Ultravision's Opposition to Respondents' Motion for Leave to Amend and Assert Additional Defenses that the Patents are Unenforceable for Inequitable Conduct, Patent Misuse, Unclean Hands, and/or Improper Inventorship" Re: Certain Modular LED Display Panels and Components Thereof, *Ultravision Technologies, Inc.* v. *Adduci, Mastriani and Schaumberg, L.L.P.*, United States International Trade Commission, IITC Inv. No. 337-TA-1114, Nov. 5, 2018, 20 pages.

Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 79 pgs.

"Exhibit 1001, U.S. Pat. No. 9,916,782," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 85 pgs.

"Exhibit 1003, Declaration of Mike Wood," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 80 pgs.

"Exhibit 1004, Part 1 of 3, for U.S. Pat. No. 9,349,306," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 200 pgs.

"Exhibit 1004, Part 2 of 3, for U.S. Pat. No. 9,349,306," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 200 pgs.

"Exhibit 1004, Part 3 of 3, for U.S. Pat. No. 9,349,306," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 194 pgs.

"Exhibit 1006, U.S. Appl. No. 2013/0271973," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 62 pgs.

"Exhibit 1007, U.S. Appl. No. 2006/0227003," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 11 pgs.

"Exhibit 1008, CN 201449702 U," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 19 pgs.

"Exhibit 1009, U.S. Appl. No. 2007/0247842," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 35 pgs.

"Exhibit 1010, U.S. Appl. No. 2005/0116667," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 112 pgs.

"Exhibit 1011, Joint Claim Construction Chart, Investigation No. 337-TA-1114," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 19 pgs.

"Exhibit 1012, Watch What Happens, 2008 LED Signs, Watchfire," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 20 pgs.

"Exhibit 1013, Part 1 of 3, for U.S. Pat. No. 9,916,782," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board , U.S. Pat. No. 9,916,782, Case No. IPR2019-00881, Mar. 27, 2019, 200 pgs.

"Exhibit 1013, Part 2 of 3, for U.S. Pat. No. 9,916,782," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark

(56) References Cited

OTHER PUBLICATIONS

Office, Before the Patent Trial and Appeal Board, U.S. Pat. No. 9,916,782, Case No. IPR2019-00881, Mar. 27, 2019, 200 pgs.
"Exhibit 1013, Part 3 of 3, for U.S. Pat. No. 9,916,782," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 216 pgs.
"Exhibit 1015, CN 2834111 Y," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 24 pgs.
"Exhibit 1036, About the IEC, International Electrotechnical Commission, What We Do," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 2 pgs.
"Exhibit 1039, CN 102930785 A," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 12 pgs.
"Exhibit 1040, U.S. Appl. No. 2007/0263381," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 9 pgs.
"Exhibit 1042, Philips, LED Display Solutions," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 24 pgs.
"Exhibit 1043, Richard Cadena, PLSN Buyers Guide, LED Video Displays," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 2 pgs.
"Exhibit 1044, Justin Lang, Buyers Guide, LED Display Panels," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 2 pgs.
"Exhibit 1045, Avago Technologies, IPx6 Rated Surface Mount LED, Application Note 5487," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 2 pgs.
"Exhibit 1047, Xin Min Liu, Certification of Translation," Petition for Inter Partes Review, Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,916,782, Case No. IPR2019-00881, Mar. 27, 2019, 1 page.
Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 88 pgs.
"Exhibit 1001, U.S. Pat. No. 9,349,306," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 83 pgs.
"Exhibit 1002, Part 1 of 3, U.S. Pat. No. 9,349,306," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 200 pgs.
"Exhibit 1002, Part 2 of 3, U.S. Pat. No. 9,349,306," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 200 pgs.
"Exhibit 1002, Part 3 of 3, U.S. Pat. No. 9,349,306," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 194 pgs.
"Exhibit 1004, Part 1 of 3, U.S. Pat. No. 9,916,782," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 200 pgs.
"Exhibit 1004, Part 2 of 3, U.S. Pat. No. 9,916,782," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 200 pgs.
"Exhibit 1004, Part 3 of 3, U.S. Pat. No. 9,916,782," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 227 pgs.
"Exhibit 1005, Declaration of Richard A. Flasck," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 101 pgs.
"Exhibit 1007, Curriculum Vitae of Richard A. Flasck," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 7 pgs.
"Exhibit 1008, JP P2001-337626 A," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 21 pgs.
"Exhibit 1009, KR 2002-0069818 A," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 28 pgs.
"Exhibit 1011, JP P2003-92195 A," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 12 pgs.
"Exhibit 1013, WO 02/23956 A2," Petition for Inter Partes Review, Re: NEC Display Solutions of America, Inc., United States Patent

(56) References Cited

OTHER PUBLICATIONS and Trademark Office, Before the Patent Trial and Appeal Board, U.S. Pat. No. 9,349,306, Case No. IPR2019-01123, May 23, 2019, 20 pgs.
"Exhibit 1014, Joint Claim Construction Chart, Investigation No. 337-TA-1114," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 19 pgs.
"Exhibit 1015, Webster's New College Dictionary, Third Edition," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 5 pgs.
"Exhibit 1016, OSRAM, Technical Application Guide, IP Codes in Accordance with IEC 60529," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 9 pgs.
"Exhibit 1017, BARCO, LED Displays," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 1 page.
"Exhibit 1018, Mitsubishi Electric, Diamond Vision Systems," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 2 pgs.
"Exhibit 1019, Daktronics, Reinventing the Way you Display since 1938," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 7 pgs.
"Exhibit 1020, Songhan, Plastic Technology Co., Ltd., Master Bond EP30LV-1 Ultra Low Viscosity, Two Part Epoxy System," Petition for Inter Partes Review, Re: NEC Display Solutions of America, Inc., United States Patent and Trademark Office, Before the Patent Trial and Appeal Board, U.S. Pat. No. 9,349,306, Case No. PR2019-01123, May 23, 2019, 3 pgs.
"Exhibit 1021, Master Bond, Low Shrinkage Clear Epoxy Assures Precision," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 3 pgs.
"Exhibit 1022, U.S. Appl. No. 2013/0182440," Petition for Inter Partes Review, Re: NEC Display Solutions of America, Inc., United States Patent and Trademark Office, Before the Patent Trial and Appeal Board, U.S. Pat. No. 9,349,306, Case No. IPR2019-01123, May 23, 2019, 48 pgs.
Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 85 pgs.
"Exhibit 1002, Part 1 of 3, U.S. Pat. No. 9,349,306," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 200 pgs.
"Exhibit 1002, Part 2 of 3, U.S. Pat. No. 9,349,306," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 200 pgs.
"Exhibit 1002, Part 3 of 3, U.S. Pat. No. 9,349,306," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 194 pgs.
"Exhibit 1003, U.S. Pat. No. 9,916,782," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 85 pgs.
"Exhibit 1004, Part 1 of 3, U.S. Pat. No. 9,916,782," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 200 pgs.
"Exhibit 1004, Part 2 of 3, U.S. Pat. No. 9,916,782," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 200 pgs.
"Exhibit 1004, Part 3 of 3, U.S. Pat. No. 9,916,782," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 227 pgs.
"Exhibit 1006, Declaration of Richard A. Flasck," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 100 pgs.
"Exhibit 1007, Curriculum Vitae of Richard A. Flasck," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 7 pgs.
"Exhibit 1008, JP P2001-337626 A," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 21 pgs.
"Exhibit 1009, KR 2002-0069818 A," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01117, May 22, 2019, 28 pgs.
"Exhibit 1010, CN 102930785 A," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 26 pgs.
"Exhibit 1011, JP P2003-92195 A," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 12 pgs.
"Exhibit 1012, CN 2834111 Y," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 22 pgs.
"Exhibit 1013, WO 02/23956 A2," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 20 pgs.
"Exhibit 1014, Joint Claim Construction Chart, Investigation No. 337-TA-1114," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 19 pgs.
"Exhibit 1015, Webster's New College Dictionary, Third Edition," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 5 pgs.
"Exhibit 1016, OSRAM, Technical Application Guide, IP Codes in Accordance with IEC 60529," Petition for Inter Partes Review, Re: NEC Display Solutions of America, Inc., United States Patent and

(56) References Cited

OTHER PUBLICATIONS

Trademark Office, Before the Patent Trial and Appeal Board, U.S. Pat. No. 9,916,782, Case No. IPR2019-01123, May 23, 2019, 9 pgs.
"Exhibit 1017, Barco, LED Displays," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 1 page.
"Exhibit 1018, Mitsubishi Electric, Diamond Vision Systems," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 2 pgs.
"Exhibit 1019, Daktronics, Reinventing the Way you Display since 1938," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 7 pgs.
"Exhibit 1020, Songhan, Plastic Technology Co., Ltd., Master Bond EP3OLV-1 Ultra Low Viscosity, Two Part Epoxy System," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 3 pgs.
"Exhibit 1021, Master Bond, Low Shrinkage Clear Epoxy Assures Precision," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 3 pgs.
"Exhibit 1022, U.S. Appl. No. 2013/0182440," Petition for Inter Partes Review, Re: NEC Display Solutions of America, Inc., United States Patent and Trademark Office, Before the Patent Trial and Appeal Board, U.S. Pat. No. 9,916,782, Case No. IPR2019-01123, May 23, 2019, 48 pgs.
Decision Denying Institution of Inter Partes Review; Re: Shenzhen AOTO Electronics Co., Ltd.; Leyard Optoelectronic Co.; Shenzhen, Liantronics Co., Ltd.; Unilumin Group Co., Ltd.; Yaham Optoelectronics Co., Ltd.; and Ledman Optoelectronic Co., Ltd., United States Patent and Trademark Office, Before the Patent Trial and Appeal Board, U.S. Pat. No. 9,349,306, Case No. IPR2019-00347, May 24, 2019, 37 pgs.

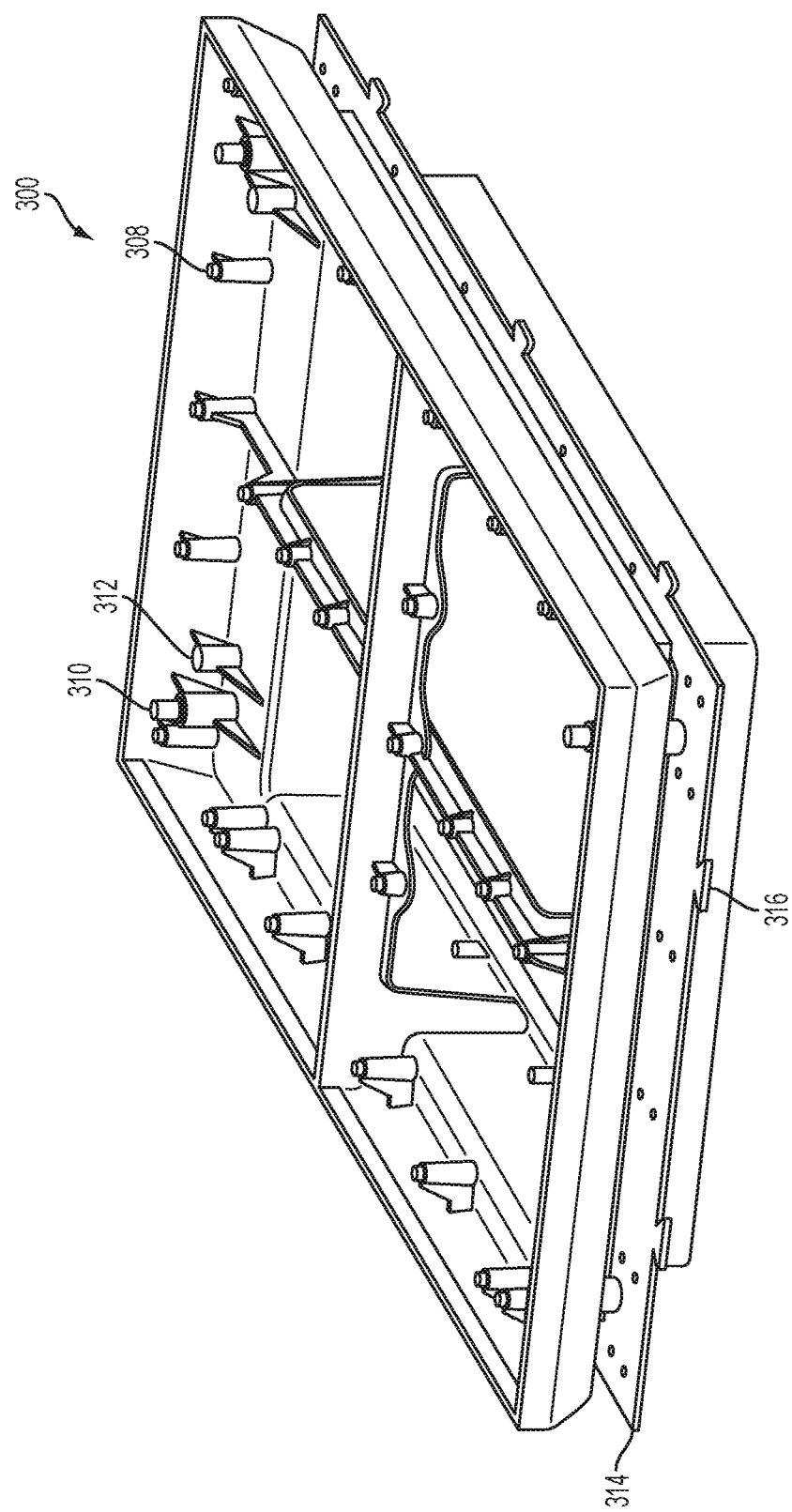

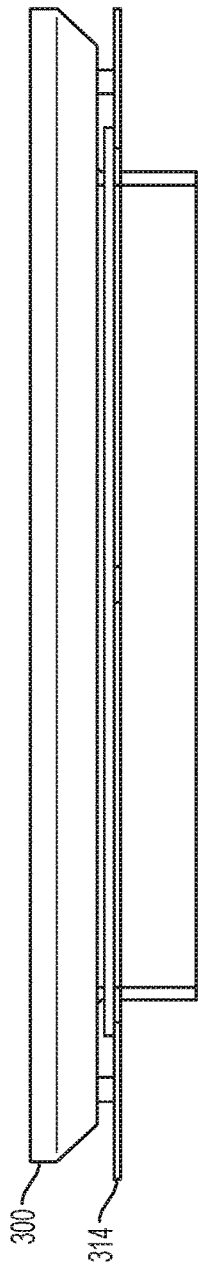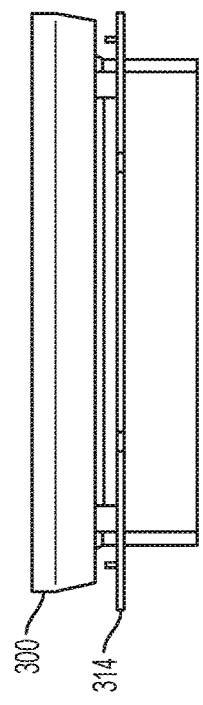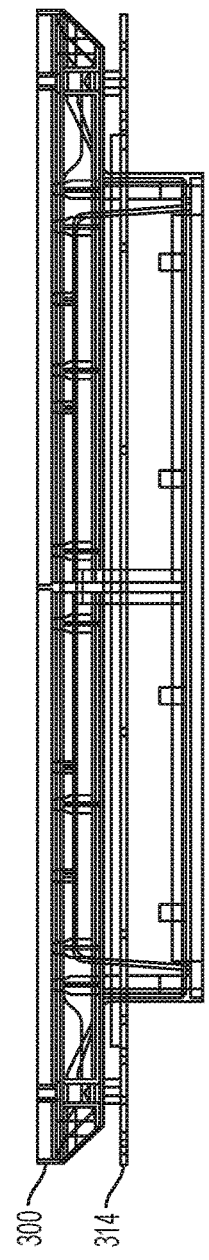

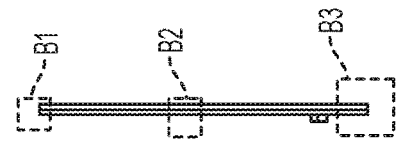
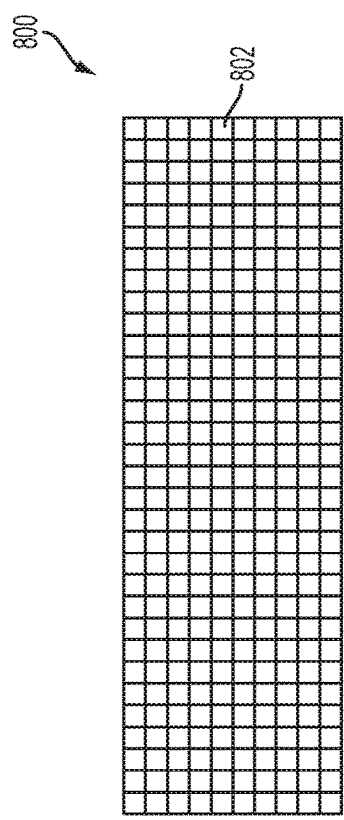
FIG. 8A
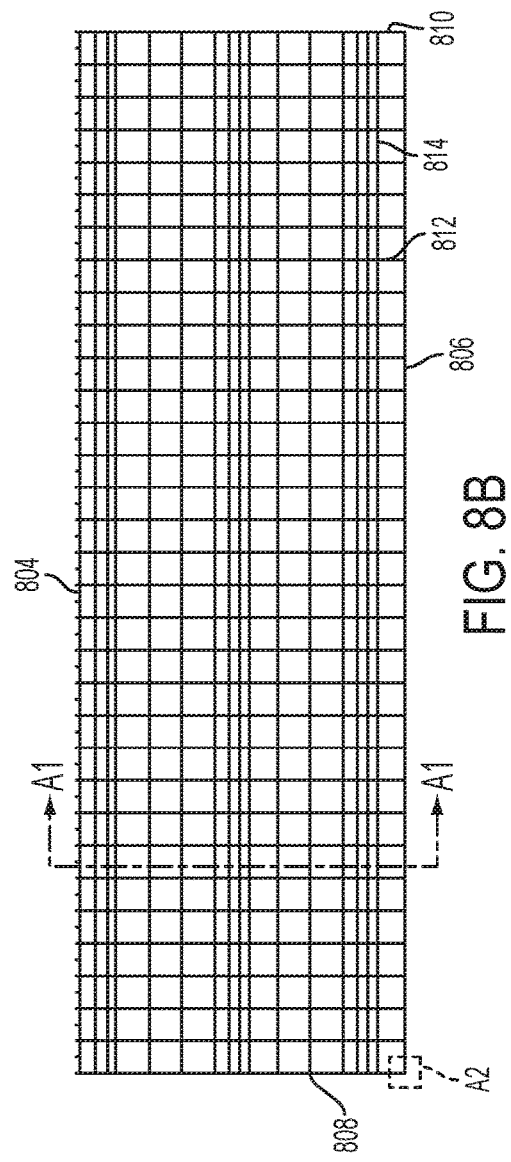
FIG. 8B
FIG. 8C

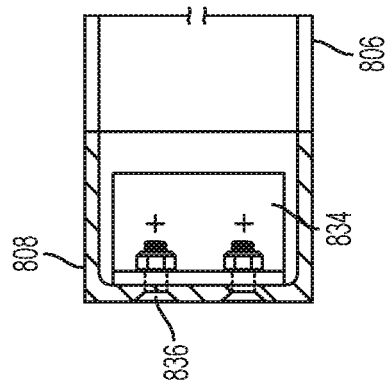
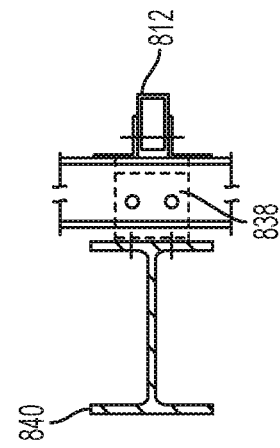
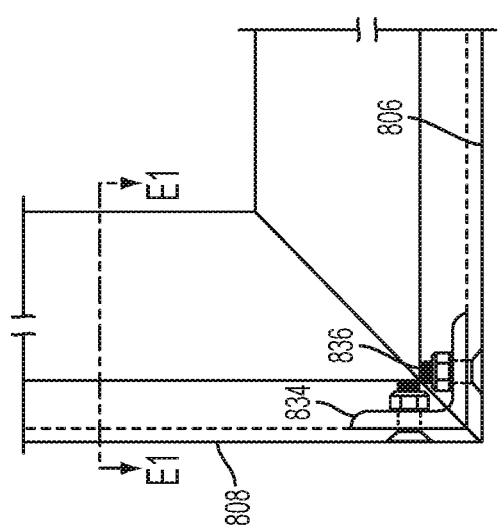
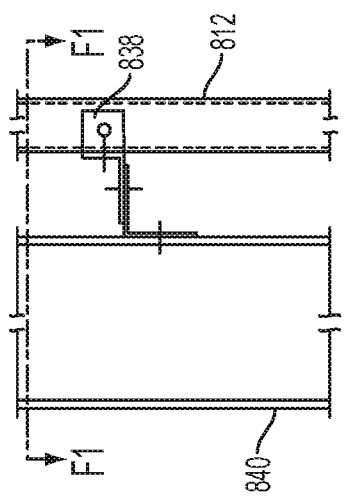

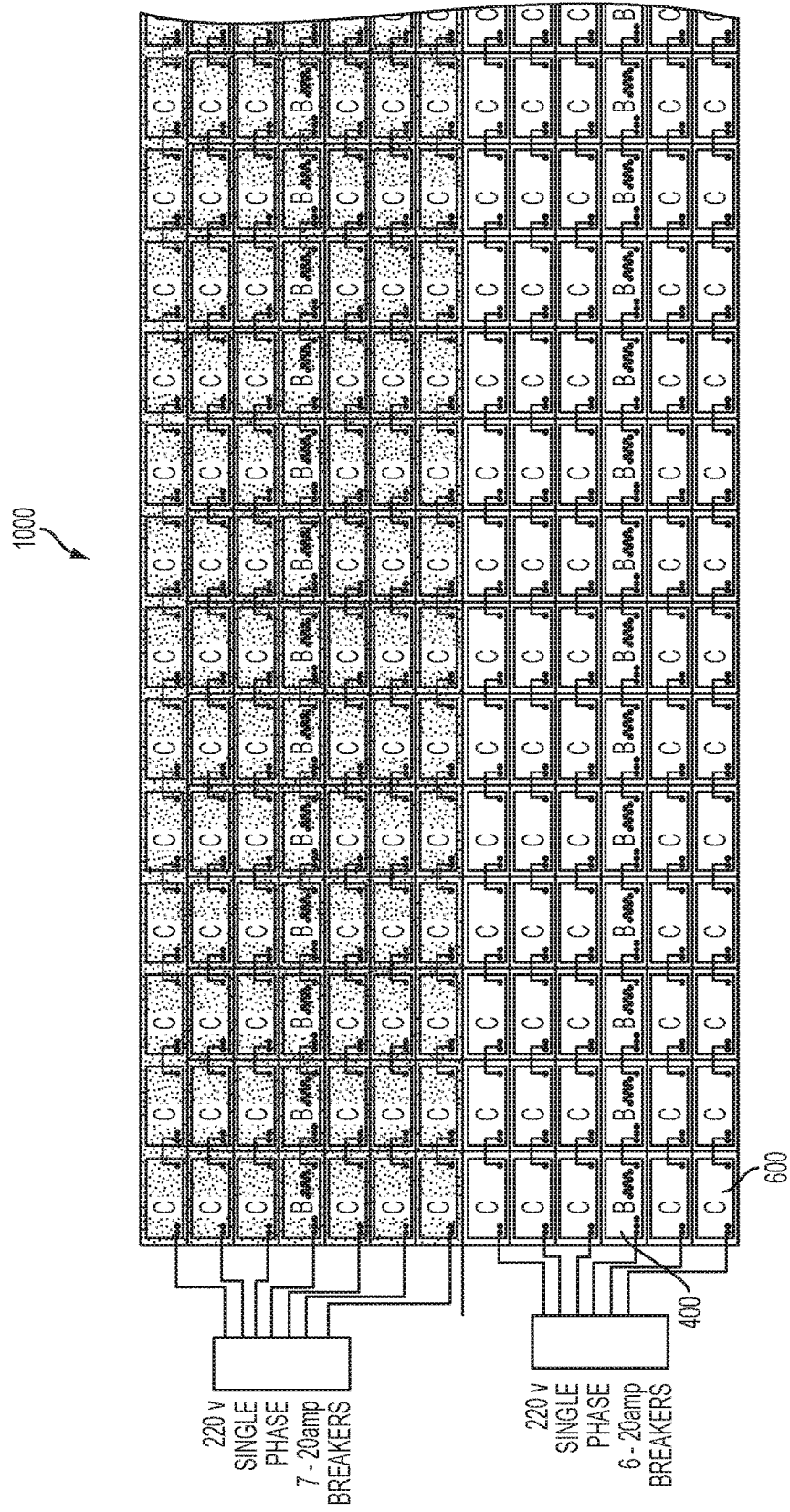

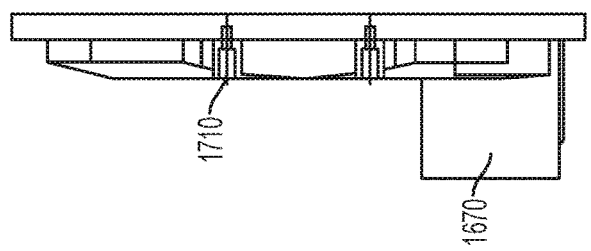
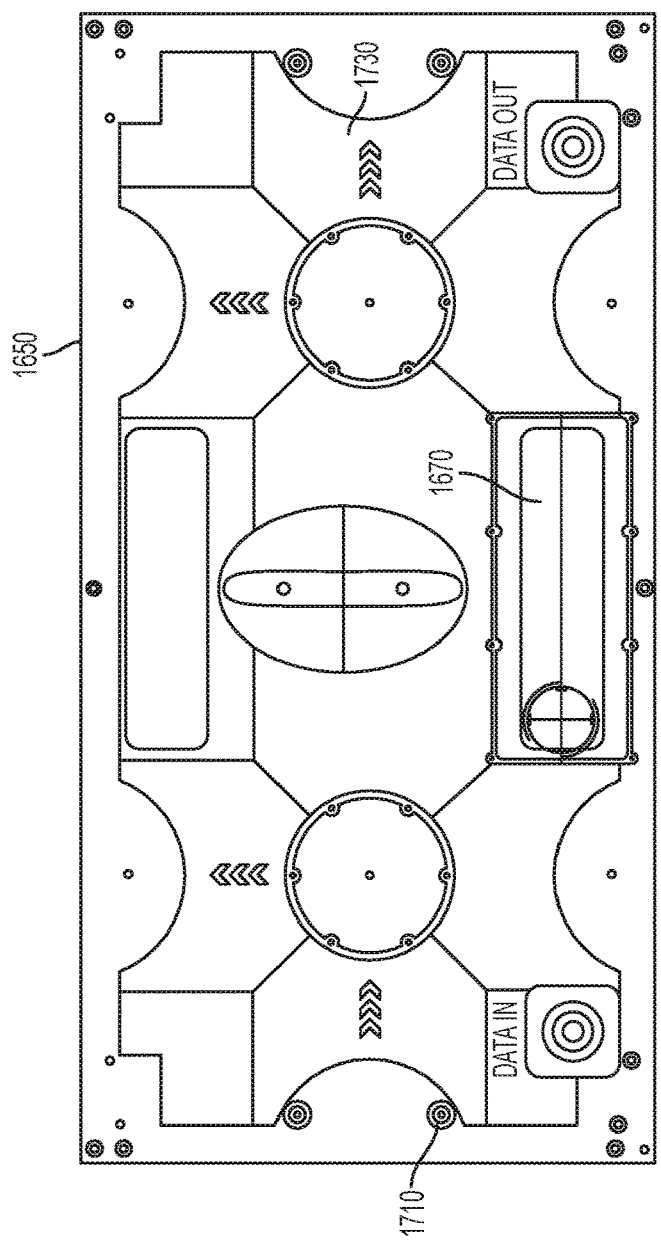
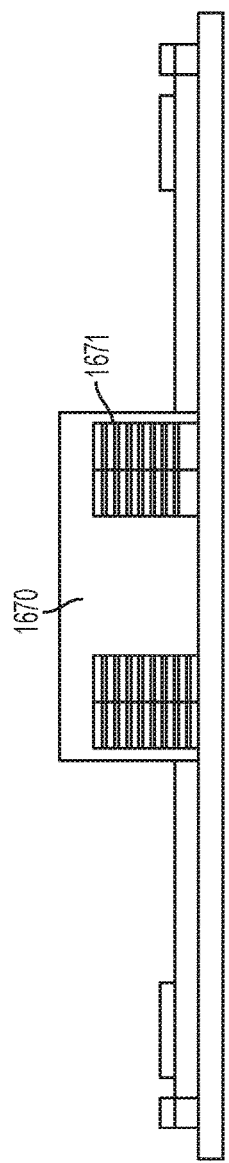
FIG. 25D
FIG. 25B
FIG. 25C

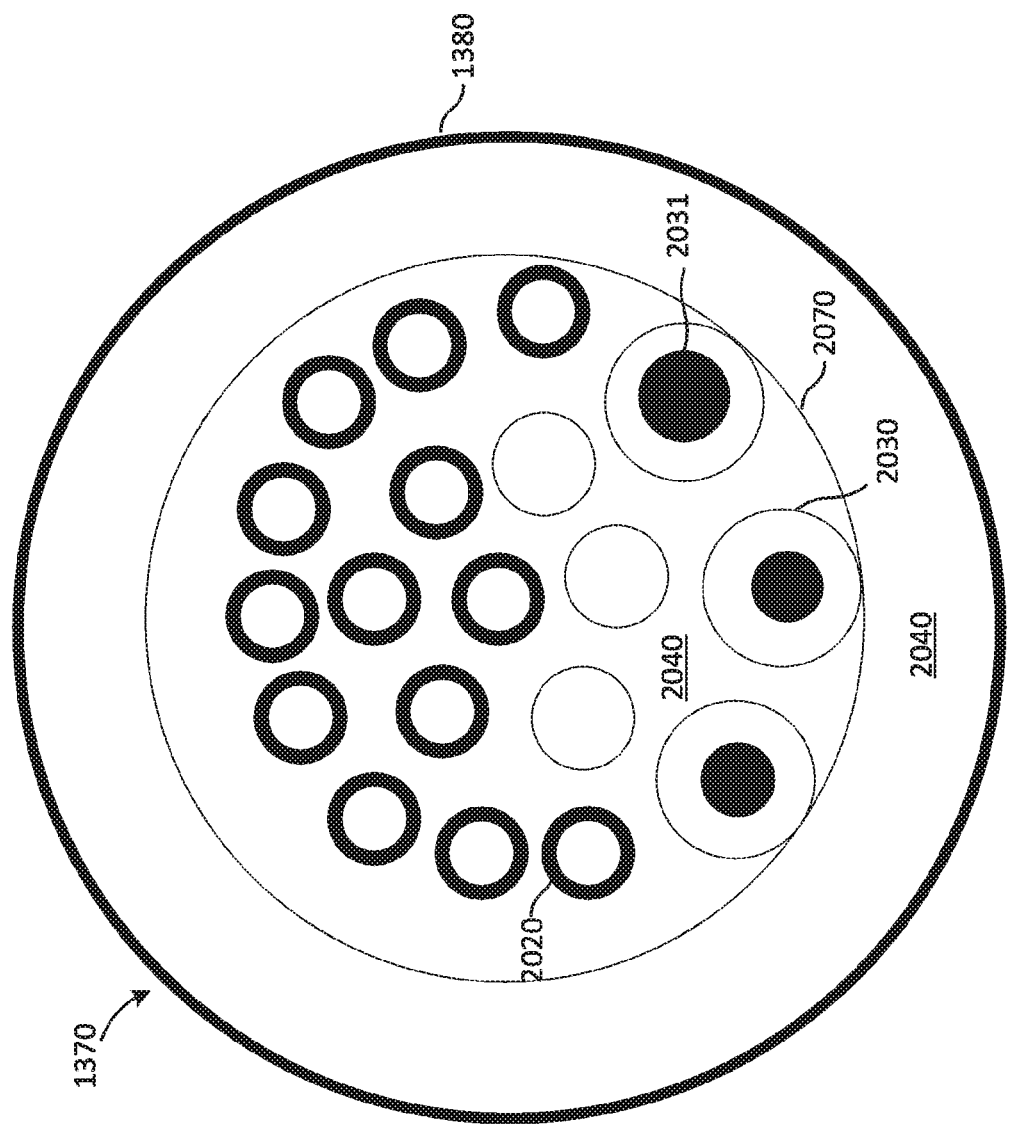

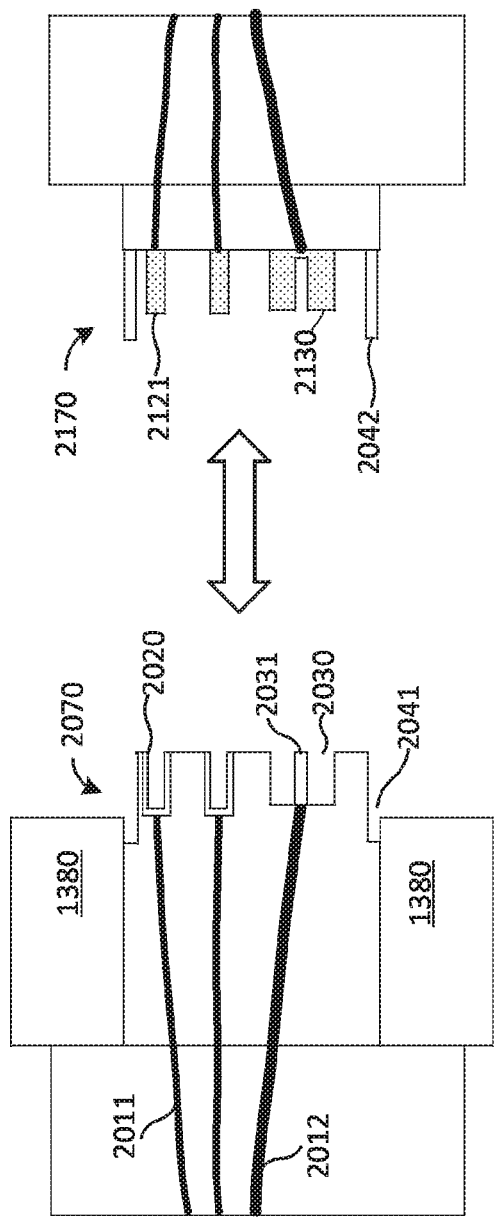
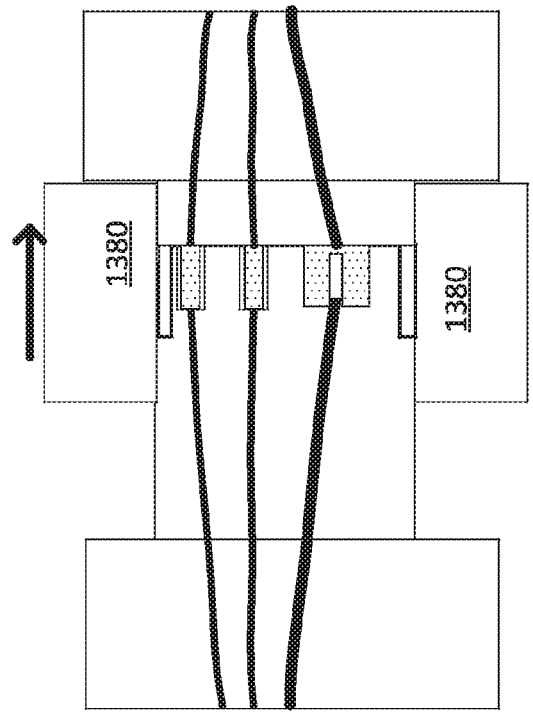
FIG. 35A
FIG. 35B

MODULAR DISPLAY PANEL

This application is a continuation application of U.S. application Ser. No. 15/962,572 filed Apr. 25, 2018, which is a continuation of U.S. application Ser. No. 15/885,284 filed Jan. 31, 2018, which is a continuation of U.S. application Ser. No. 15/866,294 filed on Jan. 9, 2018, which is a continuation of U.S. application Ser. No. 15/369,304 filed on Dec. 5, 2016, which is a continuation application of U.S. application Ser. No. 15/162,439 filed on May 23, 2016, which is a continuation application of U.S. application Ser. No. 14/850,632 filed on Sep. 10, 2015, which is a continuation application of U.S. application Ser. No. 14/444,719 filed on Jul. 28, 2014. All of the above applications are incorporated herein by reference in their entirety. U.S. application Ser. No. 14/444,719 claims the benefit of U.S. Provisional Application No. 62/025,463, filed on Jul. 16, 2014 and also claims the benefit of U.S. Provisional Application No. 61/922,631, filed on Dec. 31, 2013, which applications are hereby incorporated herein by reference in their entirety.

CROSS-REFERENCE TO RELATED APPLICATIONS

U.S. patent application Ser. No. 14/328,624, filed Jul. 10, 2014, also claims priority to U.S. Provisional Application No. 61/922,631 and is also incorporated herein by reference in its entirety.

The following patents and applications are related:

U.S. patent application Ser. No. 15/989,526, filed May 25, 2018 (co-pending)
U.S. patent application Ser. No. 15/989,461, filed May 25, 2018 (co-pending)
U.S. patent application Ser. No. 15/962,572, filed Apr. 25, 2018 (co-pending)
U.S. patent application Ser. No. 15/926,772, filed Mar. 20, 2018 (co-pending)
U.S. patent application Ser. No. 15/885,284, filed Jan. 31, 2018 (co-pending)
U.S. patent application Ser. No. 15/881,524, filed Jan. 26, 2018 (co-pending)
U.S. patent application Ser. No. 15/881,394, filed Jan. 26, 2018 (now U.S. Pat. No. 9,984,603)
U.S. patent application Ser. No. 15/880,295, filed Jan. 25, 2018 (now U.S. Pat. No. 9,990,869)
U.S. patent application Ser. No. 15/866,294, filed Jan. 9, 2018 (now U.S. Pat. No. 9,978,294)
U.S. patent application Ser. No. 15/331,681, filed Oct. 21, 2016 (co-pending)
U.S. patent application Ser. No. 14/341,678, filed Jul. 25, 2014 (now U.S. Pat. No. 9,195,281)
U.S. patent application Ser. No. 14/948,939, filed Nov. 23, 2015 (now U.S. Pat. No. 9,535,650)
U.S. patent application Ser. No. 15/396,102, filed Dec. 30, 2016 (now U.S. Pat. No. 9,642,272)
U.S. patent application Ser. No. 15/582,059, filed Apr. 28, 2017 (now U.S. Pat. No. 9,832,897)
U.S. patent application Ser. No. 15/802,241, filed Nov. 2, 2017 (co-pending)
U.S. patent application Ser. No. 14/444,719, filed Jul. 28, 2014 (now U.S. Pat. No. 9,134,773)
U.S. patent application Ser. No. 14/850,632, filed Sep. 10, 2015 (now U.S. Pat. No. 9,349,306)
U.S. patent application Ser. No. 15/162,439, filed May 23, 2016 (now U.S. Pat. No. 9,513,863)
U.S. patent application Ser. No. 15/369,304, filed Dec. 5, 2016 (now U.S. Pat. No. 9,916,782)
U.S. patent application Ser. No. 14/444,775, filed Jul. 28, 2014 (now U.S. Pat. No. 9,081,552)
U.S. patent application Ser. No. 14/627,923, filed Feb. 20, 2015 (now U.S. Pat. No. 9,131,600)
U.S. patent application Ser. No. 14/829,469, filed Aug. 18, 2015 (now U.S. Pat. No. 9,226,413)
U.S. patent application Ser. No. 14/981,561, filed Dec. 28, 2015 (now U.S. Pat. No. 9,372,659)
U.S. patent application Ser. No. 14/444,747, filed Jul. 28, 2014 (now U.S. Pat. No. 9,069,519)
U.S. patent application Ser. No. 14/550,685, filed Nov. 21, 2014 (now U.S. Pat. No. 9,582,237)
U.S. patent application Ser. No. 14/641,130, filed Mar. 6, 2015 (now U.S. Pat. No. 9,164,722)
U.S. patent application Ser. No. 15/409,288, filed Jan. 18, 2017 (co-pending)
U.S. patent application Ser. No. 14/582,908, filed Dec. 24, 2014 (now U.S. Pat. No. 9,416,551)
U.S. patent application Ser. No. 14/641,189, filed Mar. 6, 2015 (now U.S. Pat. No. 9,528,283)
U.S. patent application Ser. No. 15/390,277, filed Dec. 23, 2016 (now U.S. Pat. No. 9,940,856)
U.S. patent application Ser. No. 14/720,544, filed May 22, 2015 (co-pending)
U.S. patent application Ser. No. 14/720,560, filed May 22, 2015 (now U.S. Pat. No. 9,207,904)
U.S. patent application Ser. No. 14/720,610, filed May 22, 2015 (now U.S. Pat. No. 9,311,847)

TECHNICAL FIELD

The present invention relates generally to displays, and, in particular embodiments, to a system and method for a modular multi-panel display.

BACKGROUND

Large displays (e.g., billboards), such as those commonly used for advertising in cities and along roads, generally have one or more pictures and/or text that are to be displayed under various light and weather conditions. As technology has advanced and introduced new lighting devices such as the light emitting diode (LED), such advances have been applied to large displays. An LED display is a flat panel display, which uses an array of light-emitting diodes. A large display may be made of a single LED display or a panel of smaller LED panels. LED panels may be conventional panels made using discrete LEDs or surface-mounted device (SMD) panels. Most outdoor screens and some indoor screens are built around discrete LEDs, which are also known as individually mounted LEDs. A cluster of red, green, and blue diodes is driven together to form a full-color pixel, usually square in shape. These pixels are spaced evenly apart and are measured from center to center for absolute pixel resolution.

SUMMARY

Embodiments of the invention relate to lighting systems and, more particularly, to multi-panel lighting systems for providing interior or exterior displays.

In one embodiment, a modular display panel comprises a casing having a recess. The casing comprises locking points for use in attachment to an adjacent casing of another modular display panel. A printed circuit board is disposed in the recess and a plurality of LEDs attached to the printed circuit board. A driver circuit is attached to the printed circuit board. A heat sink is disposed between a back side of the casing and the printed circuit board. The heat sink thermally contacts the back side of the casing and the printed circuit board. A framework of louvers is disposed over the printed circuit board. The framework of louvers is disposed between rows of the plurality of LEDs. The framework of louvers is attached to the printed circuit board using an adhesive.

In another embodiment, a modular multi-panel display system comprises a mechanical support structure, and a plurality of LED display panels mounted to the mechanical support structure so as to form an integrated display panel. Each LED display panel includes a casing having a recess. The casing comprises interlocking attachment points that are attached to an adjacent LED display panel. Each LED display panel also includes a printed circuit board disposed in the recess. A plurality of LED modules is attached to the printed circuit board. Each LED display panel also includes a heat sink disposed between a back side of the casing and the printed circuit board. The heat sink thermally contacts the back side of the casing and the printed circuit board. Each LED display panel is hermetically sealed and exposed to the environment without use of any cabinets. The display system is cooled passively and includes no air conditioning, fans, or heating units.

In yet another embodiment, a modular display panel comprises a plastic housing having a recess, and a printed circuit board disposed in the recess. A plurality of LEDs is attached to the printed circuit board. A transparent potting compound overlies the LEDs. A driver circuit is attached to the printed circuit board. A heat sink is disposed between a back side of the housing and the printed circuit board. The heat sink thermally contacts the back side of the housing and the printed circuit board. A power supply is mounted outside the plastic housing.

BRIEF DESCRIPTION OF THE DRAWINGS

For a more complete understanding, reference is now made to the following description taken in conjunction with the accompanying drawings in which:

FIGS. 3A-3I illustrate one embodiment of a housing and an alignment plate that may be used with the panel of FIG. 2A;

FIGS. 8A-8M illustrate one embodiment of a frame that may be used with the display of FIGS. 1A and 1B;

FIGS. 10A-10D illustrate one embodiment of a display configuration;

FIGS. 16A-16E illustrate an attachment plate used to attach one or more modular display panels to the frame in accordance with an embodiment of the present invention, wherein FIG. 16A illustrates a projection view while FIG. 16B illustrates a top view and FIG. 16C illustrates a cross-sectional view of a first embodiment while FIG. 16D illustrates a bottom view and FIG. 16E illustrates a bottom view of a second embodiment;

FIGS. 21A-21C illustrate an alternative embodiment of the modular display panel attached to a supporting frame in accordance with an embodiment of the present invention, wherein FIGS. 21B and 21C illustrate alternative structural embodiments of the supporting frame;

FIGS. 24A-24C illustrate a display panel in accordance with an embodiment of the present invention, wherein FIG. 24A illustrates a cross-sectional view of a display panel while FIG. 24B illustrates a schematic of the display panel, and wherein FIG. 24C illustrates a schematic of the LED array as controlled by the receiver circuit in accordance with an embodiment of the present invention;

FIGS. 25A-25D illustrate a display panel in accordance with an embodiment of the present invention, wherein FIG. 25A illustrates a projection view of the back side of the display panel, FIG. 25B illustrates a planar back side of the display panel, and FIG. 25C illustrates a planar bottom view while FIG. 25D illustrates a side view;

FIGS. 27A-27C illustrate cross-sectional views of the framework of louvers at the front side of the display panel in according with an embodiment of the present invention, wherein FIG. 27 illustrates a cross-sectional along a direction perpendicular to the orientation of the plurality of ridges 1632 along the line 27-27 in FIG. 26;

FIGS. 29A-29D illustrates a schematic of a control system for modular multi-panel display system in accordance with an embodiment of the present invention, wherein FIG. 29A illustrates a controller connected to the receiver box through a wired network connection, wherein FIG. 29B illustrates a controller connected to the receiver box through a wireless network connection, wherein FIGS. 29C and 29D illustrate the power transmission scheme used in powering the modular multi-panel display system;

FIGS. 34A and 34B illustrate cross-sectional views of connectors at the ends of the integrated data and power cable in accordance with embodiments of the present invention, wherein FIG. 34A illustrates a first connector that is configured to fit or lock into a second connector illustrated in FIG. 34B;

FIGS. 35A and 35B illustrate cross-sectional views showing the first connector locked with the second connector in accordance with embodiments of the present invention, wherein FIG. 35A illustrates the first connector aligned to the second connector, while FIG. 35B illustrates the first connector securely locked to the second connector with the sealing cover sealing the connectors;

FIGS. 36A and 36B illustrate one embodiment of the first connector previously illustrated in FIG. 34A and FIGS. 35A and 35B, wherein FIG. 36A illustrates a planar top view while FIG. 36B illustrates a projection view;

FIGS. 37A and 37B illustrate one embodiment of the second connector previously illustrated in FIG. 34B and FIGS. 35A and 35B, wherein FIG. 37A illustrates a planar top view while FIG. 37B illustrates a projection view;

DETAILED DESCRIPTION OF ILLUSTRATIVE EMBODIMENTS

Figure 1A:
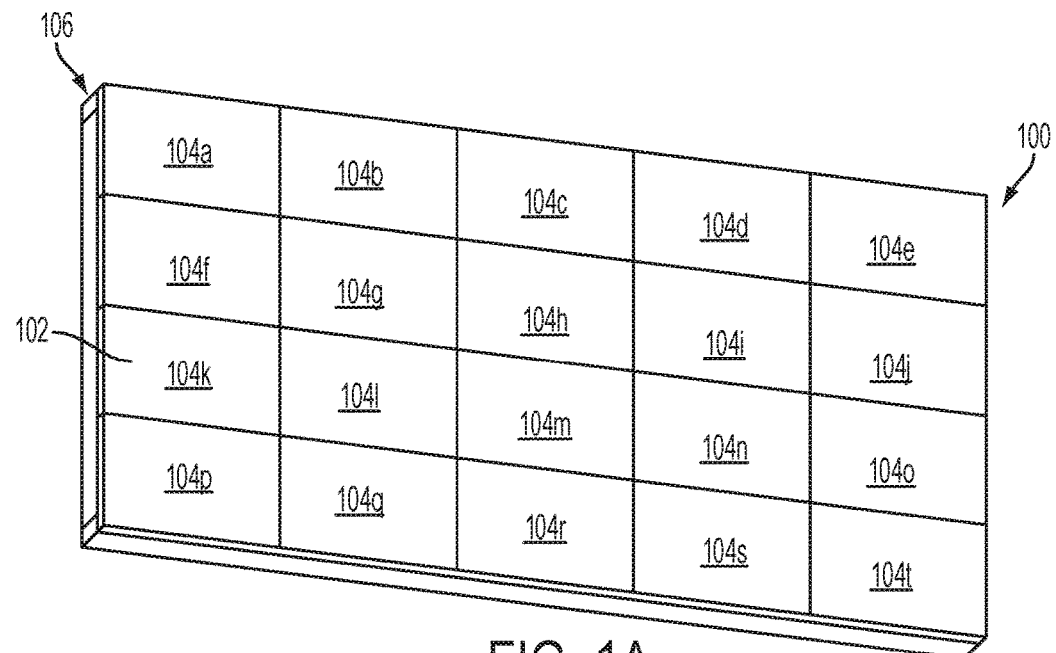
FIGS. 1A and 1B illustrate one embodiment of a display that may be provided according to the present disclosure.

In the following discussion, exterior displays are used herein for purposes of example. It is understood that the present disclosure may be applied to lighting for any type of interior and/or exterior display.

Embodiments of the invention provide display panels, each of which provides a completely self-contained building block that is lightweight. These displays are designed to protect against weather, without a heavy cabinet. The panel can be constructed of aluminum or plastic so that it will be about 50% lighter than typical panels that are commercially available. The lightweight design allows for easier installation and maintenance, thus lowering total cost of ownership.

In certain embodiments, the display is IP 67 rated and therefore waterproof and corrosion resistant. Because weather is the number one culprit for damage to LED displays, and IP 67 rating provides weatherproofing with significant weather protection. These panels are completely waterproof against submersion in up to 3 feet of water. In other embodiments, the equipment can be designed with an IP 68 rating to operate completely underwater. In lower-cost embodiments where weatherproofing is not as significant, the panels can have an IP 65 or IP 66 rating.

One aspect takes advantage of a no cabinet design-new technology that replaces cabinets, which are necessary in commercial embodiments. Older technology incorporates the use of cabinets in order to protect the LED display electronics from rain. This creates an innate problem in that the cabinet must not allow rain to get inside to the electronics, while at the same time the cabinet must allow for heat created by the electronics and ambient heat to escape.

Embodiments that do not use this cabinet technology avoid a multitude of problems inherent to cabinet-designed displays. One of the problems that has been solved is the need to effectively cool the LED display. Most LED manufacturers must use air-conditioning (HVAC) to keep their displays cool. This technology greatly increases the cost of installation and performance.

Displays of the present invention can be designed to be light weight and easy to handle. For example, the average total weight of a 20 mm, 14'×48' panel can be 5,500 pounds or less while typical commercially available panels are at 10,000 to 12,000 pounds. These units are more maneuverable and easier to install saving time and money in the process.

Embodiments of the invention provide building block panels that are configurable with future expandability. These displays can offer complete expandability to upgrade in the future without having to replace the entire display. Installation is fast and easy with very little down-time, which allows any electronic message to be presented more quickly.

In some embodiments, the display panels are "hot swappable." By removing one screw in each of the four corners of the panel, servicing the display is fast and easy. Since a highly-trained, highly-paid electrician or LED technician is not needed to correct a problem, cost benefits can be achieved.

Various embodiments utilize enhanced pixel technology (EPT), which increases image capability. EPT allows image displays in the physical pitch spacing, but also has the ability to display the image in a resolution that is four-times greater. Images will be as sharp and crisp when viewed close as when viewed from a distance, and at angles.

In embodiments of the invention, a number of different resolution display panels are manufactured and sold but each of these panels is made to have the same physical dimensions. This approach saves cost because standard-size components can be used for the various models of displays that are available. In other words, instead of maintaining inventory of eight different size housings for a product line that includes eight different resolution display panels, a single inventory can be kept. This can lower inventory costs.

Table 1 provides an example of the pitches used for a product line that includes eight different resolution display panels. Each of these panels may have dimensions of one foot by two feet. The pitch and type of LED used is provided in Table 1.

TABLE 1

6.35 mm SMD Physical
7.62 mm SMD Physical
9.525 mm SMD Physical
12.7 mm SMD Physical
15.24 mm DIP Physical
19.05 mm DIP Virtual
25.4 mm DIP Virtual
30.48 mm DIP Virtual In some embodiments it is advantageous to build multi-panel displays where each of the LEDs is provided by a single LED manufacturer, so that diodes of different origin in the manufacture are not mixed. It has been discovered that diode consistency can aid in the quality of the visual image. While this feature is not necessary, it is helpful because displays made from different diodes from different suppliers can create patchy inconsistent color, e.g., "pink" reds and pink looking casts to the overall image.

Figure 1B:
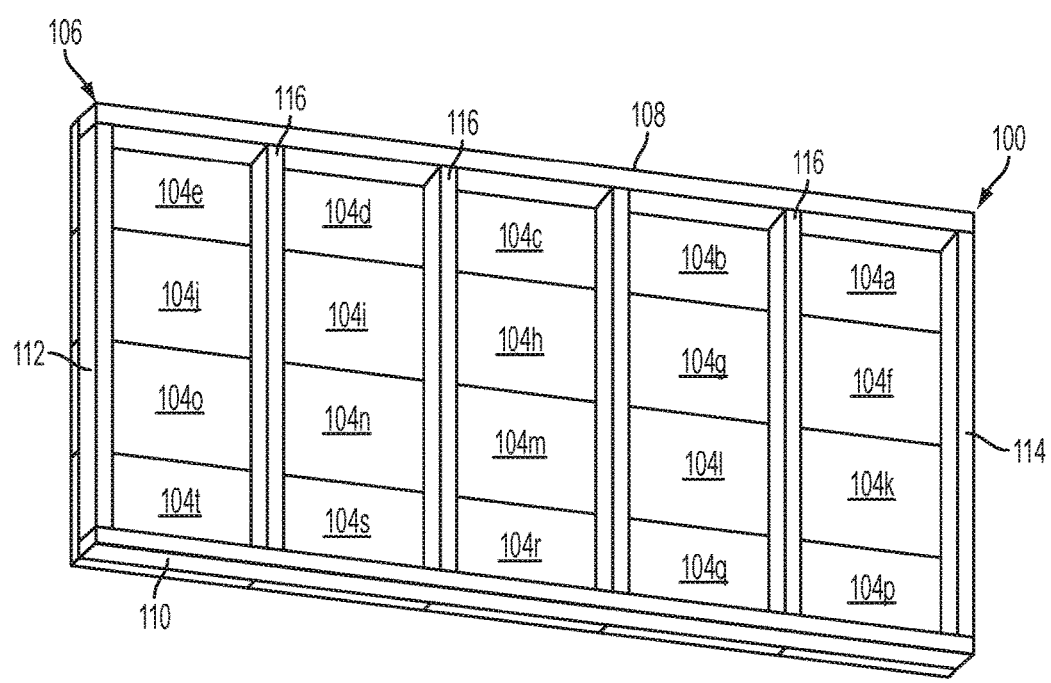

Referring to FIGS. 1A and 1B, one embodiment of a multi-panel display 100 is illustrated. The display 100 includes a display surface 102 that is formed by multiple lighting panels 104a-104t. In the present embodiment, the panels 104a-104t use light emitting diodes (LEDs) for illumination, but it is understood that other light sources may be used in other embodiments. The panels 104a-104t typically operate together to form a single image, although multiple images may be simultaneously presented by the display 100. In the present example, the panels 104a-104t are individually attached to a frame 106, which enables each panel to be installed or removed from the frame 106 without affecting the other panels.

Each panel 104a-104t is a self-contained unit that couples directly to the frame 106. By "directly," it is understood that another component or components may be positioned between the panel 104a-104t and the frame 106, but the panel is not placed inside a cabinet that is coupled to the frame 106. For example, an alignment plate (described later but not shown in the present figure) may be coupled to a panel and/or the frame 106 to aid in aligning a panel with other panels. Further a corner plate could be used. The panel may then be coupled to the frame 106 or the alignment plate and/or corner plate, and either coupling approach would be "direct" according to the present disclosure.

Two or more panels 104a-104t can be coupled for power and/or data purposes, with a panel 104a-104t receiving power and/or data from a central source or another panel and passing through at least some of the power and/or data to one or more other panels. This further improves the modular aspect of the display 100, as a single panel 104a-104t can be easily connected to the display 100 when being installed and easily disconnected when being removed by decoupling the power and data connections from neighboring panels.

The power and data connections for the panels 104a-104t may be configured using one or more layouts, such as a ring, mesh, star, bus, tree, line, or fully-connected layout, or a combination thereof. In some embodiments the LED panels 104a-104t may be in a single network, while in other embodiments the LED panels 104a-104t may be divided into multiple networks. Power and data may be distributed using identical or different layouts. For example, power may be distributed in a line layout, while data may use a combination of line and star layouts.

The frame 106 may be relatively light in weight compared to frames needed to support cabinet mounted LED assemblies. In the present example, the frame 106 includes only a top horizontal member 108, a bottom horizontal member 110, a left vertical member 112, a right vertical member 114, and intermediate vertical members 116. Power cables and data cables (not shown) for the panels 104a-104t may route around and/or through the frame 106.

In one example, the display 100 includes 336 panels 104a-104t, e.g., to create a 14'×48' display. As will be discussed below, because each panel is lighter than typical panels, the entire display could be built to weigh only 5500 pounds. This compares favorably to commercially available displays of the size, which generally weigh from 10,000 to 12,000 pounds.

Figure 2A:
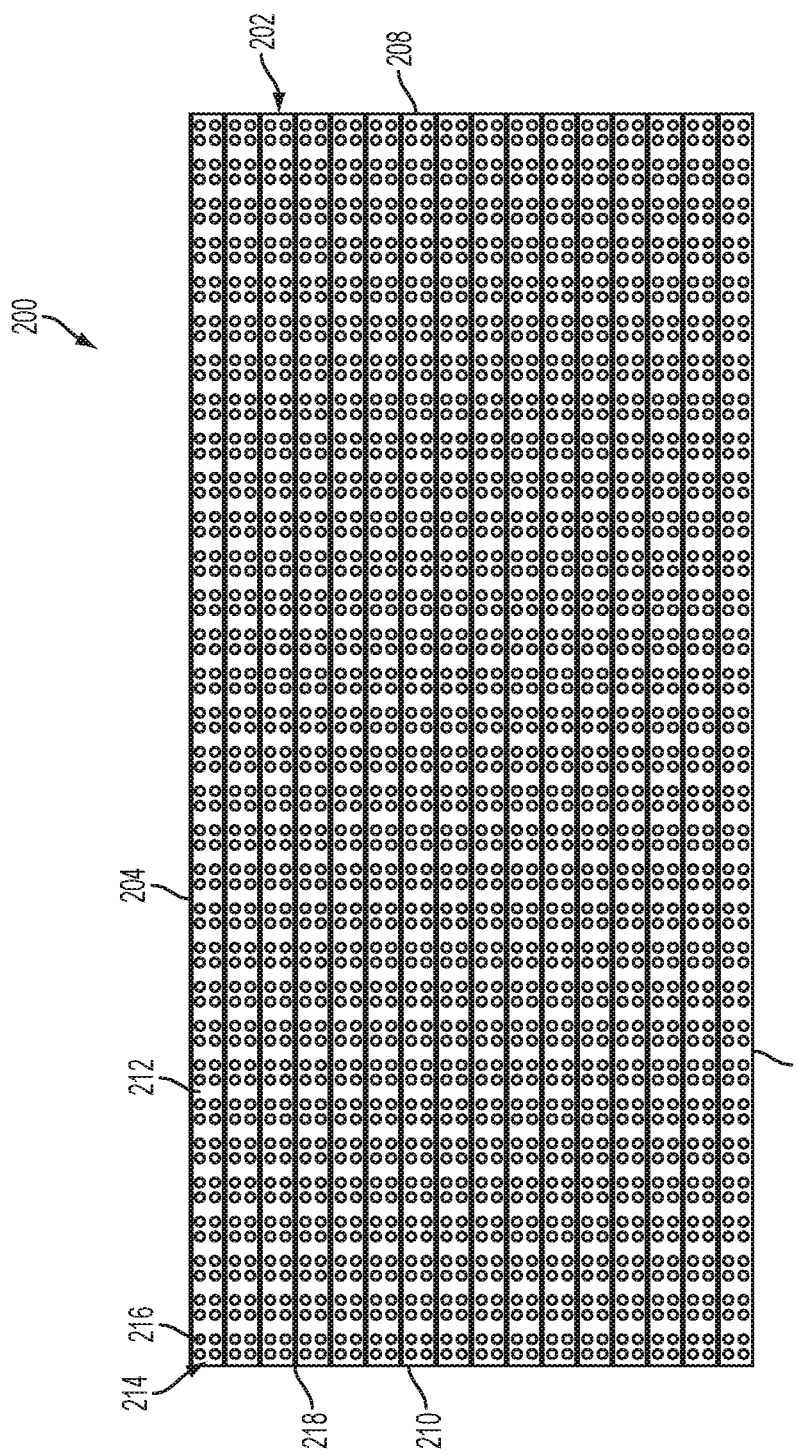
FIGS. 2A-2C illustrate one embodiment of a lighting panel that may be used with the display of FIGS. 1A and 1B.
Figure 2B:
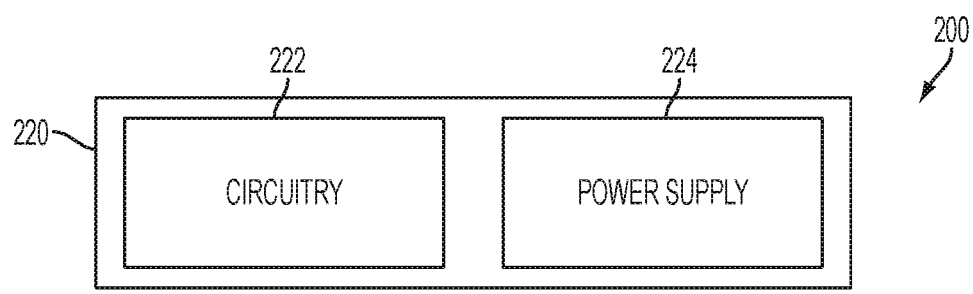
Figure 2C:
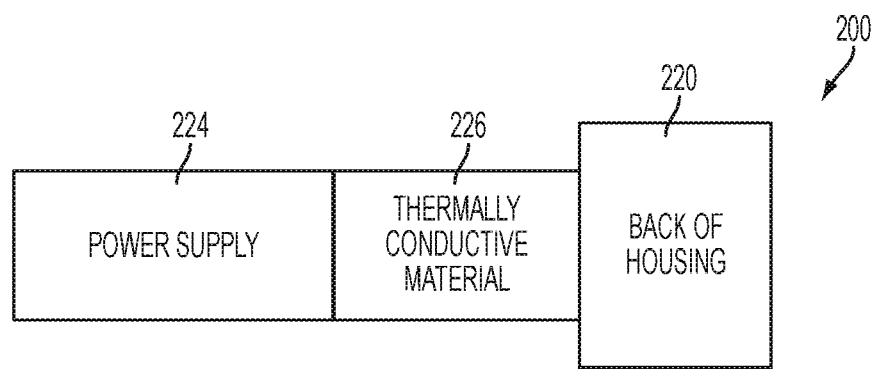

Referring to FIGS. 2A-2C, one embodiment of an LED panel 200 is illustrated that may be used as one of the LED panels 104a-104t of FIGS. 1A and 1B. FIG. 2A illustrates a front view of the panel 200 with LEDs aligned in a 16×32 configuration. FIG. 2B illustrates a diagram of internal components within the panel 200. FIG. 2C illustrates one possible configuration of a power supply positioned within the panel 200 relative to a back plate of the panel 200.

Referring specifically to FIG. 2A, in the present example, the LED panel 200 includes a substrate 202 that forms a front surface of the panel 200. The substrate 202 in the present embodiment is rectangular in shape, with a top edge 204, a bottom edge 206, a right edge 208, and a left edge 210. A substrate surface 212 includes "pixels" 214 that are formed by one or more LEDs 216 on or within the substrate 202. In the present example, each pixel 214 includes four LEDs 216 arranged in a pattern (e.g., a square). For example, the four LEDs 216 that form a pixel 214 may include a red LED, a green LED, a blue LED, and one other LED (e.g., a white LED). In some embodiments, the other LED may be a sensor. It is understood that more or fewer LEDs 216 may be used to form a single pixel 214, and the use of four LEDs 216 and their relative positioning as a square is for purposes of illustration only.

In some embodiments, the substrate 202 may form the entire front surface of the panel 200, with no other part of the panel 200 being visible from the front when the substrate 202 is in place. In other embodiments, a housing 220 (FIG. 2B) may be partially visible at one or more of the edges of the substrate 202. The substrate 202 may form the front surface of the panel 200, but may not be the outer surface in some embodiments. For example, a transparent or translucent material or coating may overlay the substrate 202 and the LEDs 216, thereby being positioned between the substrate 202/LEDs 216 and the environment.

As one example, a potting material can be formed over the LEDs 216. This material can be applied as a liquid, e.g., while heated, and then harden over the surface, e.g., when cooled. This potting material is useful for environmental protection, e.g., to achieve an IP rating of IP 65 or higher.

Louvers 218 may be positioned above each row of pixels 214 to block or minimize light from directly striking the LEDs 216 from certain angles. For example, the louvers 218 may be configured to extend from the substrate 202 to a particular distance and/or at a particular angle needed to completely shade each pixel 214 when a light source (e.g., the sun) is at a certain position (e.g., ten degrees off vertical). In the present example, the louvers 208 extend the entire length of the substrate 202, but it is understood that other louver configurations may be used.

Referring specifically to FIG. 2B, one embodiment of the panel 200 illustrates a housing 220. The housing 220 contains circuitry 222 and a power supply 224. The circuitry 222 is coupled to the LEDs 216 and is used to control the LEDs. The power supply 224 provides power to the LEDs 216 and circuitry 222. As will be described later in greater detail with respect to two embodiments of the panel 200, data and/or power may be received for only the panel 200 or may be passed on to one or more other panels as well. Accordingly, the circuitry 222 and/or power supply 224 may be configured to pass data and/or power to other panels in some embodiments.

In the present example, the housing 220 is sealed to prevent water from entering the housing. For example, the housing 220 may be sealed to have an ingress protection (IP) rating such as IP 67, which defines a level of protection against both solid particles and liquid. This ensures that the panel 200 can be mounted in inclement weather situations without being adversely affected. In such embodiments, the cooling is passive as there are no vent openings for air intakes or exhausts. In other embodiments, the housing may be sealed to have an IP rating of IP 65 or higher, e.g. IP 65, IP 66, IP 67, or IP 68.

Referring specifically to FIG. 2C, one embodiment of the panel 200 illustrates how the power supply 224 may be thermally coupled to the housing 220 via a thermally conductive material 226 (e.g., aluminum). This configuration may be particularly relevant in embodiments where the panel 200 is sealed and cooling is passive.

Referring to FIGS. 3A-3I, one embodiment of a housing 300 is illustrated that may be used with one of the LED panels 104a-104t of FIGS. 1A and 1B. For example, the housing 300 may be a more specific example of the housing 220 of FIG. 2B. In FIGS. 3B-3I, the housing 300 is shown with an alignment plate, which may be separate from the housing 300 or formed as part of the housing 300. In the present example, the housing 300 may be made of a thermally conductive material (e.g., aluminum) that is relatively light weight and rigid. In other embodiments, the housing 300 could be made out of industrial plastic, which is even lighter than aluminum.

Figure 3A:
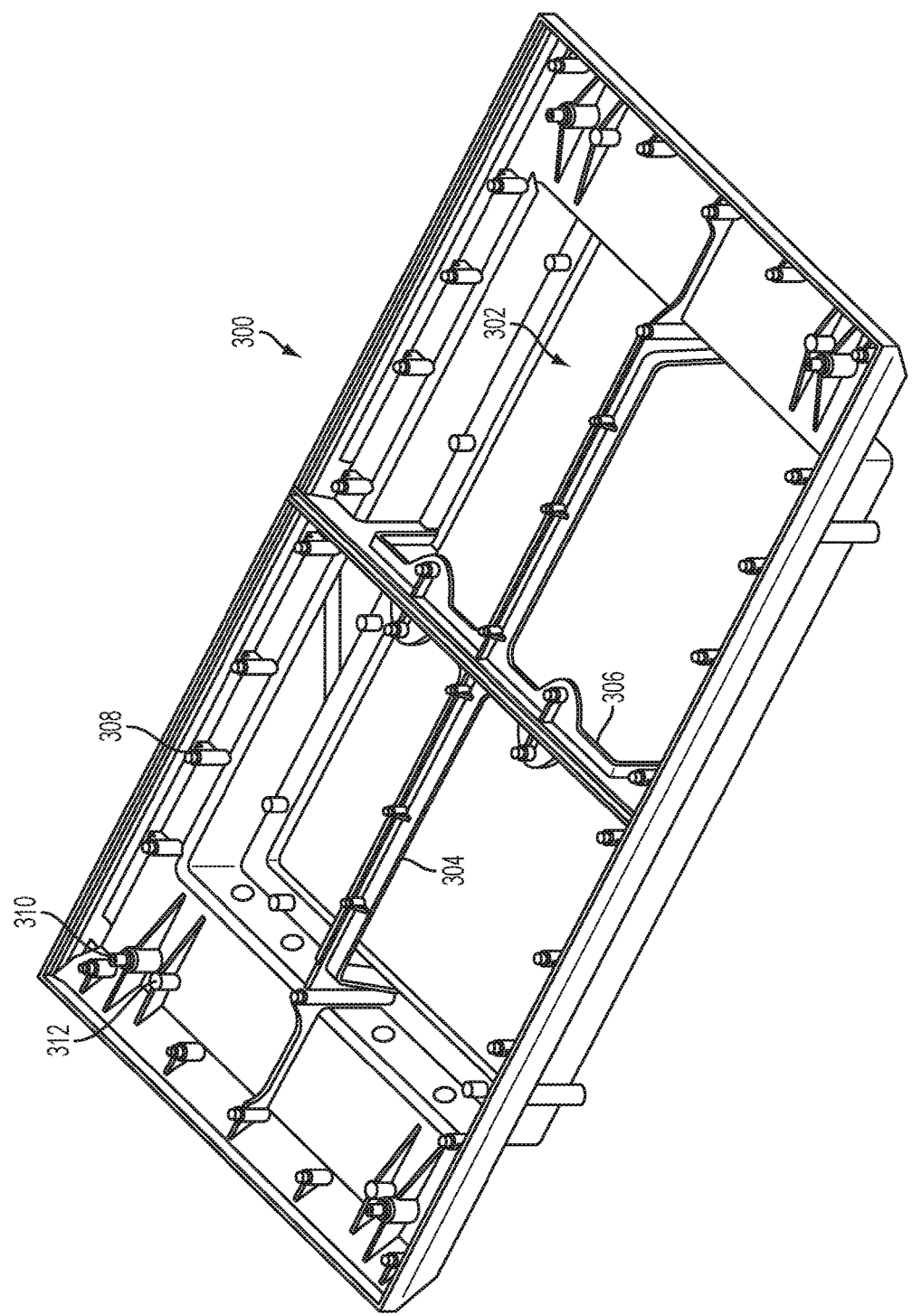

As shown in the orthogonal view of FIG. 3A, the housing 300 defines a cavity 302. Structural cross-members 304 and 306 may be used to provide support to a substrate (e.g., the substrate 202 of FIG. 2A) (not shown). The cross-members 304 and 306, as well as other areas of the housing 300, may include supports 308 against which the substrate can rest when placed into position. As shown, the supports 308 may include a relatively narrow tip section that can be inserted into a receiving hole in the back of the substrate and then a wider section against which the substrate can rest.

The housing 300 may also include multiple extensions 310 (e.g., sleeves) that provide screw holes or locations for captive screws that can be used to couple the substrate to the housing 300. Other extensions 312 may be configured to receive pins or other protrusions from a locking plate and/or fasteners, which will be described later in greater detail. Some or all of the extensions 312 may be accessible only from the rear side of the housing 300 and so are not shown as openings in FIG. 3A.

As shown in FIG. 3B, an alignment plate 314 may be used with the housing 300. The alignment plate is optional. The alignment plate 314, when used, aids in aligning multiple panels on the frame 106 to ensure that the resulting display surface has correctly aligned pixels both horizontally and vertically. To accomplish this, the alignment plate 314 includes tabs 316 and slots 318 (FIG. 3F). Each tab 316 fits into the slot 318 of an adjoining alignment plate (if present) and each slot 318 receives a tab from an adjoining alignment plate (if present). This provides an interlocking series of alignment plates. As each alignment plate 314 is coupled to or part of a housing 300, this results in correctly aligning the panels on the frame 106.

It is understood that, in some embodiments, the alignment plate 314 may be formed as part of the panel or the alignment functionality provided by the alignment plate 314 may be achieved in other ways. In still other embodiments, a single alignment panel 314 may be formed to receive multiple panels, rather than a single panel as shown in FIG. 3B.

In other embodiments, the alignment functionality is eliminated. The design choice of whether to use alignment mechanisms (e.g., slots and grooves) is based upon a tradeoff between the additional alignment capability and the ease of assembly.

Figure 3C:
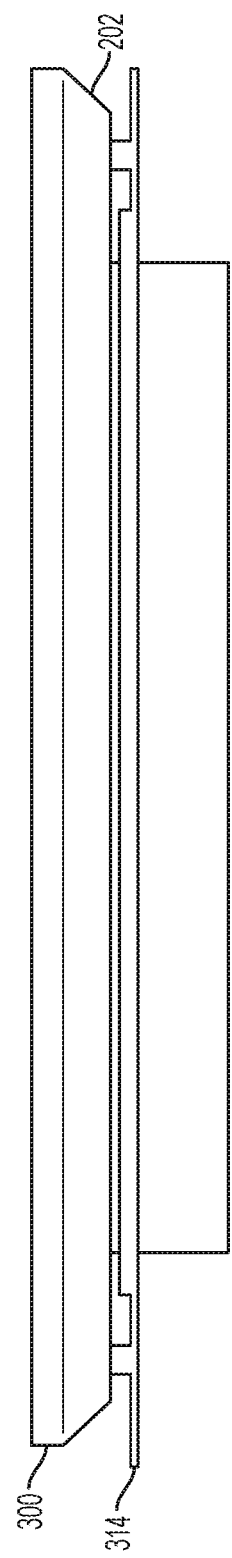
Figure 3D:
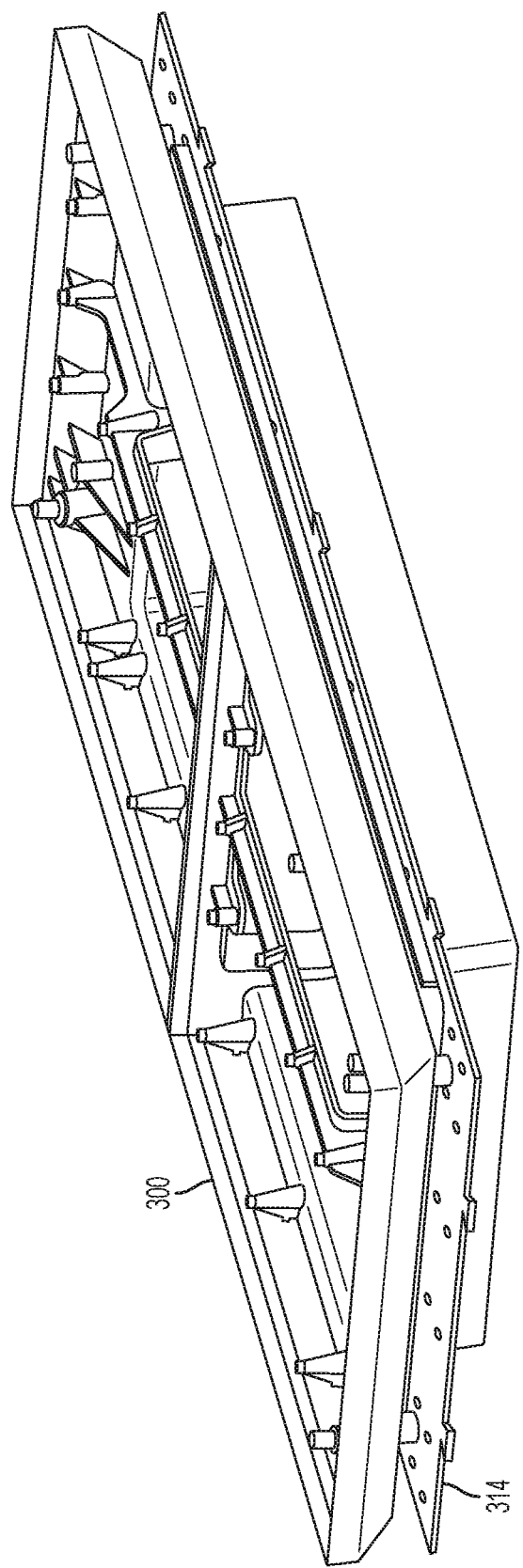
Figure 3E:
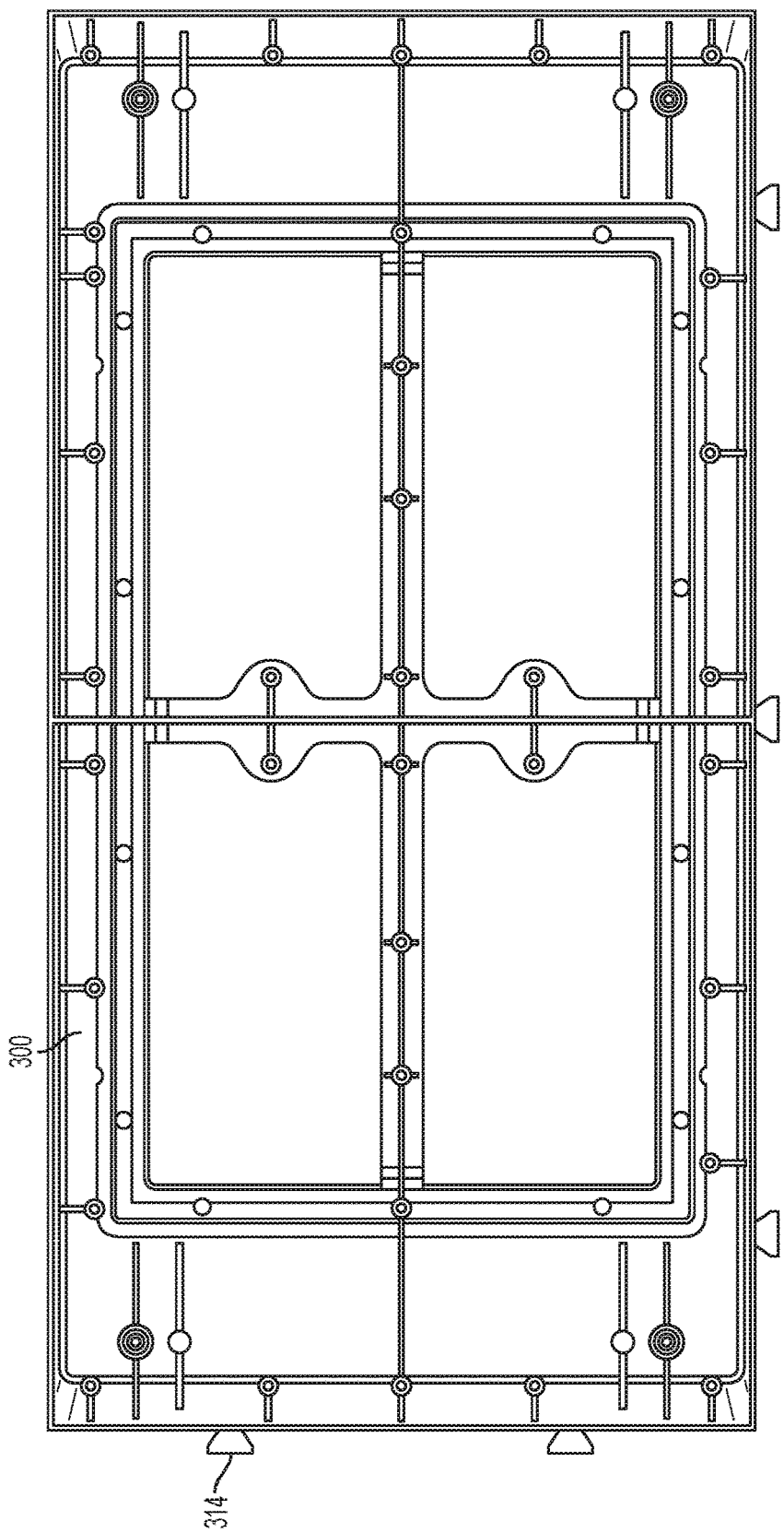
Figure 3F:
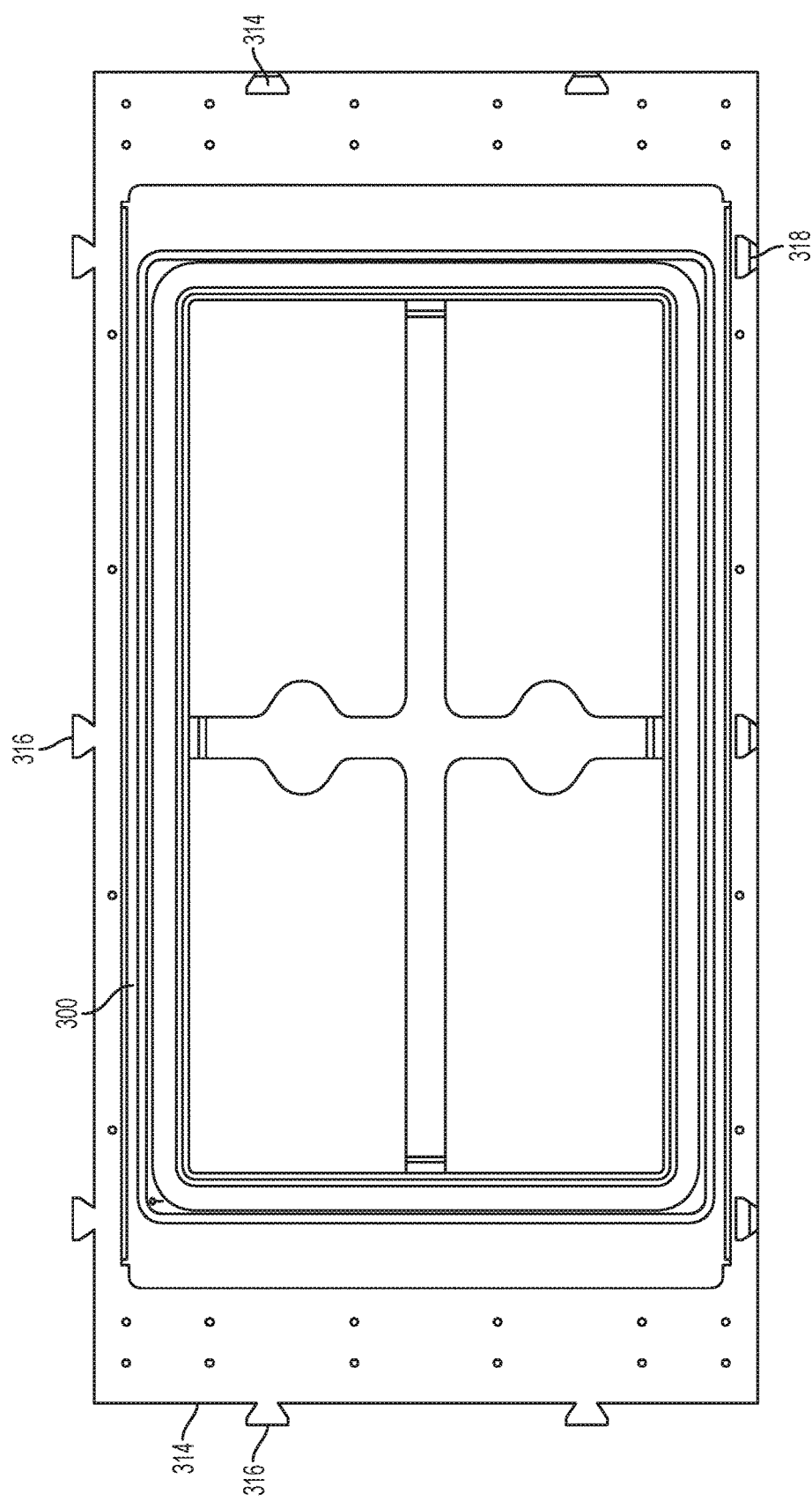

As shown in FIG. 3C, the housing 300 may include beveled or otherwise non-squared edges 320. This shaping of the edges enables panels to be positioned in a curved display without having large gaps appear as would occur if the edges were squared.

Figure 4A:
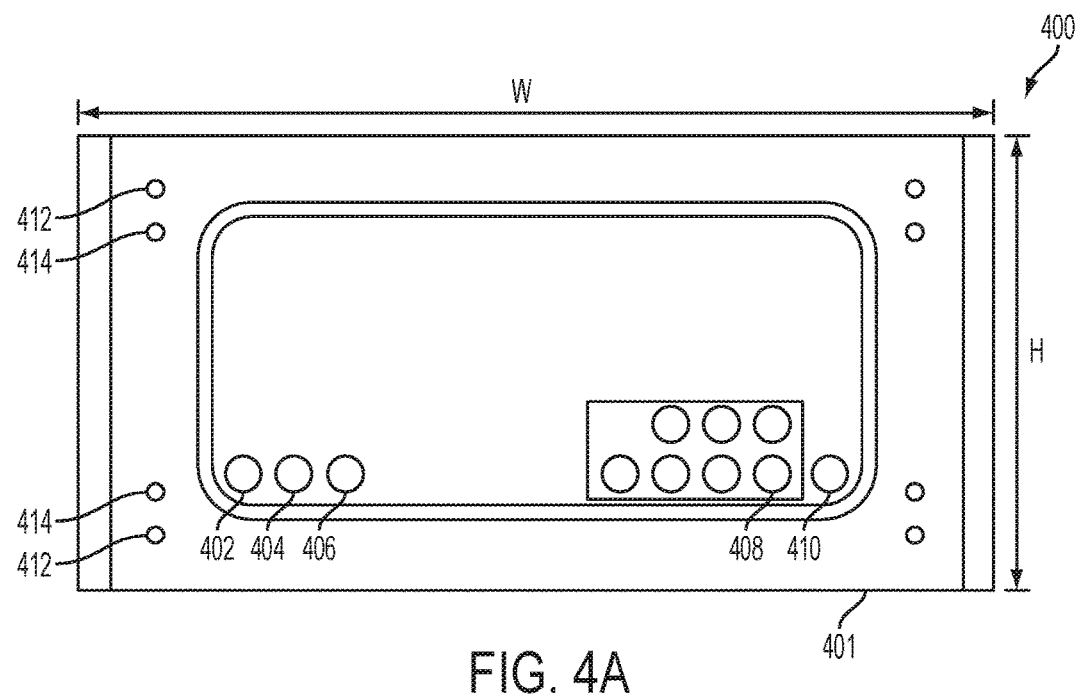
FIGS. 4A and 4B illustrate a more detailed embodiment of the panel of FIG. 2A.
Figure 4B:
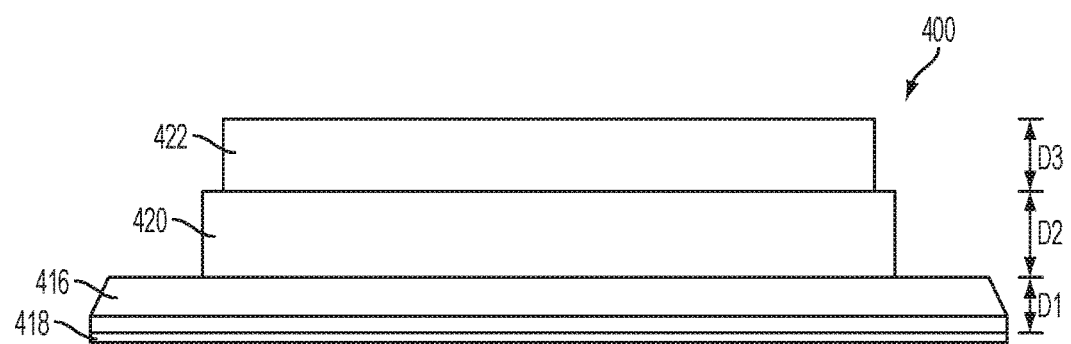

Referring to FIGS. 4A and 4B, one embodiment of a panel 400 is illustrated that may be similar or identical to one of the LED panels 104a-104t of FIGS. 1A and 1B. The panel 400 may be based on a housing 401 that is similar or identical to the housing 300 of FIG. 3A. FIG. 4A illustrates a back view of the panel 400 and FIG. 4B illustrates a top view. The panel 400 has a width W and a height H.

In the present example, the back includes a number of connection points that include a "power in" point 402, a "data in" point 404, a main "data out" point 406, multiple slave data points 408, and a "power out" point 410. As will be discussed below, one embodiment of the invention provides for an integrated data and power cable, which reduces the number of ports. The power in point 402 enables the panel 400 to receive power from a power source, which may be another panel. The data in point 404 enables the panel to receive data from a data source, which may be another panel. The main data out point 406 enables the panel 400 to send data to another main panel. The multiple slave data points 408, which are bi-directional in this example, enable the panel 400 to send data to one or more slave panels and to receive data from those slave panels. In some embodiments, the main data out point 406 and the slave data out points 408 may be combined. The power out point 410 enables the panel 400 to send power to another panel.

The connection points may be provided in various ways. For example, in one embodiment, the connection points may be jacks configured to receive corresponding plugs. In another embodiment, a cable may extend from the back panel with a connector (e.g., a jack or plug) affixed to the external end of the cable to provide an interface for another connector. It is understood that the connection points may be positioned and organized in many different ways.

Inside the panel, the power in point 402 and power out point 410 may be coupled to circuitry (not shown) as well as to a power supply. For example, the power in point 402 and power out point 410 may be coupled to the circuitry 222 of FIG. 2B, as well as to the power supply 224. In such embodiments, the circuitry 222 may aid in regulating the reception and transmission of power. In other embodiments, the power in point 402 and power out point 410 may by coupled only to the power supply 224 with a pass through power connection allowing some of the received power to be passed from the power in point 402 to the power out point 410.

The data in point 404, main data out point 406, and slave data out points 408 may be coupled to the circuitry 222. The circuitry 222 may aid in regulating the reception and transmission of the data. In some embodiments, the circuitry 222 may identify data used for the panel 400 and also send all data on to other coupled main and slave panels via the main data out point 406 and slave data out points 408, respectively. In such embodiments, the other main and slave panels would then identify the information relevant to that particular panel from the data. In other embodiments, the circuitry 222 may remove the data needed for the panel 400 and selectively send data on to other coupled main and slave panels via the main data out point 406 and slave data out points 408, respectively. For example, the circuitry 222 may send only data corresponding to a particular slave panel to that slave panel rather than sending all data and letting the slave panel identify the corresponding data.

The back panel also has coupling points 412 and 414. In the example where the housing is supplied by the housing 300 of FIG. 3A, the coupling points 412 and 414 may correspond to extensions 310 and 312, respectively.

Referring specifically to FIG. 4B, a top view of the panel 400 illustrates three sections of the housing 401. The first section 416 includes the LEDs (not shown) and louvers 418. The second section 420 and third section 422 may be used to house the circuitry 222 and power supply 224. In the present example, the third section 422 is an extended section that may exist on main panels, but not slave panels, due to extra components needed by a main panel to distribute data. Depths D1, D2, and D3 correspond to sections 416, 420, and 422, respectively.

Figure 5:
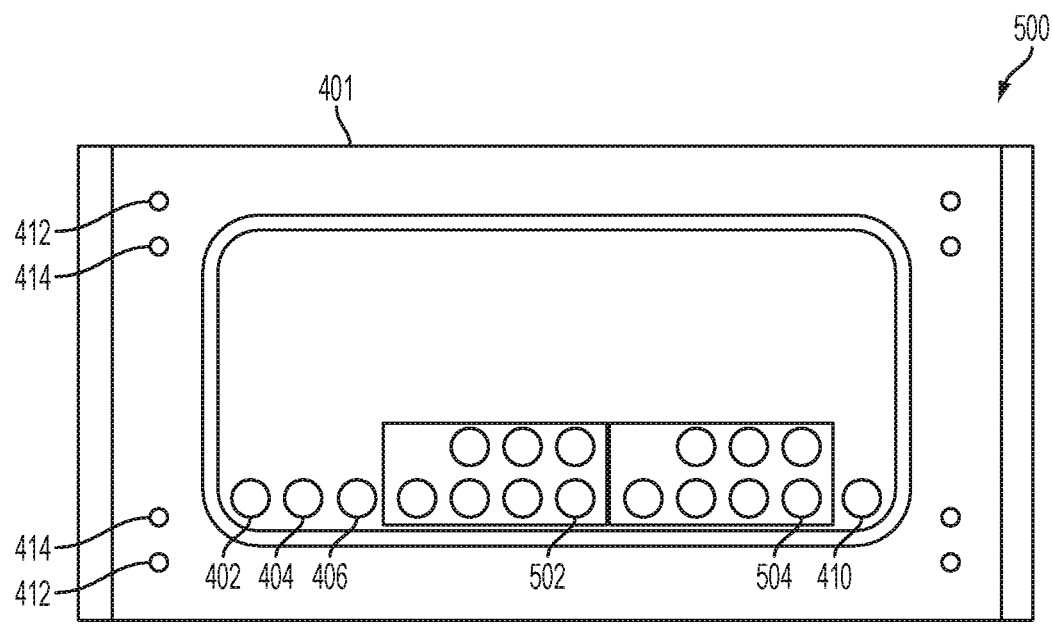
FIG. 5 illustrates an alternative embodiment of the panel of FIG. 4A.

Referring to FIG. 5, one embodiment of a panel 500 is illustrated that may be similar or identical to the panel 400 of FIG. 4A with the exception of a change in the slave data points 408. In the embodiment of FIG. 4A, the slave data points 408 are bi-directional connection points. In the present embodiment, separate slave "data in" points 502 and slave "data out" points 504 are provided. In other embodiments, the data points can be directional connection points.

Figure 6A:
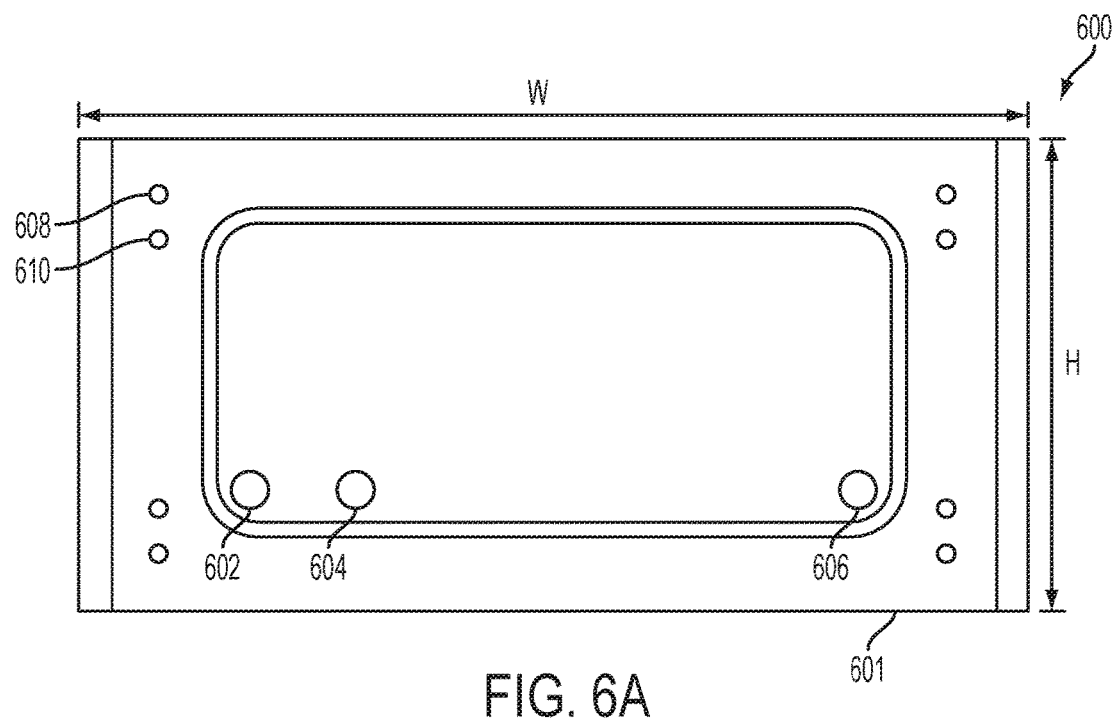
FIGS. 6A and 6B illustrate a more detailed embodiment of the panel of FIG. 2A.
Figure 6B:
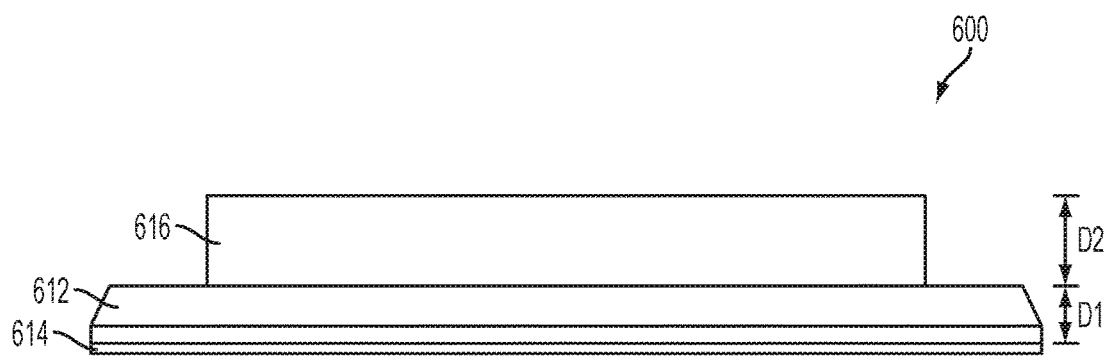

Referring to FIGS. 6A and 6B, one embodiment of a panel 600 is illustrated that may be similar or identical to the panel 400 of FIG. 4A except that the panel 600 is a slave panel. FIG. 6A illustrates a back view of the panel 600 and FIG. 6B illustrates a top view. The panel 600 has a width W and a height H. In the present embodiment, these are identical to the width W and height H of the panel 400 of FIG. 4A. In one example, the width W can be between 1 and 4 feet and the height H can be between 0.5 and 4 feet, for example 1 foot by 2 feet. Of course, the invention is not limited to these specific dimensions.

In contrast to the main panel of FIG. 4A, the back of the slave panel 600 has a more limited number of connection points that include a "power in" point 602, a data point 604, and a "power out" point 606. The power in point 602 enables the panel 600 to receive power from a power source, which may be another panel. The data point 604 enables the panel to receive data from a data source, which may be another panel. The power out point 606 enables the panel 600 to send power to another main panel. In the present example, the data point 604 is bi-directional, which corresponds to the main panel configuration illustrated in FIG. 4A. The back panel also has coupling points 608 and 610, which correspond to coupling points 412 and 414, respectively, of FIG. 4A. As discussed above, other embodiments use directional data connections.

Referring specifically to FIG. 6B, a top view of the panel 600 illustrates two sections of the housing 601. The first section 612 includes the LEDs (not shown) and louvers 614. The second section 616 may be used to house the circuitry 222 and power supply 224. In the present example, the extended section provided by the third section 422 of FIG. 4A is not needed as the panel 600 does not pass data on to other panels. Depths D1 and D2 correspond to sections 612 and 616, respectively. In the present embodiment, depths D1 and D2 are identical to depths D1 and D2 of the panel 400 of FIG. 4B. In one example, the depth D1 can be between 1 and 4 inches and the depths D2 can be between 1 and 4 inches.

It is noted that the similarity in size of the panels 400 of FIG. 4A and the panel 600 of FIG. 6A enables the panels to be interchanged as needed. More specifically, as main panels and slave panels have an identical footprint in terms of height H, width W, and depth D1, their position on the frame 106 of FIGS. 1A and 1B does not matter from a size standpoint, but only from a functionality standpoint. Accordingly, the display 100 can be designed as desired using main panels and slave panels without the need to be concerned with how a particular panel will physically fit into a position on the frame. The design may then focus on issues such as the required functionality (e.g., whether a main panel is needed or a slave panel is sufficient) for a particular position and/or other issues such as weight and cost.

In some embodiments, the main panel 400 of FIG. 4A may weigh more than the slave panel 600 due to the additional components present in the main panel 400. The additional components may also make the main panel 400 more expensive to produce than the slave panel 600. Therefore, a display that uses as many slave panels as possible while still meeting required criteria will generally cost less and weigh less than a display that uses more main panels.

Figure 7:
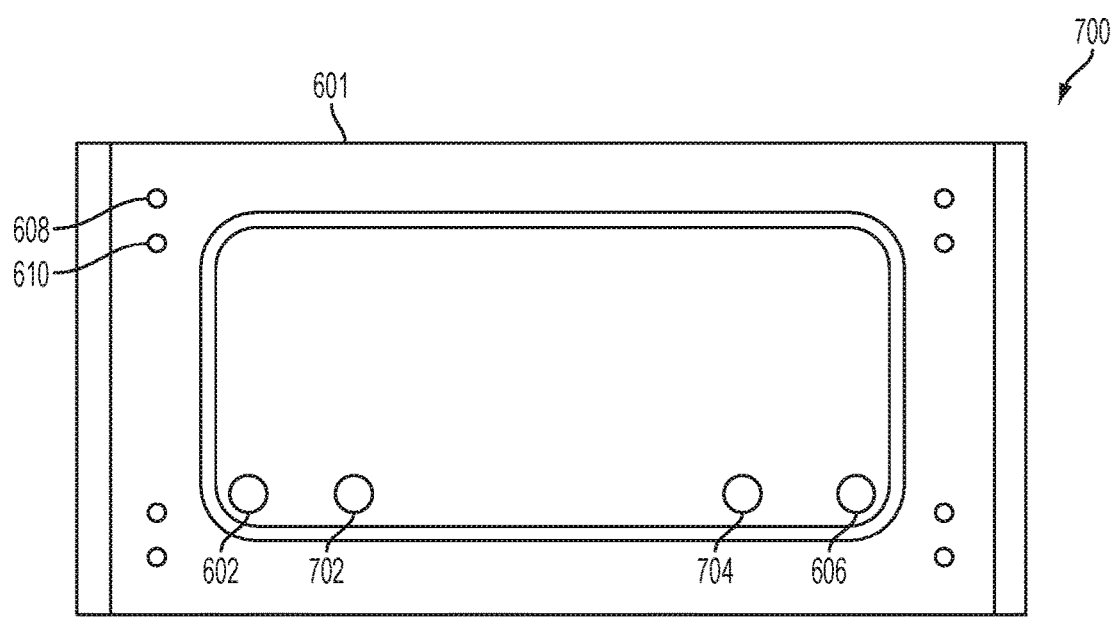
FIG. 7 illustrates an alternative embodiment of the panel of FIG. 6A.

Referring to FIG. 7, one embodiment of a panel 700 is illustrated that may be similar or identical to the panel 600 of FIG. 6A with the exception of a change in the data point 604. In the embodiment of FIG. 6A, the data point 604 is a bi-directional connection. In the present embodiment, a separate "data out" point 702 and a "data in" point 704 are provided, which corresponds to the main panel configuration illustrated in FIG. 5.

Referring to FIGS. 8A-8M, embodiments of a frame 800 are illustrated. For example, the frame 800 may provide a more detailed embodiment of the frame 106 of FIG. 1B. As described previously, LED panels, such as the panels 104a-104t of FIGS. 1A and 1B, may be mounted directly to the frame 800. Accordingly, the frame 800 does not need to be designed to support heavy cabinets, but need only be able to support the panels 104a-104t and associated cabling (e.g., power and data cables), and the frame 800 may be lighter than conventional frames that have to support cabinet based structures. For purposes of example, various references may be made to the panel 200 of FIG. 2A, the housing 300 of FIG. 3A, and the panel 400 of FIG. 4A.

In the present example, the frame 800 is designed to support LED panels 802 in a configuration that is ten panels high and thirty-two panels wide. While the size of the panels 802 may vary, in the current embodiment this provides a display surface that is approximately fifty feet and four inches wide (50'4") and fifteen feet and eight and three-quarters inches high (15'8.75").

It is understood that all measurements and materials described with respect to FIGS. 8A-8M are for purposes of example only and are not intended to be limiting. Accordingly, many different lengths, heights, thicknesses, and other dimensional and/or material changes may be made to the embodiments of FIGS. 8A-8M.

Referring specifically to FIG. 8B, a back view of the frame 800 is illustrated. The frame 800 includes a top bar 804, a bottom bar 806, a left bar 808, a right bar 810, and multiple vertical bars 812 that connect the top bar 804 and bottom bar 806. In some embodiments, additional horizontal bars 814 may be present.

The frame 800 may be constructed of various materials, including metals. For example, the top bar 804, the bottom bar 806, the left bar 808, and the right bar 810 (e.g., the perimeter bars) may be made using a four inch aluminum association standard channel capable of bearing 1.738 lb/ft. The vertical bars 812 may be made using 2"×4"×½" aluminum tube capable of bearing a load of 3.23 lb/ft. it is understood that other embodiments will utilize other size components.

It is understood that these sizes and load bearing capacities are for purposes of illustration and are not intended to be limiting. However, conventional steel display frames needed to support conventional cabinet-based displays are typically much heavier than the frame 800, which would likely not be strong enough to support a traditional cabinet-based display. For example, the frame 800 combined with the panels described herein may weigh at least fifty percent less than equivalent steel cabinet-based displays.

Referring to FIG. 8C, a cutaway view of the frame 800 of FIG. 8B taken along lines A1-A1 is illustrated. The horizontal bars 810 are more clearly visible. More detailed views of FIG. 8C are described below.

Figure 8F:
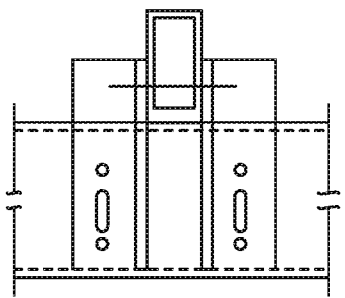
Figure 8E:
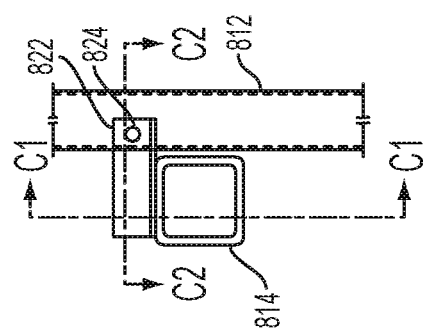
Figure 8D:
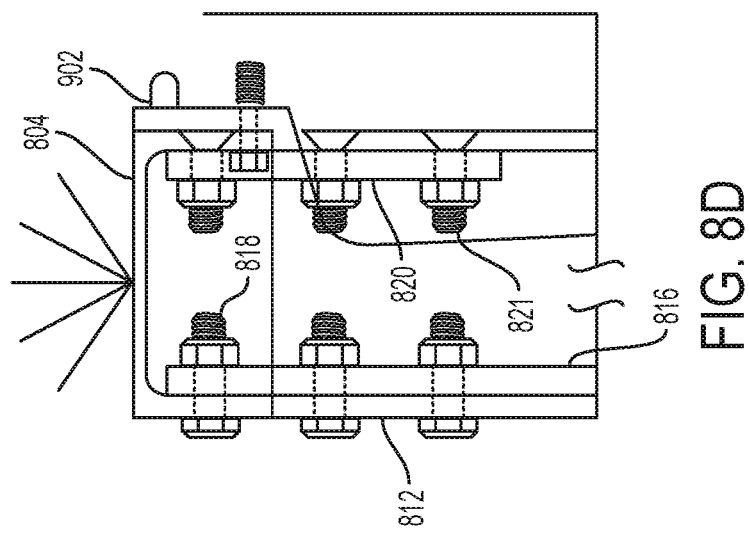

Referring to FIG. 8D, a more detailed view of the frame 800 of FIG. 8C at location B1 is illustrated. The cutaway view shows the top bar 804 and a vertical bar 812. A first flat bar 816 may be used with multiple fasteners 818 to couple the top bar 804 to the vertical bar 812 at the back of the frame 800. A second flat bar 820 may be used with fasteners 821 to couple the top bar 804 to the vertical bar 812 at the front of the frame 800. A front plate 902 belonging to a coupling mechanism 900 (described below with respect to FIG. 9A) is illustrated. The second flat bar 820 may replace a back plate of the coupling mechanism 900. In embodiments where the second flat bar 820 replaces the back plate, the second flat bar 820 may include one or more holes to provide accessibility to fasteners of the coupling mechanism 900.

Figure 8I:
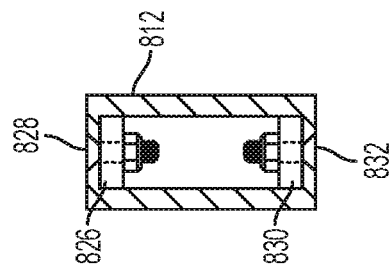
Figure 8H:
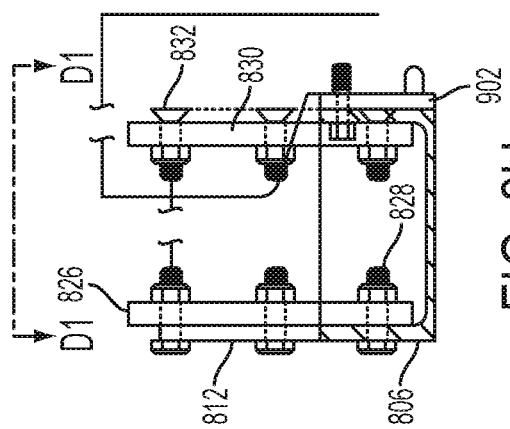
Figure 8G:
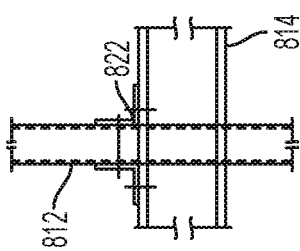

Referring to FIGS. 8E-8G, various more detailed views of the frame 800 of FIG. 8C are illustrated. FIG. 8E provides a more detailed view of the frame 800 of FIG. 8C at location B2. FIG. 8F provides a cutaway view of the frame 800 of FIG. 8E taken along lines C1-C1. FIG. 8G provides a cutaway view of the frame 800 of FIG. 8E taken along lines C2-C2.

A clip 822 may be coupled to a vertical bar 812 via one or more fasteners 824 and to the horizontal bar 814 via one or more fasteners 824. In the present example, the clip 822 is positioned above the horizontal bar 814, but it is understood that the clip 822 may be positioned below the horizontal bar 814 in other embodiments. In still other embodiments, the clip 822 may be placed partially inside the horizontal bar 814 (e.g., a portion of the clip 822 may be placed through a slot or other opening in the horizontal bar 814).

Referring to FIGS. 8H and 8I, various more detailed views of the frame 800 of FIG. 8C are illustrated. FIG. 8H provides a more detailed view of the frame 800 of FIG. 8C at location B3. FIG. 8I provides a cutaway view of the frame 800 of FIG. 8H taken along lines D1-D1.

The cutaway view shows the bottom bar 806 and a vertical bar 812. A first flat bar 826 may be used with multiple fasteners 828 to couple the bottom bar 806 to the vertical bar 812 at the back of the frame 800. A second flat bar 830 may be used with fasteners 832 to couple the bottom bar 806 to the vertical bar 812 at the front of the frame 800. A front plate 902 belonging to a coupling mechanism 900 (described below with respect to FIG. 9A) is illustrated. The second flat bar 830 may replace a back plate of the coupling mechanism 900. In embodiments where the second flat bar 830 replaces the back plate, the second flat bar 830 may include one or more holes to provide accessibility to fasteners of the coupling mechanism 900.

Referring to FIGS. 8J and 8K, various more detailed views of the frame 800 of FIG. 8A are illustrated. FIG. 8H provides a more detailed view of the frame 800 of FIG. 8B at location A2. FIG. 8K provides a cutaway view of the frame 800 of FIG. 8J taken along lines E1-E1. The two views show the bottom bar 806 and the left bar 808. A clip 834 may be used with multiple fasteners 836 to couple the bottom bar 806 to the left bar 808 at the corner of the frame 800.

Referring to FIGS. 8L and 8M, an alternative embodiment to FIG. 8E is illustrated. FIG. 8L provides a more detailed view of the frame 800 in the alternate embodiment. FIG. 8M provides a cutaway view of the frame 800 of FIG. 8L taken along lines F1-F1. In this embodiment, rather than using a horizontal bar 814, a vertical bar 812 is coupled directly to a beam 840 using a clip 838.

Figure 9A:
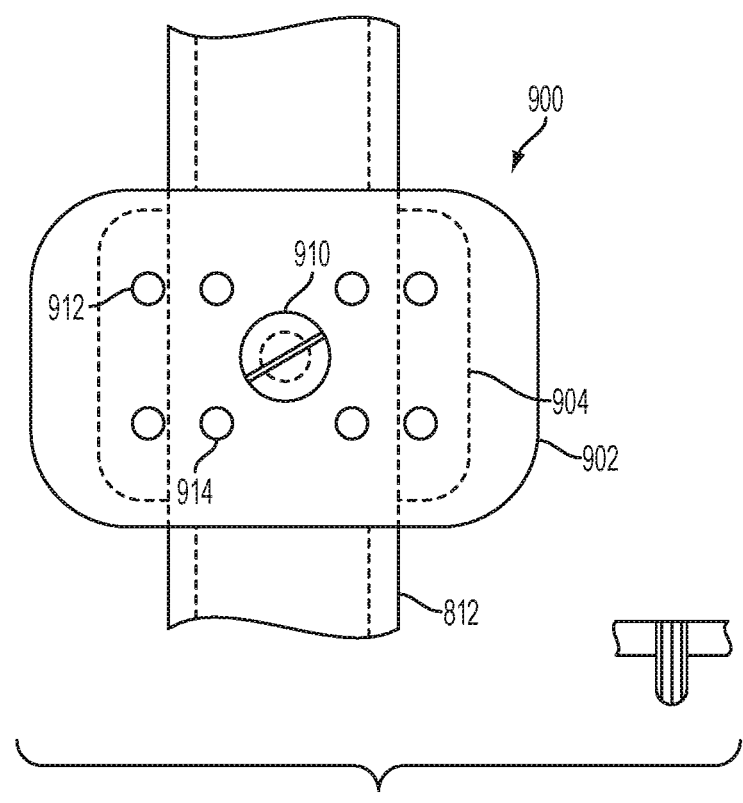
FIGS. 9A-9C illustrate one embodiment of a locking mechanism that may be used with the display of FIGS. 1A and 1B.
Figure 9B:
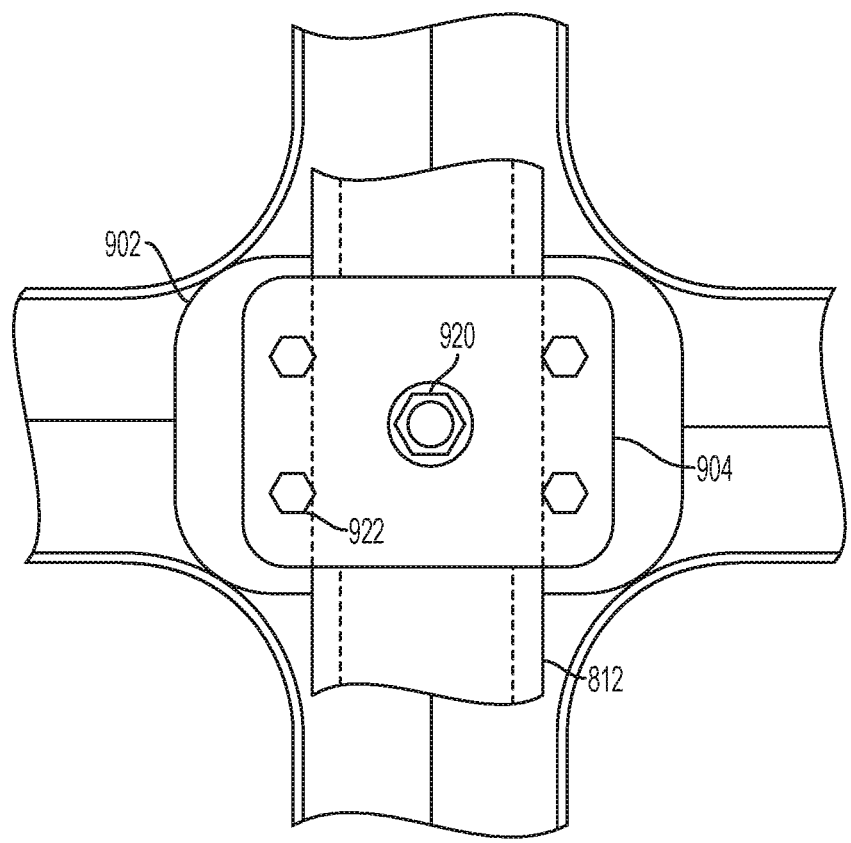
Figure 9C:
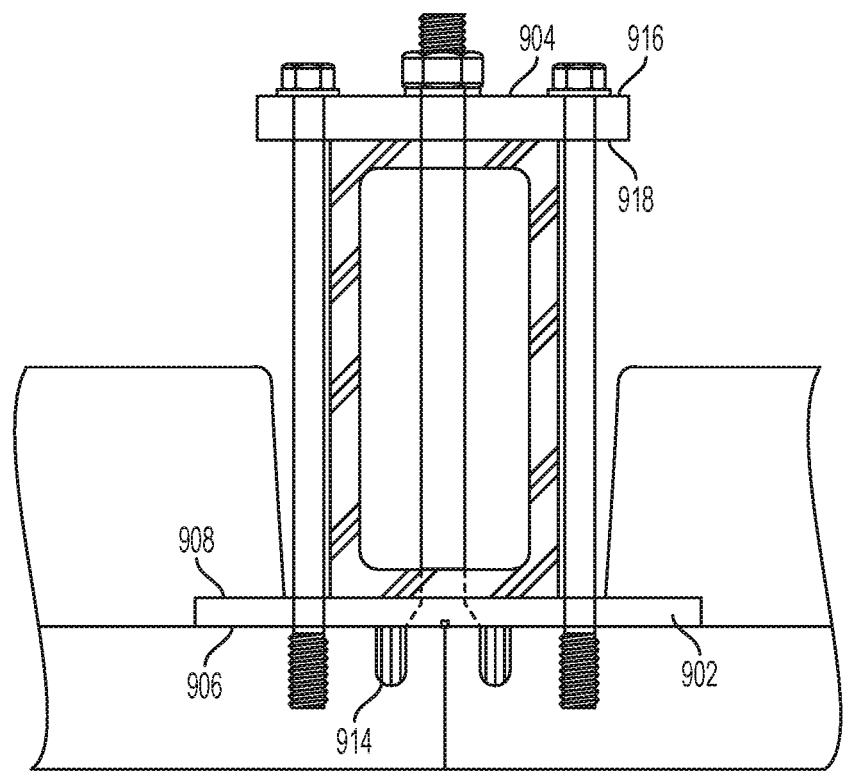

Referring to FIGS. 9A-9C, one embodiment of a coupling mechanism 900 is illustrated that may be used to attach an LED panel (e.g., one of the panels 104a-104t of FIGS. 1A and 1B) to a frame (e.g., the frame 106 or the frame 800 of FIGS. 8A and 8B). For purposes of example, the coupling mechanism 900 is described as attaching the panel 200 of FIG. 2A to the frame 800 of FIG. 8B. In the present example, a single coupling mechanism 900 may attach up to four panels to the frame 800. To accomplish this, the coupling mechanism 900 is positioned where the corners of four panels meet.

The coupling mechanism 900 includes a front plate 902 and a back plate 904. The front plate 902 has an outer surface 906 that faces the back of a panel and an inner surface 908 that faces the frame 106. The front plate 902 may include a center hole 910 and holes 912. The center hole 910 may be countersunk relative to the outer surface 906 to allow a bolt head to sit at or below the outer surface 906. Mounting pins 914 may extend from the outer surface 906. The back plate 904 has an outer surface 916 that faces away from the frame 106 and an inner surface 918 that faces the frame 106. The back plate 904 includes a center hole 920 and holes 922.

In operation, the front plate 902 and back plate 904 are mounted on opposite sides of one of the vertical bars 808, 810, or 812 with the front plate 902 mounted on the panel side of the frame 800 and the back plate 904 mounted on the back side of the frame 800. For purposes of example, a vertical bar 812 will be used. When mounted in this manner, the inner surface 908 of the front plate 902 and the inner surface 918 of the back plate 904 face one another. A fastener (e.g., a bolt) may be placed through the center hole 910 of the front plate 902, through a hole in the vertical bar 812 of the frame 800, and through the center hole 920 of the back plate 904. This secures the front plate 902 and back plate 904 to the frame 800 with the mounting pins 914 extending away from the frame.

Using the housing 300 of FIG. 3A as an example, a panel is aligned on the frame 800 by inserting the appropriate mounting pin 914 into one of the holes in the back of the housing 300 provided by an extension 310/312. It is understood that this occurs at each corner of the panel, so that the panel will be aligned with the frame 800 using four mounting pins 914 that correspond to four different coupling mechanisms 900. It is noted that the pins 914 illustrated in FIG. 9C are horizontally aligned with the holes 912, while the extensions illustrated in FIG. 3A are vertically aligned. As described previously, these are alternate embodiments and it is understood that the holes 912/pins 914 and extensions 310/312 should have a matching orientation and spacing.

Once in position, a fastener is inserted through the hole 922 of the back plate 904, through the corresponding hole 912 of the front plate 902, and into a threaded hole provided by an extension 310/312 in the panel 300. This secures the panel to the frame 800. It is understood that this occurs at each corner of the panel, so that the panel will be secured to the frame 800 using four different coupling mechanisms 900. Accordingly, to attach or remove a panel, only four fasteners need be manipulated. The coupling mechanism 900 can remain in place to support up to three other panels.

In other embodiments, the front plate 902 is not needed. For example, in displays that are lighter in weight the back of the panel can abut directly with the beam. In other embodiments, the center hole 920 and corresponding bolt are not necessary. In other words the entire connection is made by the screws through the plate 904 into the panel.

The embodiment illustrated here shows a connection from the back of the display. In certain applications, access to the back of the panels is not available. For example, the display may be mounted directly on a building without a catwalk or other access. In this case, the holes in the panel can extend all the way through the panel with the bolts being applied through the panel and secured on the back. This is the opposite direction of what is shown in FIG. 9C.

More precise alignment may be provided by using an alignment plate, such as the alignment plate 314 of FIG. 3B, with each panel. For example, while positioning the panel and prior to tightening the coupling mechanism 900, the tabs 316 of the alignment plate 314 for that panel may be inserted into slots 318 in surrounding alignment plates. The coupling mechanism 900 may then be tightened to secure the panel into place.

It is understood that many different configurations may be used for the coupling mechanism 400. For example, the locations of holes and/or pins may be moved, more or fewer holes and/or pins may be provided, and other modifications may be made. It is further understood that many different coupling mechanisms may be used to attach a panel to the frame 106. Such coupling mechanisms may use bolts, screws, latches, clips, and/or any other fastener suitable for removably attaching a panel to the frame 800.

Figure 10A:
Figure 10B:
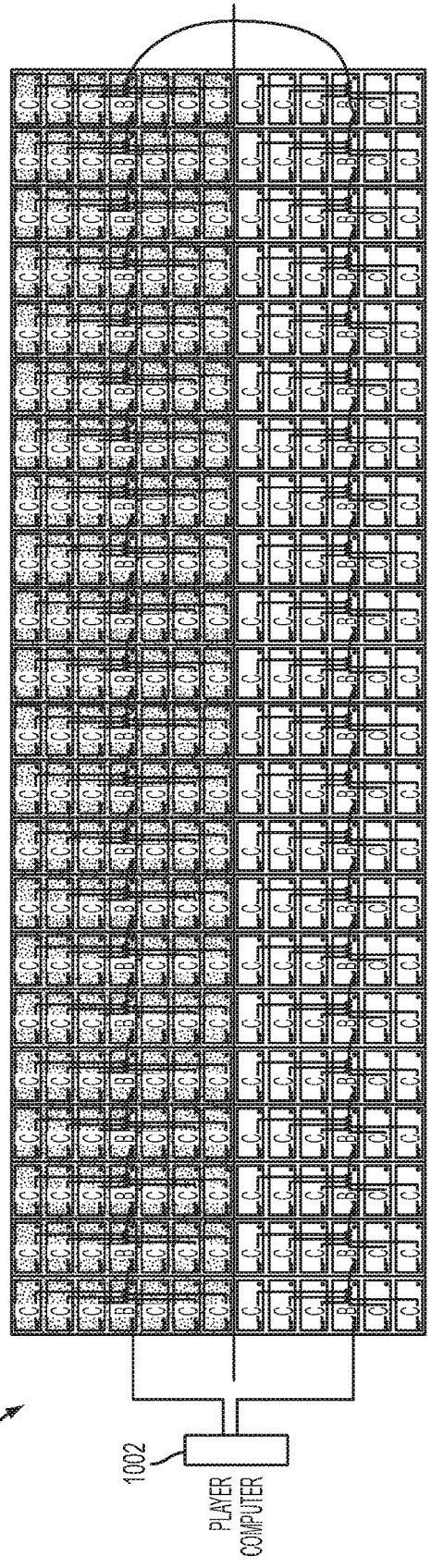
Figure 10D:
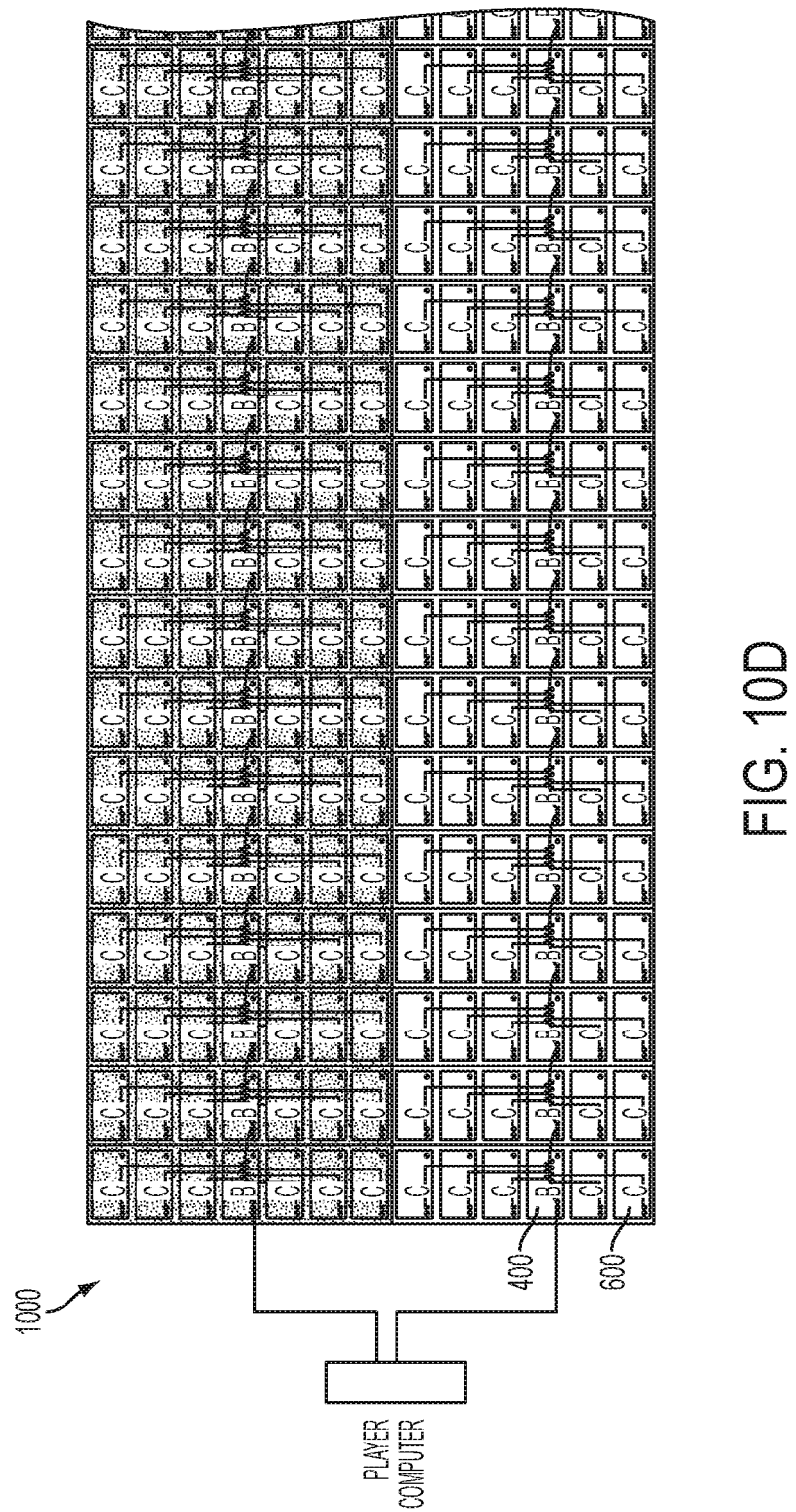

FIG. 10A illustrates the power connections, FIG. 10B illustrates data connections, FIG. 10C illustrates power connections, and FIG. 10D illustrates data connections.

Referring to FIGS. 10A and 10B, one embodiment of a 13×22 panel display 1000 is illustrated that includes two hundred and eighty-six panels arranged in thirteen rows and twenty-two columns. For purposes of example, the display 1000 uses the previously described main panel 400 of FIG. 4A (a 'B' panel) and the slave panel boo of FIG. 6A (a 'C' panel). As described previously, these panels have a bi-directional input/output connection point for data communications between the main panel and the slave panels. The rows are divided into two sections with the top section having seven rows and the bottom section having six rows. The B panels form the fourth row of each section and the remaining rows are C panels. FIGS. 10C and 10D provide enlarged views of a portion of FIGS. 10A and 10B, respectively.

As illustrated in FIG. 10A, power (e.g., 220V single phase) is provided to the top section via seven breakers (e.g., twenty amp breakers), with a breaker assigned to each of the seven rows. Power is provided to the bottom section via six breakers, with a breaker assigned to each of the six rows. In the present example, the power is provided in a serial manner along a row, with power provided to the first column panel via the power source, to the second column panel via the first panel, to the third column panel via the second panel, and so on for the entire row. Accordingly, if a panel is removed or the power for a panel is unplugged, the remainder of the panels in the row will lose power.

As illustrated in FIG. 10B, data is sent from a data source 1002 (e.g., a computer) to the top section via one line and to the bottom section via another line. In some embodiments, as illustrated, the data lines may be connected to provide a loop. In the present example, the data is provided to the B panels that form the fourth row of each section. The B panels in the fourth row feed the data both vertically along the column and in a serial manner along the row. For example, the B panel at row four, column two (r4:c2), sends data to the C panels in rows one, two, three, five, six, and seven of column two (r1-3:c2 and r5-7:c2), as well as to the B panel at row four, column three (r4:c3). Accordingly, if a B panel in row four is removed or the data cables are unplugged, the remainder of the panels in the column fed by that panel will lose their data connection. The next columns will also lose their data connections unless the loop allows data to reach them in the opposite direction.

It is understood that the data lines may be bi-directional. In some embodiments, an input line and an output line may be provided, rather than a single bi-directional line as illustrated in FIGS. 10A and 10B. In such embodiments, the panels may be configured with additional input and/or output connections. An example of this is provided below in FIGS. 11A and 11B.

Figure 11A:
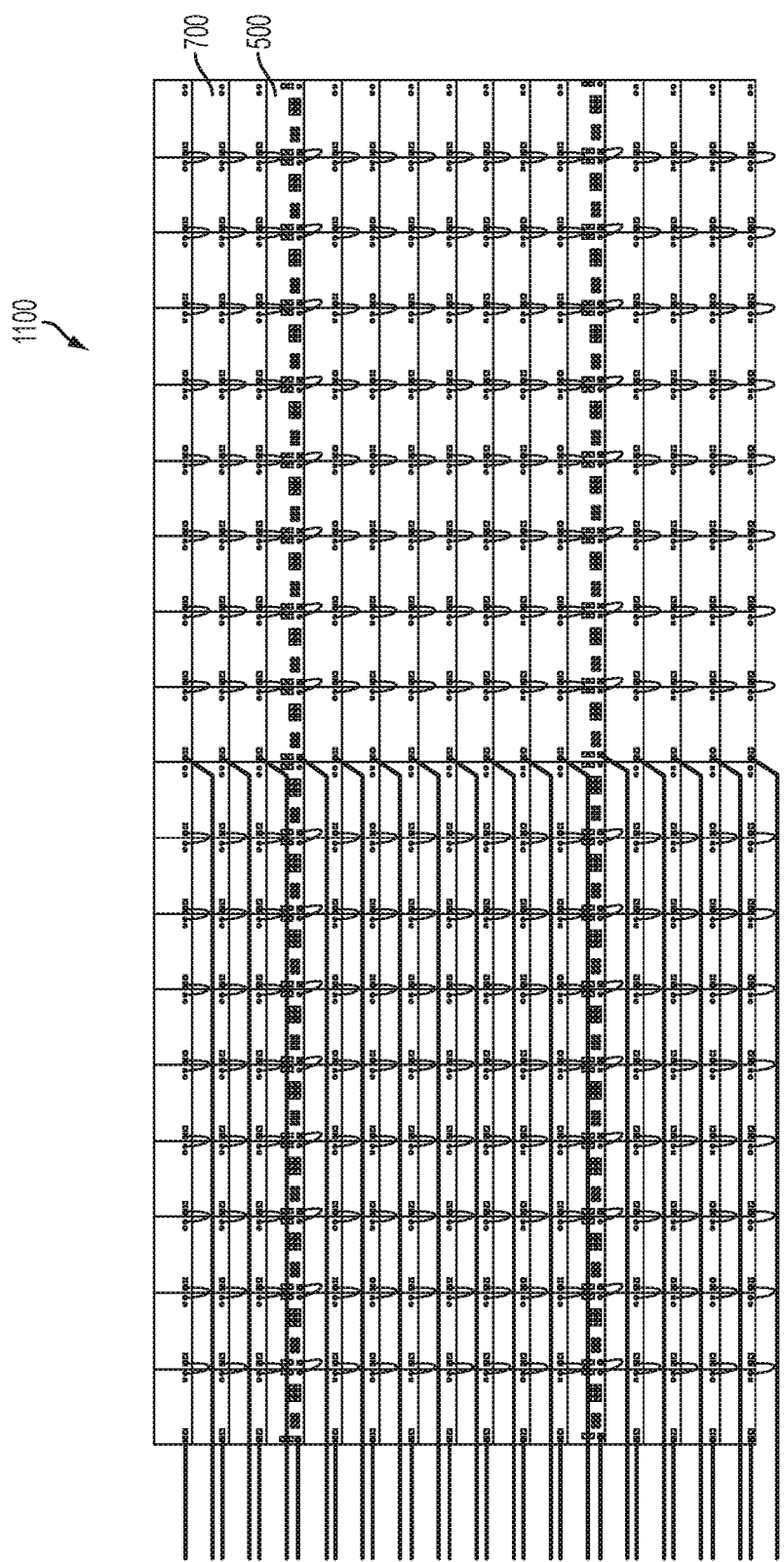
FIGS. 11A-11D illustrate another embodiment of a display configuration.
Figure 11B:
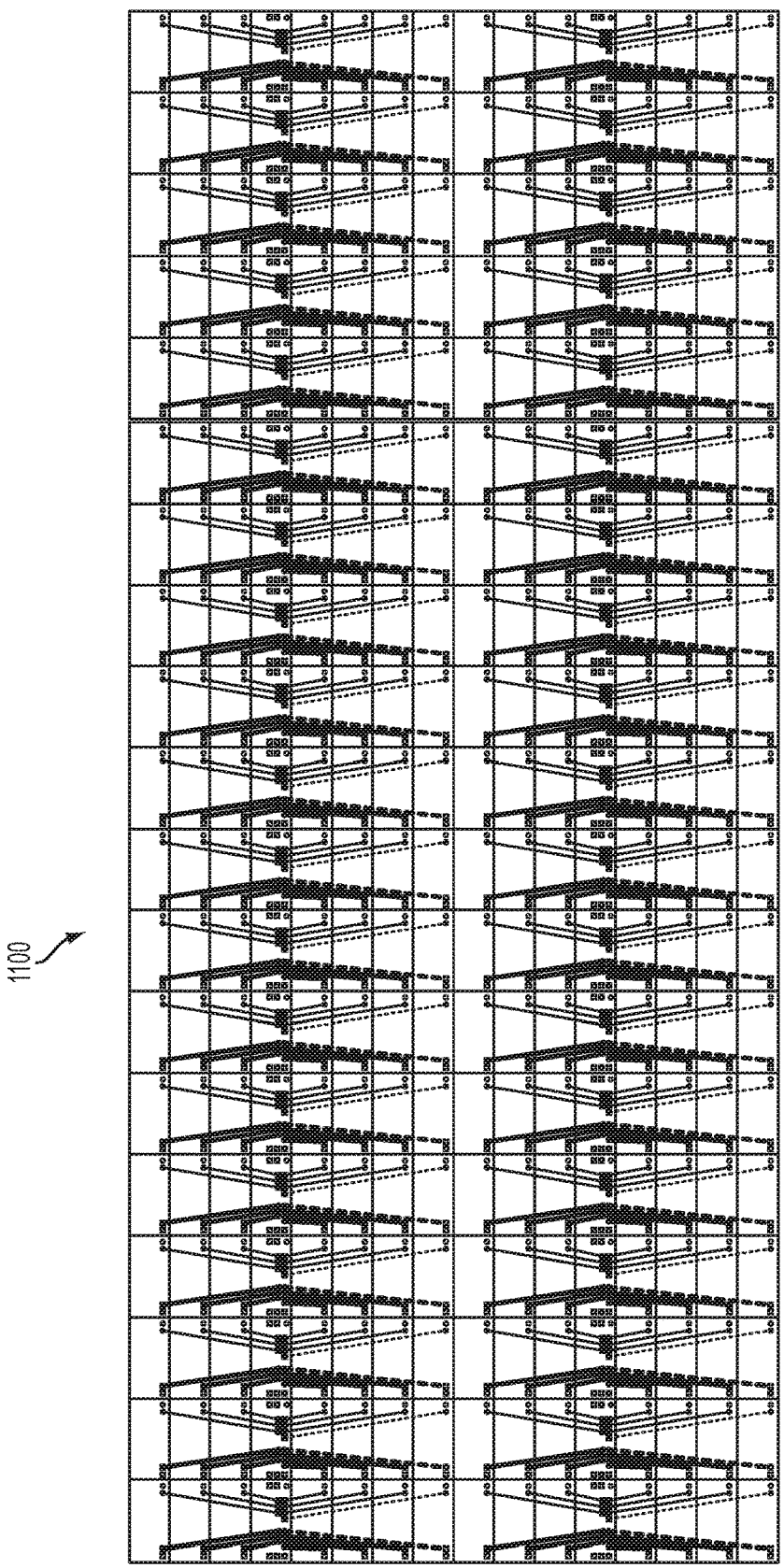
Figure 11C:
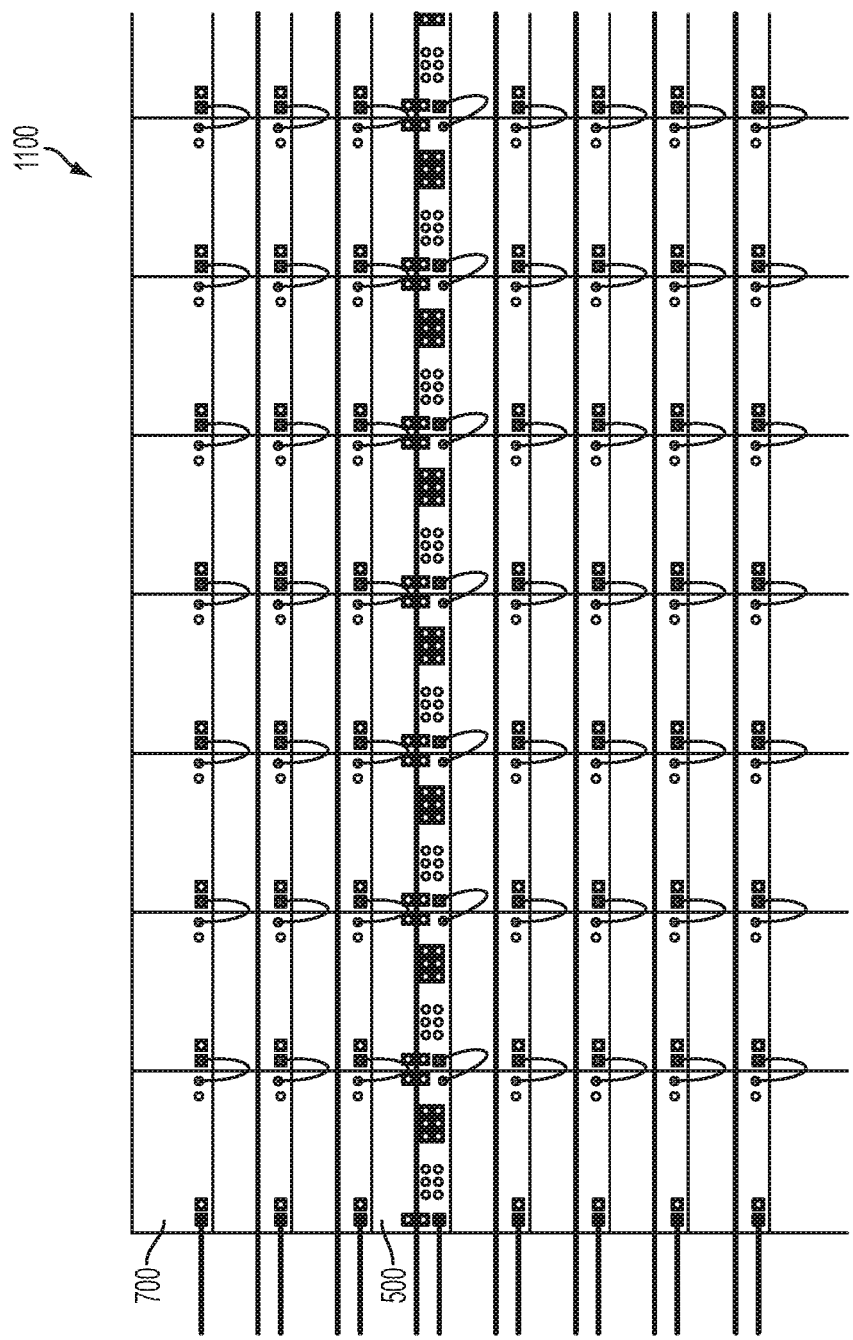
Figure 11D:
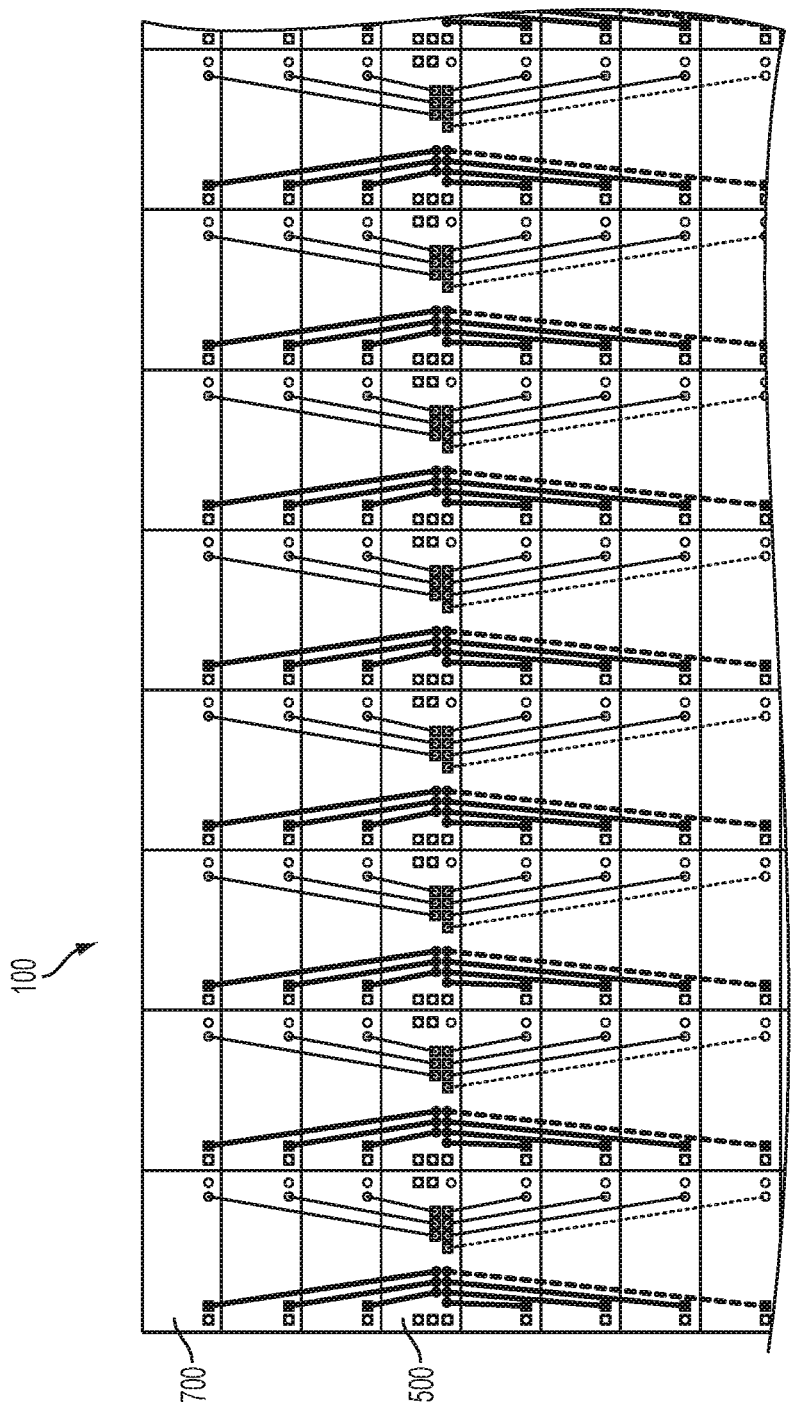

Referring to FIGS. 11A and 11B, one embodiment of a 16×18 panel display 1100 is illustrated that includes two hundred and eighty-eight panels arranged in sixteen rows and eighteen columns. Each power line connects to a single 110V 20 amp breaker. All external power cables are 14 AWG SOW UL while internal power cables must be 14 AWG UL. For purposes of example, the display 1100 uses the previously described main panel 500 of FIG. 5 (a 'B' panel) and the slave panel 700 of FIG. 7 (a 'C' panel). As described previously, these panels have separate input and output connection points for data communications between the main panel and the slave panels. FIGS. 11C and 11D provide enlarged views of a portion of FIGS. 11A and 11B, respectively.

As illustrated in FIG. 11A, power is provided from a power source directly to the first column panel and the tenth column panel of each row via a power line connected to a single 110V, 20A breaker. Those panels then feed the power along the rows in a serial manner. For example, the power is provided to the first column panel via the power source, to the second column panel via the first panel, to the third column panel via the second panel, and so on until the ninth column panel is reached for that row. The ninth column panel does not feed power to another panel because power is provided directly to the tenth column panel via the power source. Power is then provided to the eleventh column panel via the tenth panel, to the twelfth column panel via the eleventh panel, and so on until the end of the row is reached. Accordingly, if a panel is removed or the power for a panel is unplugged, the remainder of the panels in the row that rely on that panel for power will lose power.

Although not shown in FIG. 11B, the panels of the display 1100 may be divided into two sections for data purposes as illustrated previously with respect to FIG. 10B. Accordingly, as illustrated in FIG. 10B, data may be sent from a data source (e.g., a computer) to a top section via one line and to a bottom section via another line. As the present example illustrates the use of separate input and output connection points for data communications between the main panel and the slave panels, data connections between B panels have been omitted for purposes of clarity.

In the present example, the data is provided to the B panels that form the fourth row of each section. The B panels in the fourth row feed the data both vertically along the column and in a serial manner along the row (as shown in FIG. 10B). For example, the B panel at row four, column two (r4:c2), sends data to the C panels in rows one, two, three, five, six, seven, and eight of column two (r1-3:c2 and r5-8:c2), as well as to the B panel at row four, column three (r4:c3). Accordingly, if a B panel in row four is removed or the data cables are unplugged, the remainder of the panels in the column fed by that panel will lose their data connection. The next columns will also lose their data connections unless the loop allows data to reach them in the opposite direction.

Figure 12A:
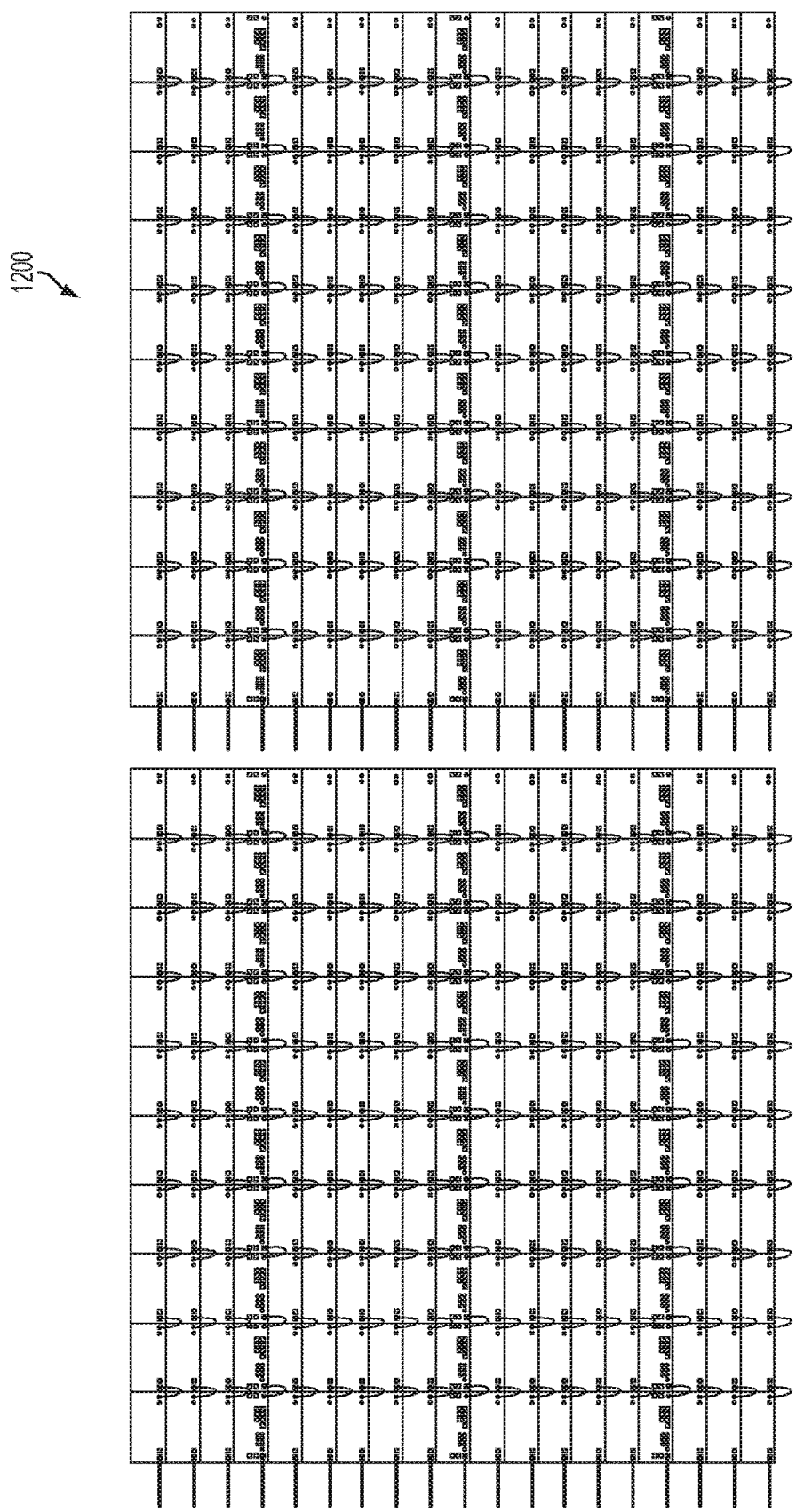
FIGS. 12A-12D illustrate yet another embodiment of a display configuration.
Figure 12B:
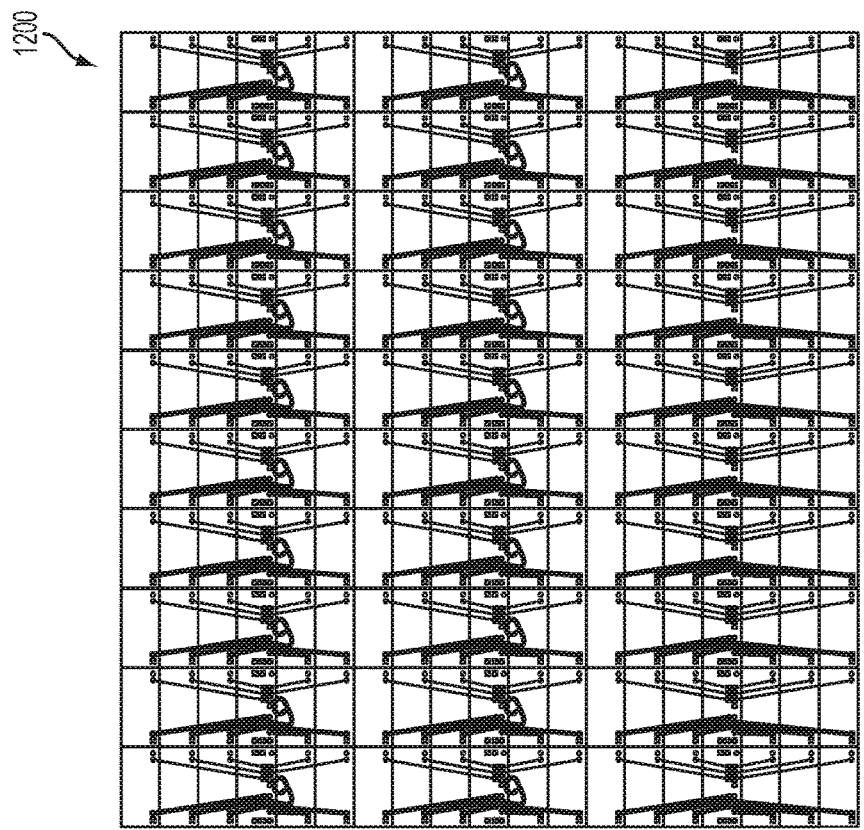
Figure 12B:
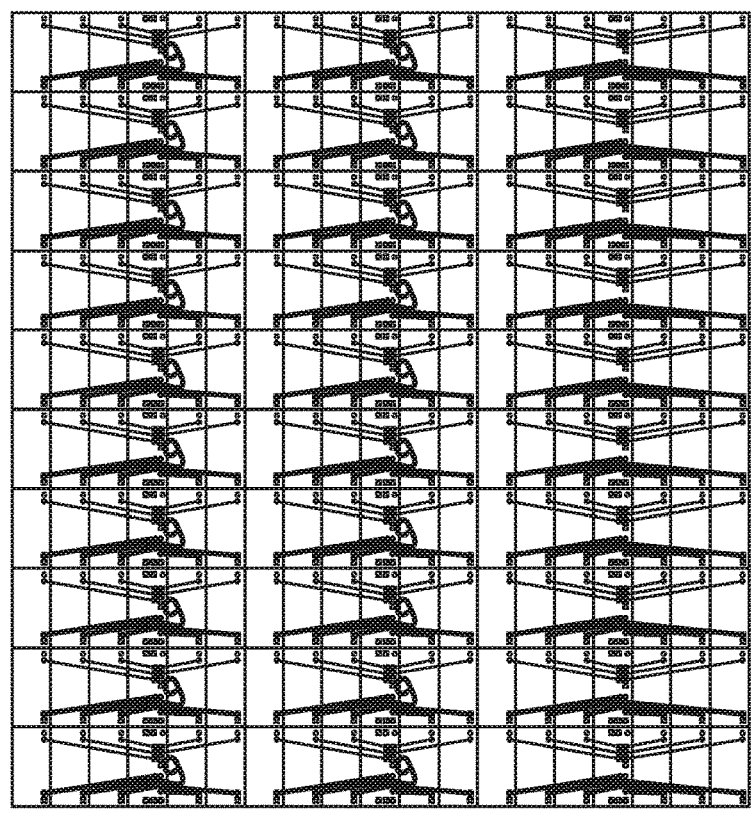
Figure 12C:
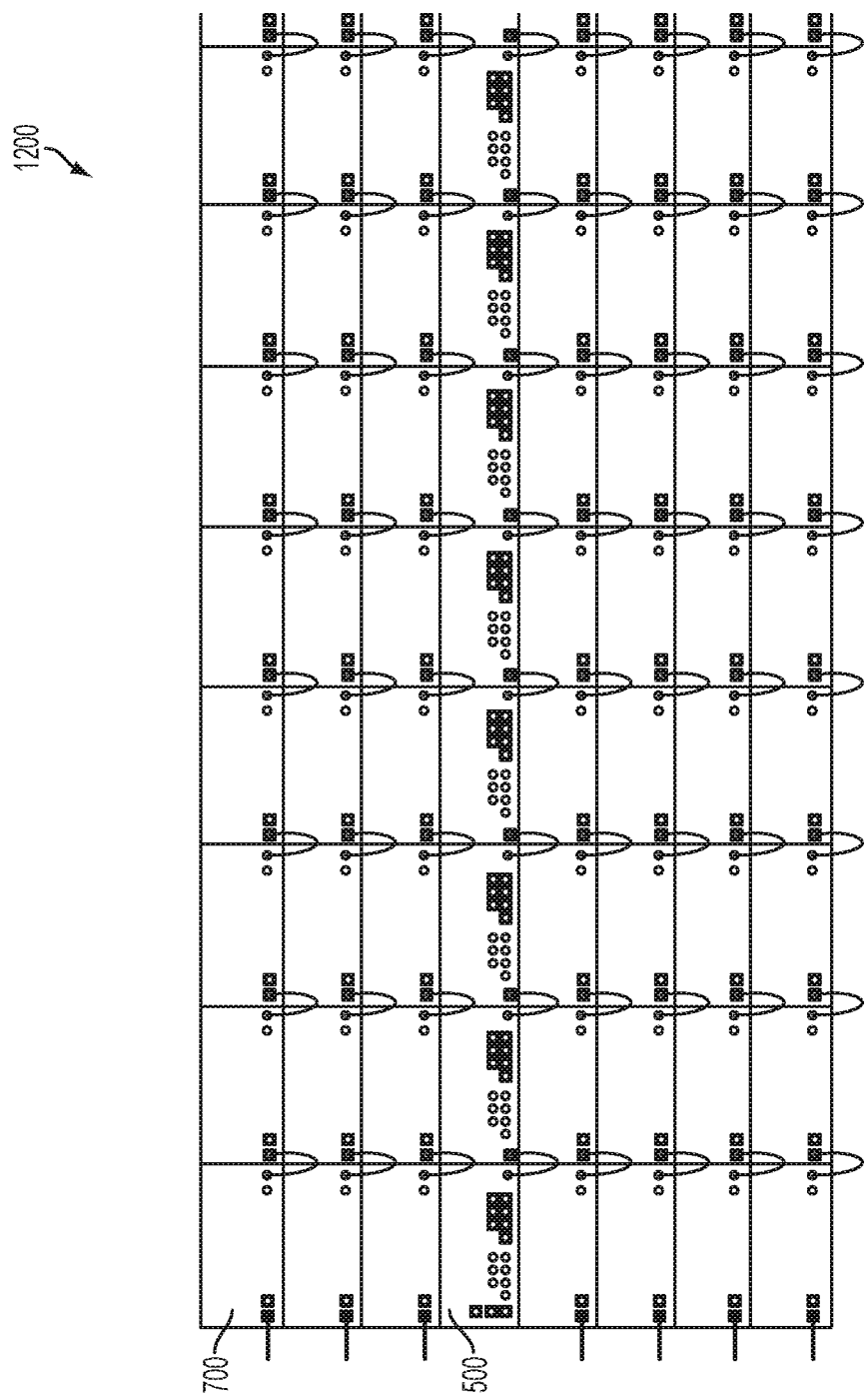
Figure 12D:
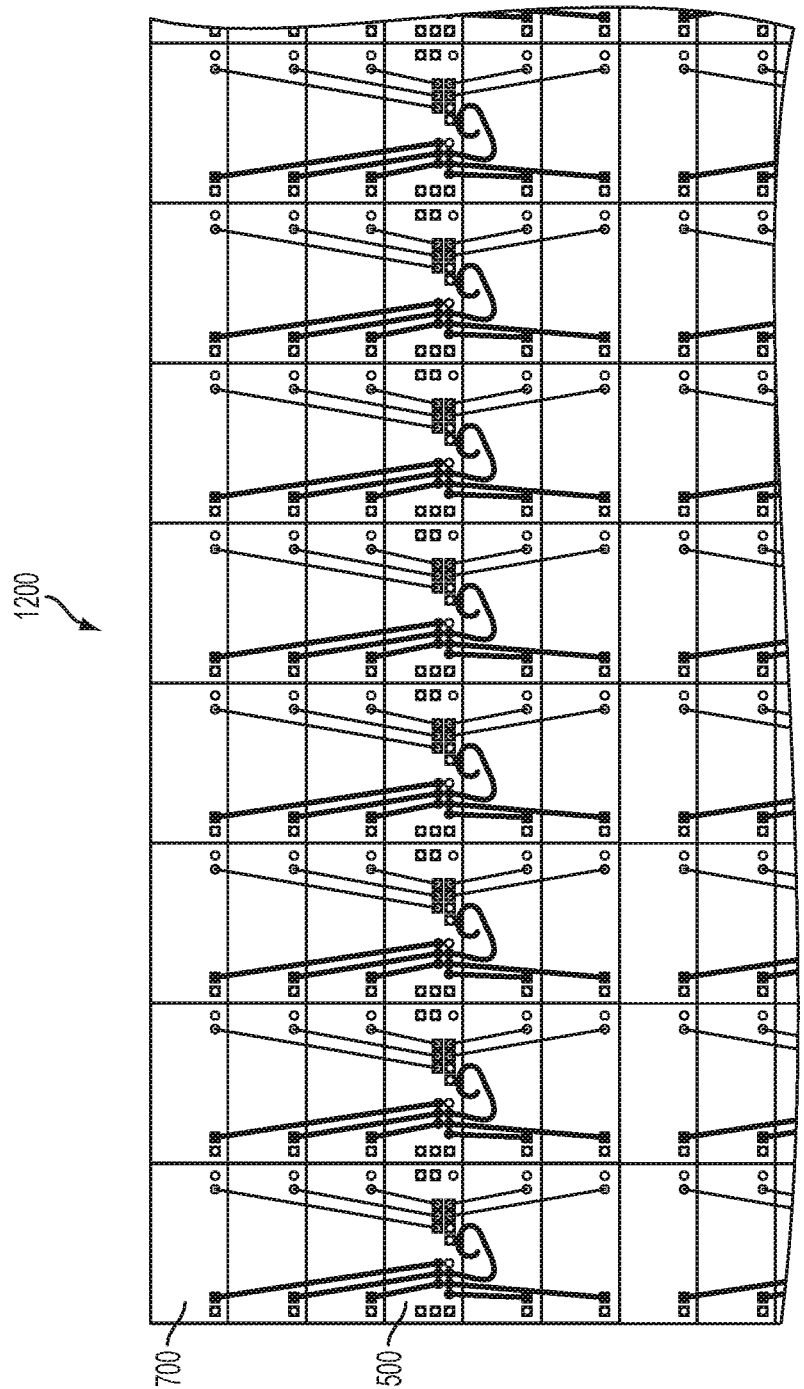

Referring to FIGS. 12A and 12B, one embodiment of a 19×10 panel two face display 1100 is illustrated that includes three hundred and eighty panels arranged in two displays of nineteen rows and ten columns. Each face requires 19 110 V 20 AMP circuit breakers. For purposes of example, the display 1100 uses the previously described main panel 500 of FIG. 5 (a 'B' panel) and the slave panel 700 of FIG. 7 (a 'C' panel). As described previously, these panels have separate input and output connection points for data communications between the main panel and the slave panels. FIGS. 12C and 12D provide enlarged views of a portion of FIGS. 12A and 12B, respectively.

As illustrated in FIG. 12A, power is provided from a power source directly to the first column panel of each face via a power line connected to a single 110V, 20A breaker. Those panels then feed the power along the rows in a serial manner. For example, the power is provided to the first column panel of the first face via the power source, to the second column panel via the first panel, to the third column panel via the second panel, and so on until the last panel is reached for that row of that face. The tenth column panel does not feed power to the next face because power is provided directly to the first column of the second face via the power source. Power is then provided to the second column panel via the first panel, to the third column panel via the second panel, and so on until the last panel is reached for that row of that face. Accordingly, if a panel is removed or the power for a panel is unplugged, the remainder of the panels in the row that rely on that panel for power will lose power.

Although not shown in FIG. 12B, the panels of the display 1200 may be divided into three sections for data purposes as illustrated previously with respect to FIG. 10B. Accordingly, as illustrated in FIG. 10B, data may be sent from a data source (e.g., a computer) to the top section via one line, to a middle section via a second line, and to a bottom section via a third line. Each master control cabinet has six data cables and is configured to be in row 4. Two rows of cabinets use only 5 cables while the sixth cable is unused and tied back.

As the present example illustrates the use of separate input and output connection points for data communications between the main panel and the slave panels, data connections between B panels have been omitted for purposes of clarity. However, a separate line may be run to the B panels in the first column of each face (which would require six lines in FIG. 12B), or the B panel in the last column of a row of one face may pass data to the B panel in the first column of a row of the next face (which would require three lines in FIG. 12B).

In the present example, the data is provided to the B panels that form the fourth row of each section. The B panels in the fourth row feed the data both vertically along the column and in a serial manner along the row (as shown in FIG. 10B). For example, the B panel at row four, column two (r4:c2), sends data to the C panels in rows one, two, three, five, and six of column two (r1-3:c2 and r5-6:c2), as well as to the B panel at row four, column three (r4:c3). Accordingly, if a B panel in row four is removed or the data cables are unplugged, the remainder of the panels in the column fed by that panel will lose their data connection. The next columns will also lose their data connections unless the loop allows data to reach them in the opposite direction.

Figure 13:
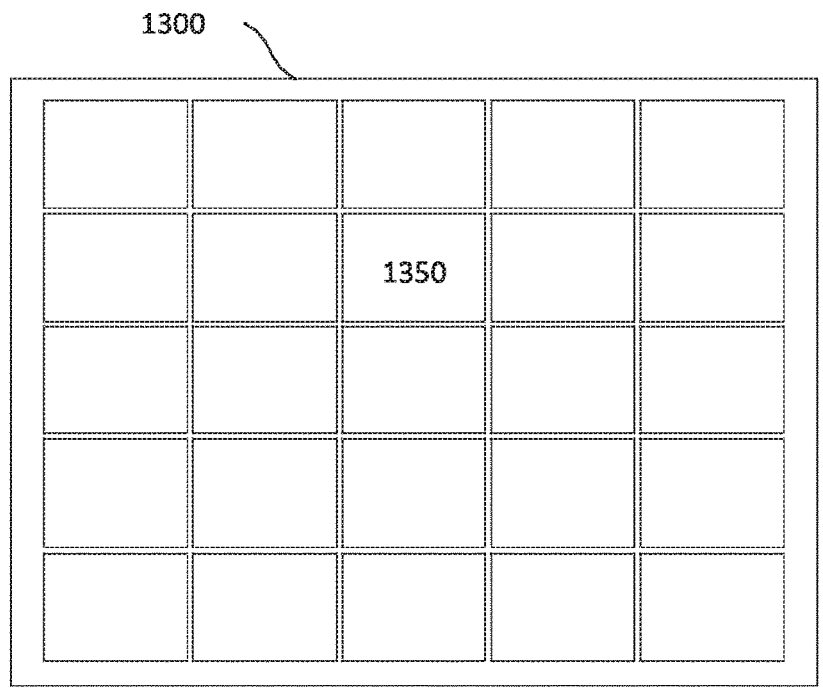
FIG. 13 illustrates a modular display panel in accordance with an embodiment of the present invention.
Figure 14:
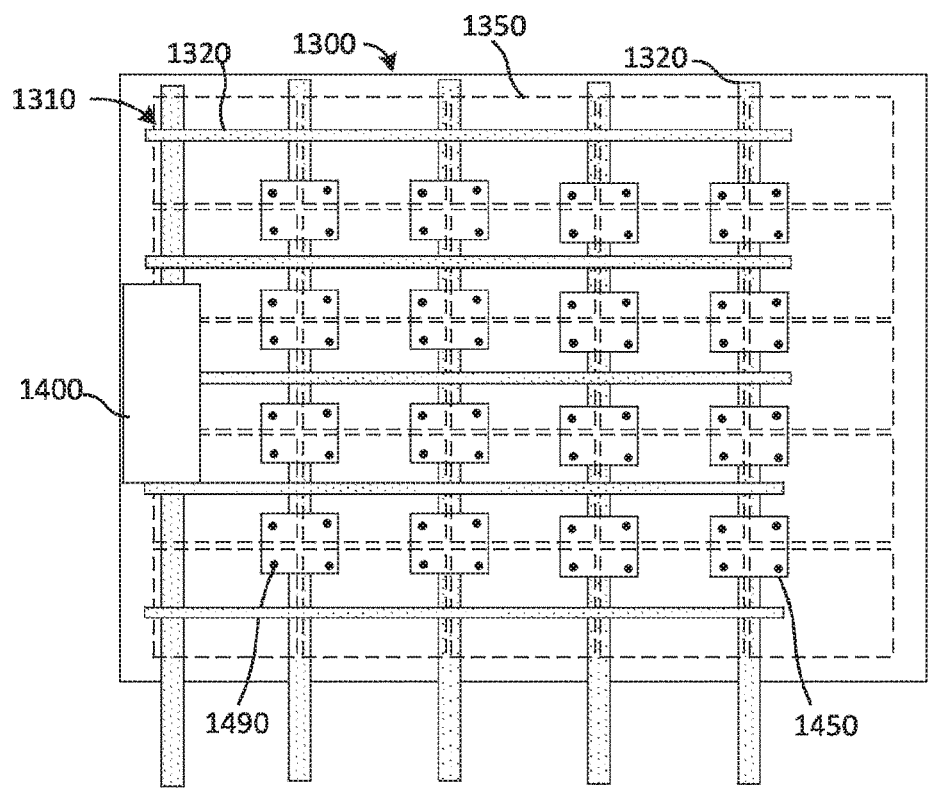
FIG. 14 illustrates a modular display panel attached to a supporting frame in accordance with an embodiment of the present invention.
Figure 15:
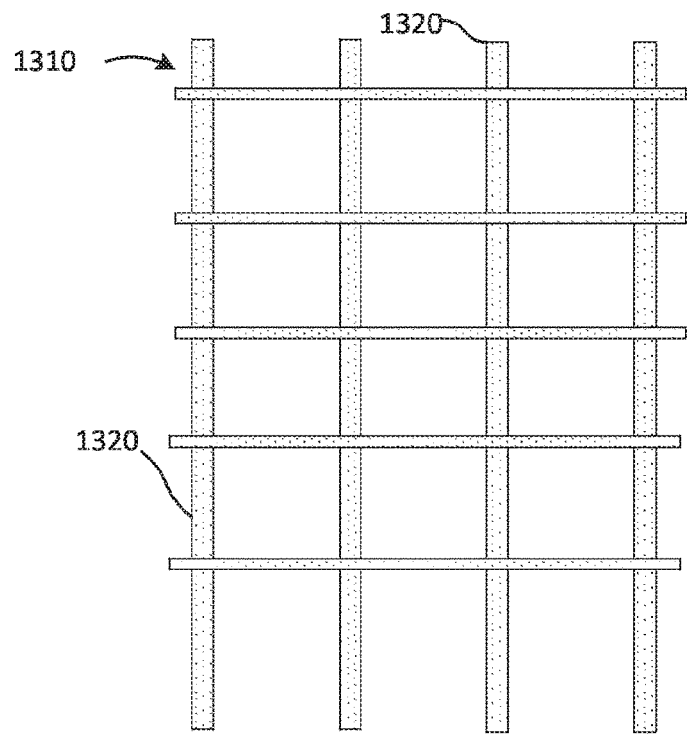
FIG. 15 illustrates a frame used to provide mechanical support to the modular display panel in accordance with an embodiment of the present invention.

FIG. 13 illustrates a modular display panel in accordance with embodiments of the present invention. FIG. 14 illustrates a modular display panel attached to a supporting frame in accordance with an embodiment of the present invention. FIG. 15 illustrates a frame used to provide mechanical support to the modular display panel in accordance with an embodiment of the present invention.

The multi-panel modular display panel 1300 comprises a plurality of LED display panels 1350. In various embodiments describe herein, the light emitting diode (LED) display panels 1350 are attached to a frame 1310 or skeletal structure that provides the framework for supporting the LED display panels 1350. The LED display panels 1350 are stacked next to each other and securely attached to the frame 1310 using attachment plate 1450, which may be a corner plate in one embodiment. The attachment plate 1450 may comprise holes through which attachment features 1490 may be screwed in, for example.

Referring to FIGS. 13 and 14, the LED display panels 1350 are arranged in an array of rows and columns. Each LED display panel 1350 of each row is electrically connected to an adjacent LED display panel 1350 within that row.

Referring to FIG. 15, the frame 1310 provides mechanical support and electrical connectivity to each of the LED display panels 1350. The frame 1310 comprises a plurality of beams 1320 forming the mechanical structure. The frame 1310 comprises a top bar, a bottom bar, a left bar, a right bar, and a plurality of vertical bars extending from the top bar to the bottom bar, the vertical bars disposed between the left bar and the right bar. The top bar, the bottom bar, the left bar and the right bar comprise four inch aluminum bars, and the vertical bars comprise 2"×4"×½" aluminum tubes. The top bar, the bottom bar, the left bar and the right bar are each capable of bearing a load of 1.738 lb/ft, and the vertical bars are each capable of bearing a load of 3.23 lb/ft.

The frame 1310 may include support structures for the electrical cables, data cables, electrical power box powering the LED displays panels 1350, data receiver box controlling power, data, and communication to the LED displays panels 1350.

However, the frame 1310 does not include any additional enclosures to protect the LED panels, data, power cables from the environment. Rather, the frame 1310 is exposed to the elements and further exposes the LED display panels 1350 to the environment. The frame 1310 also does not include air conditioning, fans, or heating units to maintain the temperature of the LED display panels 1350. Rather, the LED display panels 1350 are hermetically sealed themselves and are designed to be exposed to the outside ambient. Further, in various embodiments, there are not additional cabinets that are attached to the frame 1310 or used for housing the LED display panels 1350. Accordingly, in various embodiments, the multi-panel modular display panel 1300 is designed to be only passively cooled.

Figure 38A:
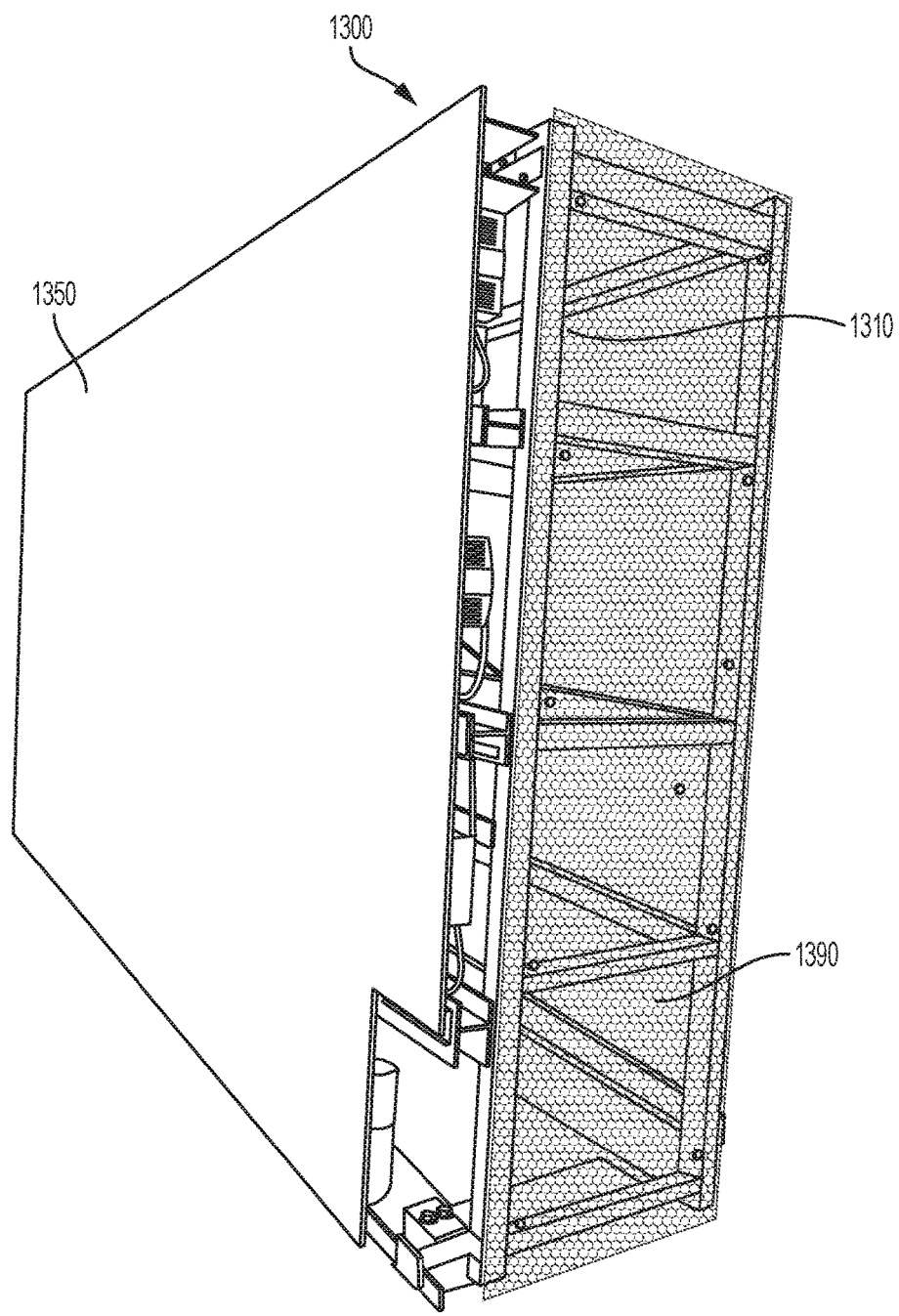
FIGS. 38A-38D illustrate specific examples of an assembled display system.
Figure 38B:
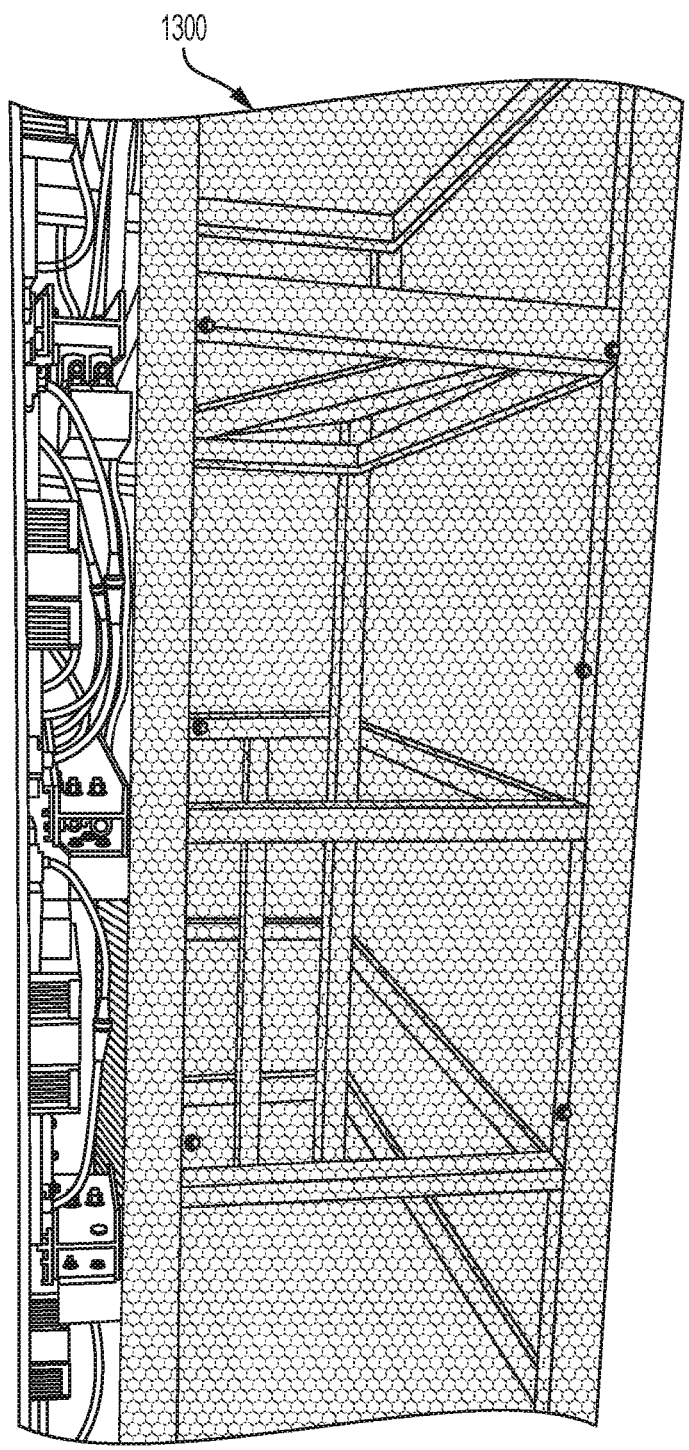
Figure 38C:
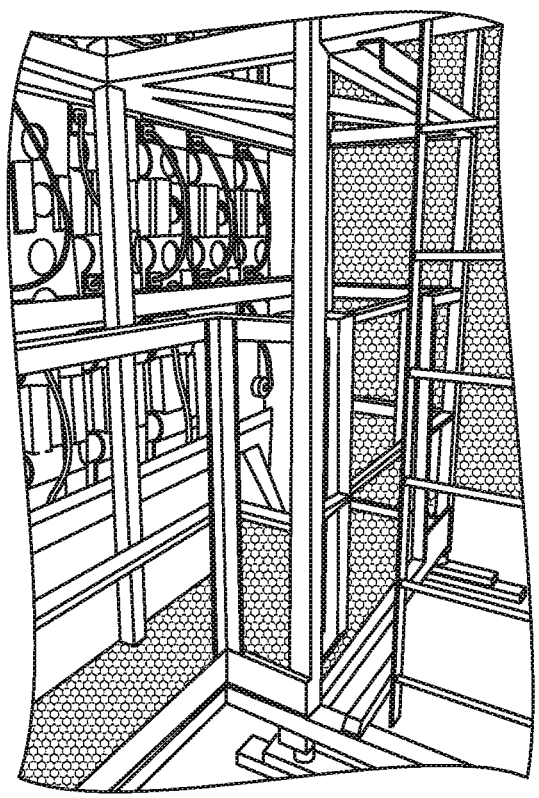
Figure 38D:
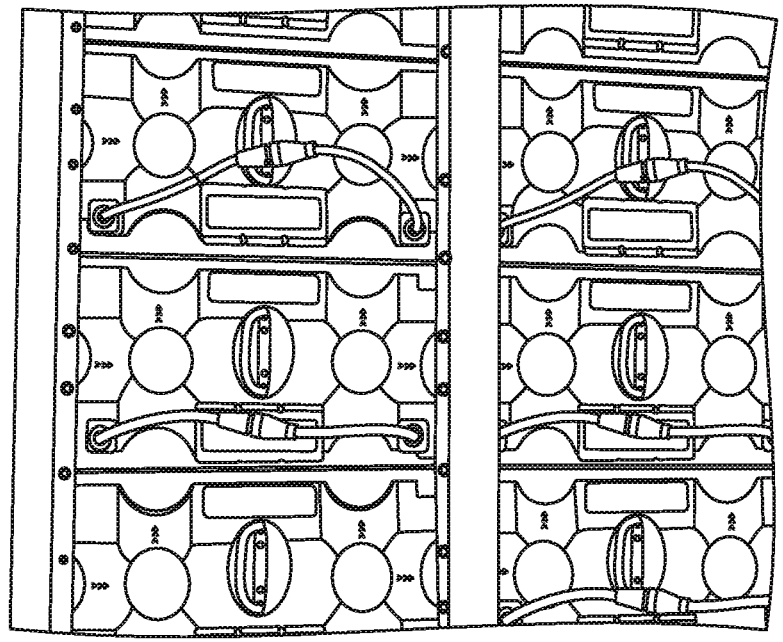

FIGS. 38A-38E illustrate specific examples of an assembled display system 1300 and a frame 1310. As shown in FIG. 38A, the modular display system 1300 includes a number of LED display panels 1350 mounted to frame 1310. One of the display panels has been removed in the lower corner to illustrate the modular nature of the display. In this particular example, access is provided to the back of the modular display through a cage 1390 that includes an enclosed catwalk. Since the display system 1300 is generally highly elevated, a ladder (see FIG. 38C) provides access to the catwalk. A side view of the display system is shown in FIG. 38B and back views are shown in FIGS. 38C and 38D. FIG. 38D further illustrates the cables of the panels interlocked for safe transportation.

Figure 38E:
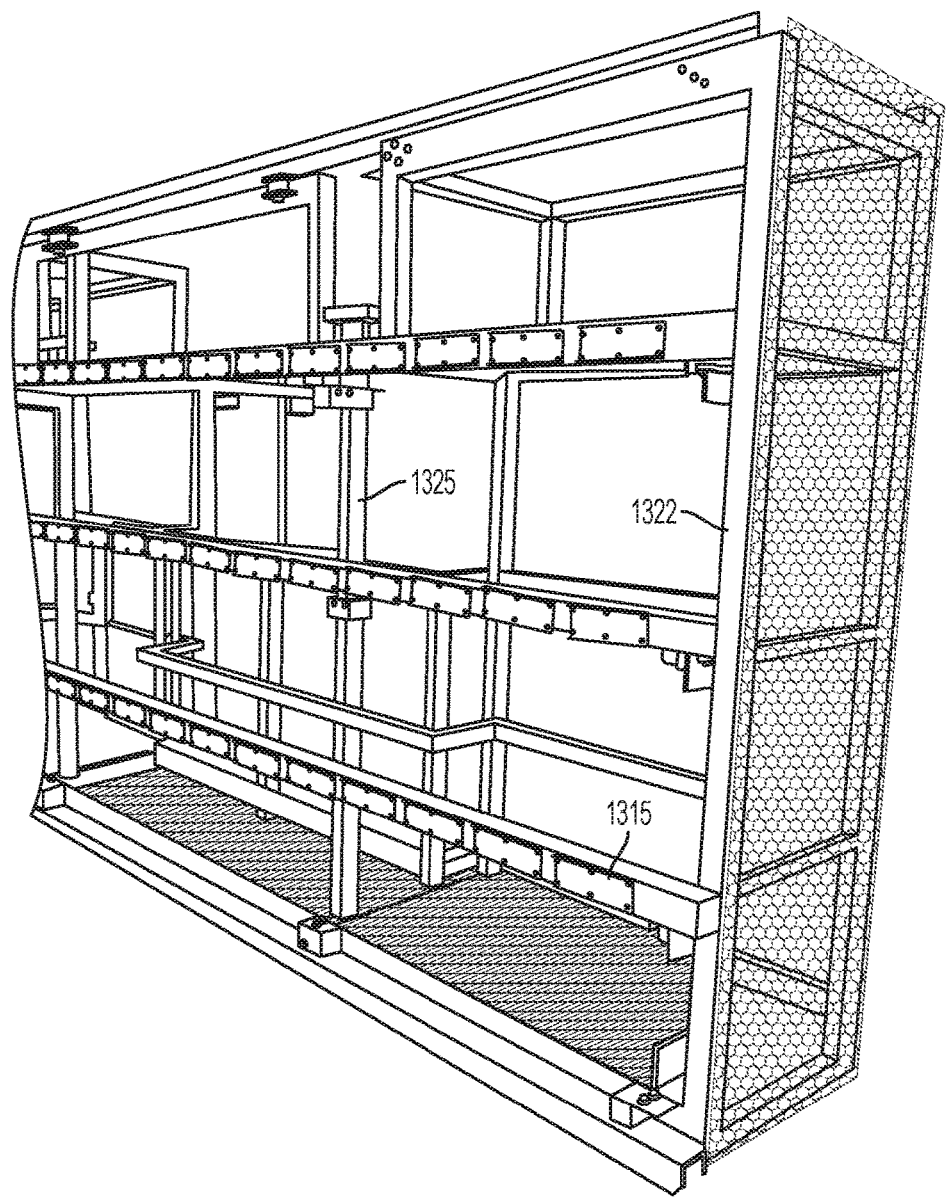
FIG. 38E illustrates a specific example of a frame that can be used with the system of FIGS. 38A-38D.

FIG. 38E illustrates the frame 1310 without the display panels 1350. In this embodiment the beams 1320 that form that outer frame are bigger than the interior beams 1325. In this case, the interior beams 1325 are aligned in a plane outside those of the frame beams 1322. The plates 1315 are also shown in the figure. Upon installation, these plates will be rotated by 90 degrees and fasten to the display panels.

Figure 16A:
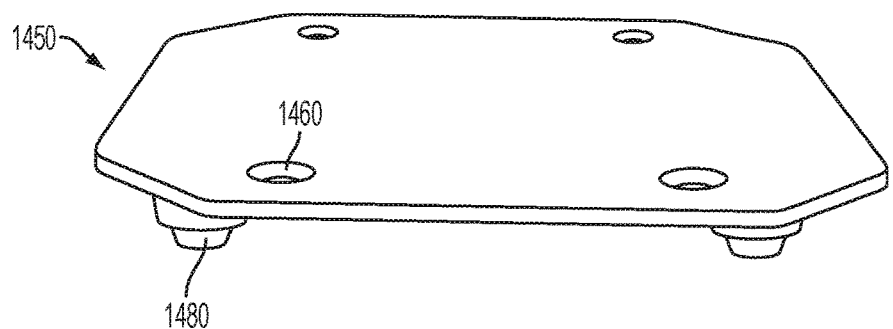
Figure 16C:
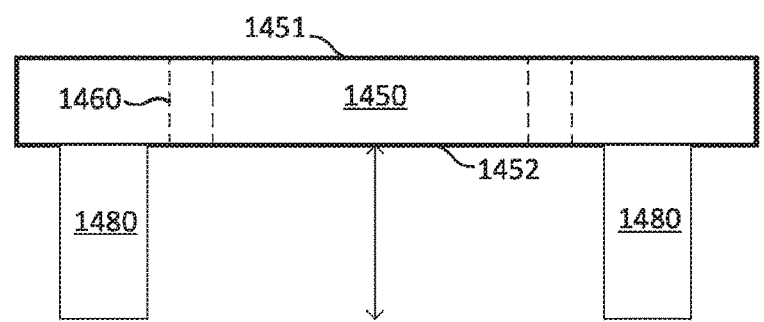
Figure 16B:
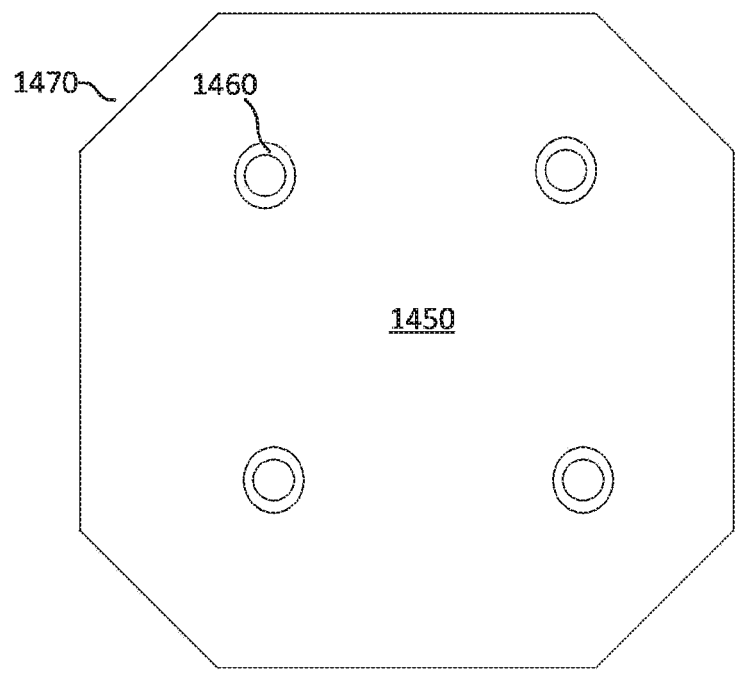

FIG. 16, which includes FIGS. 16A-16C, illustrates an attachment plate used to attach one or more modular display panels to the frame in accordance with an embodiment of the present invention. FIG. 16A illustrates a projection view while FIG. 16B illustrates a top view and FIG. 16C illustrates a cross-sectional view.

Referring to FIGS. 16A-16C, the attachment plate 1450 may comprise one or more through openings 1460 for enabling attachment features such as screws to go through. Referring to FIG. 16C, the attachment plate 1450 comprises a top surface 1451 and a bottom surface 1452. The height of the pillars 1480 may be adjusted to provide a good fit for the display panel. Advantageously, because the frame 1310 is not screw mounted to the display panel 1350, the display panel 1350 may be moved during mounting. This allows for improved alignment of the display panels resulting in improved picture output. An alignment plate could also be used as described above.

Accordingly, in various embodiments, the height of the pillars 1480 is about the same as the thickness of the beams 1320 of the frame 1310. In one or more embodiments, the height of the pillars 1480 is slightly more than the thickness of the beams 1320 of the frame 1310.

Figure 16D:
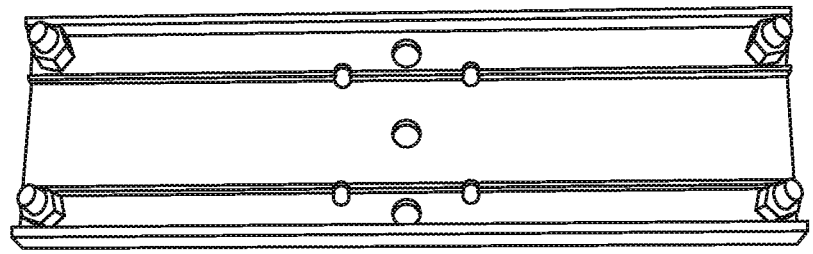
Figure 16E:
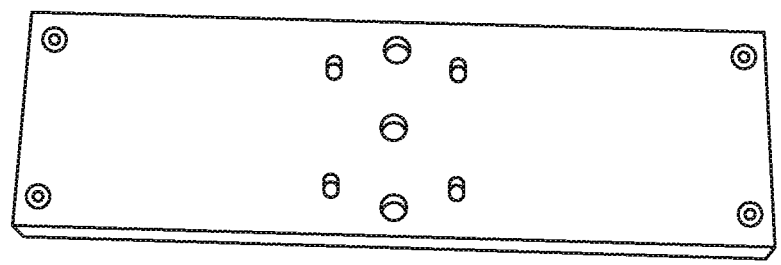

FIGS. 16D and 16E illustrate another embodiment of the attachment plate 1450. In this example, the plate is rectangular shaped and not a square. For example, the length can be two to four times longer than the width. In one example, the length is about 9 inches while the width is about 3 inches. The holes in the center of the plate are optional. Conversely, these types of holes could be added to the embodiment of FIGS. 16A and 16B. In other embodiments, other shaped plates 1450 can be used.

Figure 17:
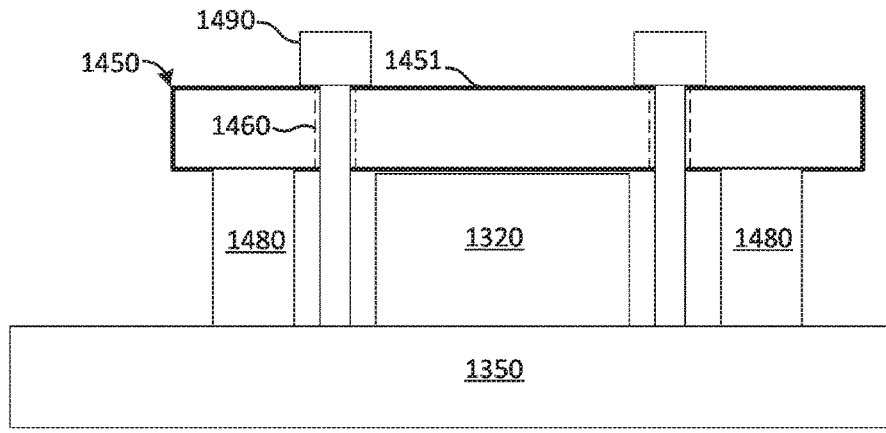
FIG. 17 illustrates a magnified view of the attachment plate or a connecting plate, frame, and display panel after mounting in accordance with embodiments of the present invention.

FIG. 17 illustrates a magnified view of the attachment plate or a connecting plate, frame, and display panel after mounting in accordance with embodiments of the present invention.

Referring to FIG. 17, one or more attachment features 1490 may be used to connect the attachment plate 1450 to the display panel 1350. In the embodiment illustrated in FIG. 17, the attachment plate 1450 is a corner plate. Each corner plate is mechanically connected to corners of four of the LED display panels 1350 to secure the LED display panels 1350 to the respective beams 1320 of the frame 1310.

FIG. 17 illustrates that the attachment features 1490 is attached using the through openings 1460 in the attachment plate 1450. The frame is between the attachment plate 1450 and the display panel 1350.

In the embodiment of FIG. 17, the beam 1320 physically contacts the display panel 1350. In another embodiment, a second plate (not shown here) could be included between the beam 1320 and the display panel 1350. The plate could be a solid material such as a metal plate or could be a conforming material such as a rubber material embedded with metal particles. In either case, it is desirable that the plate be thermally conductive.

Figure 18:
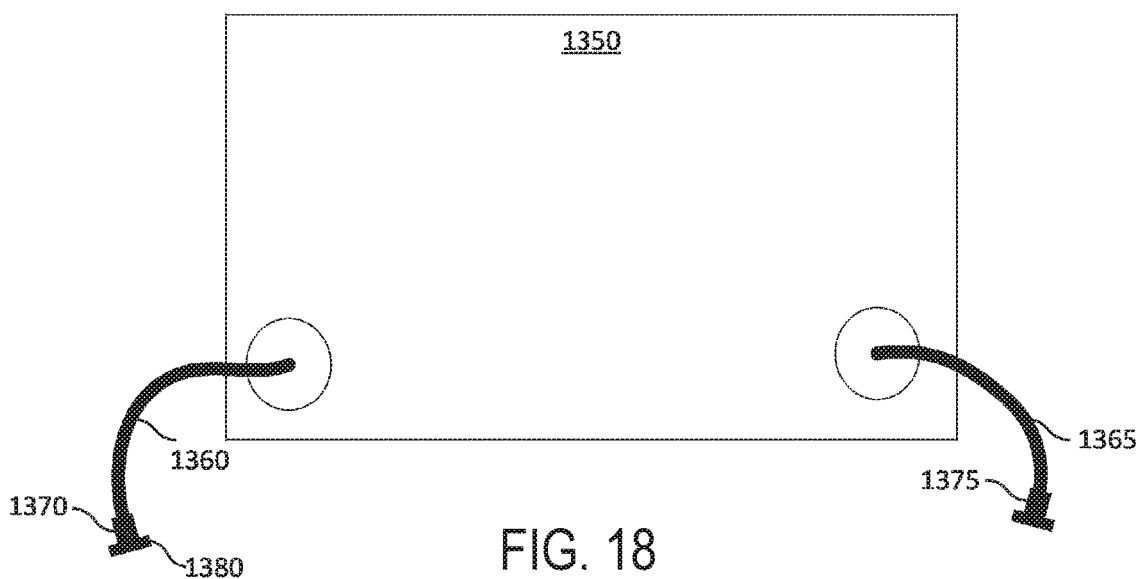
FIG. 18 illustrates one unit of the modular display panel in accordance with an embodiment of the present invention.

FIG. 18 illustrates one unit of the modular display panel in accordance with an embodiment of the present invention.

FIG. 18 illustrates one LED display panel 1350 of the multi-panel modular display panel 1300 comprising an input cable 1360 and an output cable 1365. The LED display panels 1350 are electrically connected together for data and for power using the input cable 1360 and the output cable 1365.

Each modular LED display panel 1350 is capable of receiving input using an integrated data and power cable from a preceding modular LED display panel and providing an output using another integrated data and power cable to a succeeding modular LED display panel. Each cable ends with an endpoint device or connector, which is a socket or alternatively a plug.

Referring to FIG. 18, in accordance with an embodiment, a LED display panel 1350 comprises an attached input cable 1360 and an output cable 1365, a first connector 1370, a second connector 1375, a sealing cover 1380. The sealing cover 1380 is configured to go over the second connector 1375 thereby hermetically sealing both ends (first connector 1370 and the second connector 1375). The sealing cover 1380, which also includes a locking feature, locks the two cables together securely. As will be described further, the input cable 1360 and the output cable 1365 comprise integrated data and power wires with appropriate insulation separating them.

Figure 19:
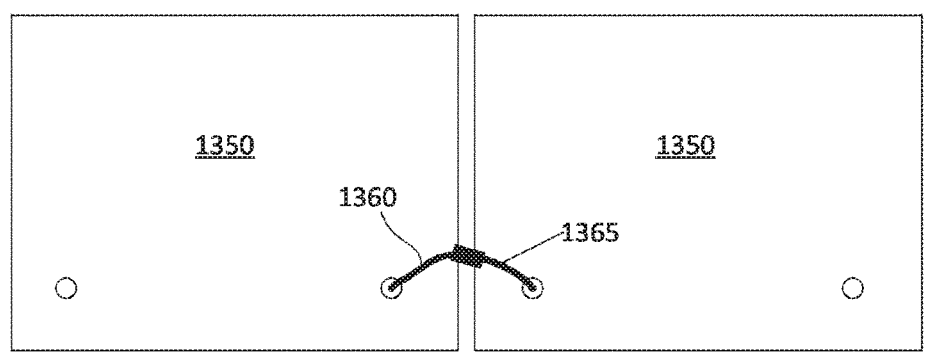
FIG. 19 illustrates a magnified view of two display panels next to each other and connected through the cables such that the output cable of the left display panel is connected with the input cable of the next display panel in accordance with an embodiment of the present invention.

FIG. 19 illustrates two display panels next to each other and connected through the cables such that the output cable 1365 of the left display panel 1350 is connected with the input cable 1360 of the next display panel 1350. The sealing cover 1380 locks the two cables together as described above.

Figure 20:
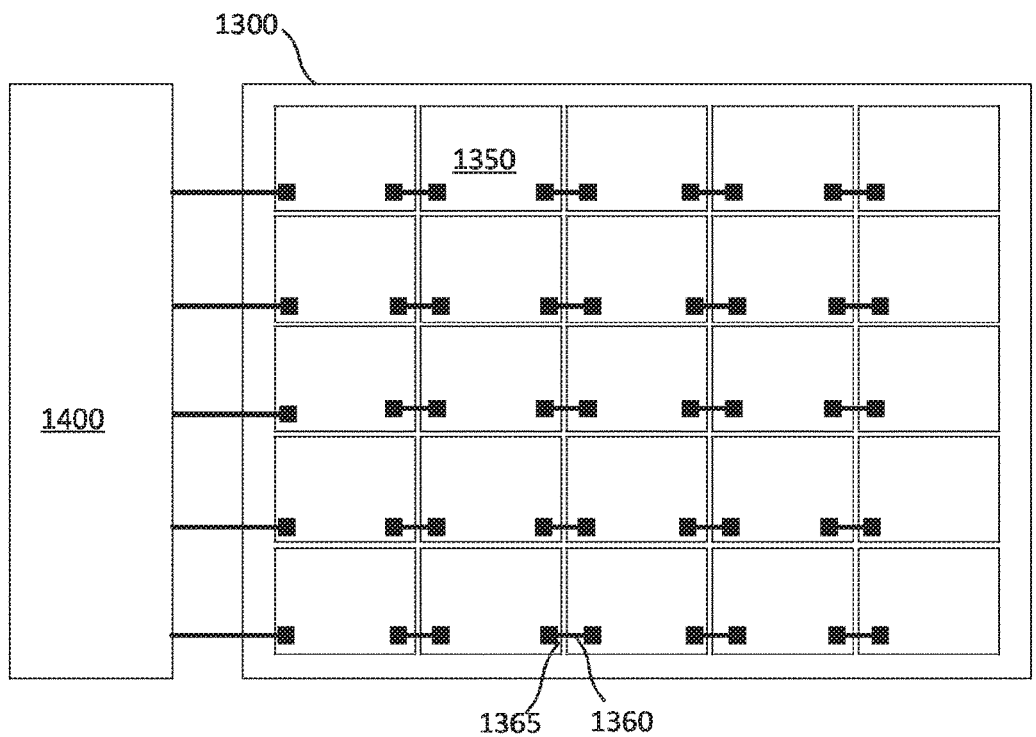
FIG. 20 illustrates a modular multi-panel display system comprising a plurality of LED display panels connected together using the afore-mentioned cables in accordance with an embodiment of the present invention.

FIG. 20 illustrates a modular multi-panel display system comprising a plurality of LED display panels connected together using the afore-mentioned cables.

Referring to FIG. 20, for each row, a LED display panel 1350 at a first end receives an input data connection from a data source and has an output data connection to a next LED display panel in the row. Each further LED display panel 1350 provides data to a next adjacent LED display panel until a LED display panel 1350 at a second end of the row is reached. The power line is run across each row to power the LED display panels 1350 in that row.

In one embodiment, the plurality of LED display panels 1350 includes 320 LED display panels 1350 arranged in ten rows and thirty-two columns so that the integrated display panel 1300 has a display surface that is approximately fifty feet and four inches wide and fifteen feet and eight and three-quarters inches high.

In various embodiments, as illustrated in FIGS. 14 and 20, a data receiver box 1400 is mounted to the mechanical support structure or frame 1310. The data receiver box 1400 is configured to provide power, data, and communication to the LED display panels 1350. With a shared receiver box 1400, the panels themselves do not need their own receiver card. This configuration saves cost and weight.

Figure 21A:
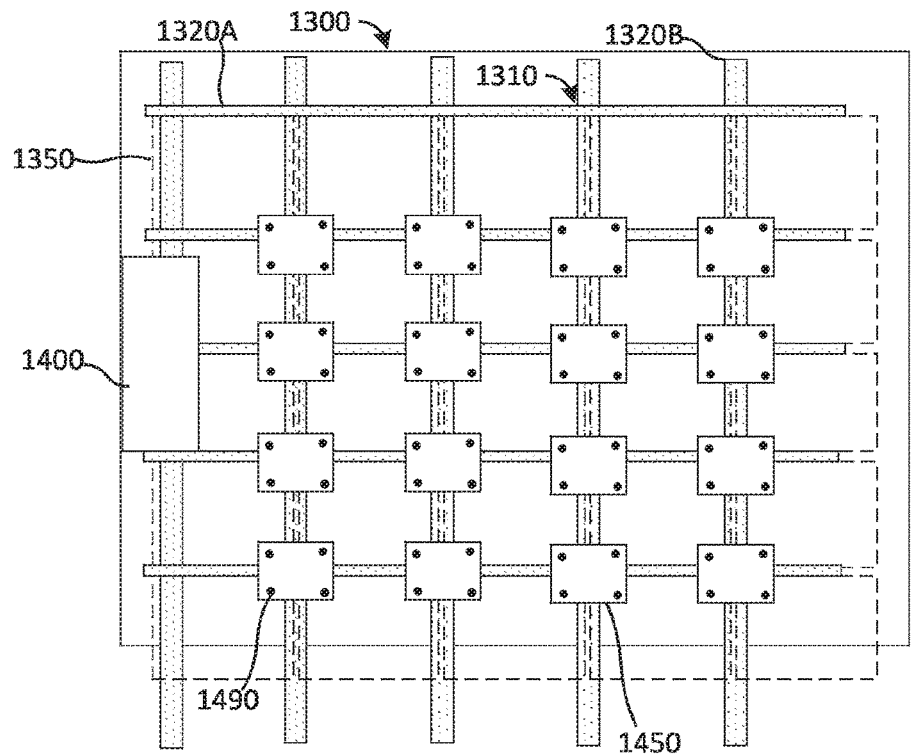
Figure 21B:
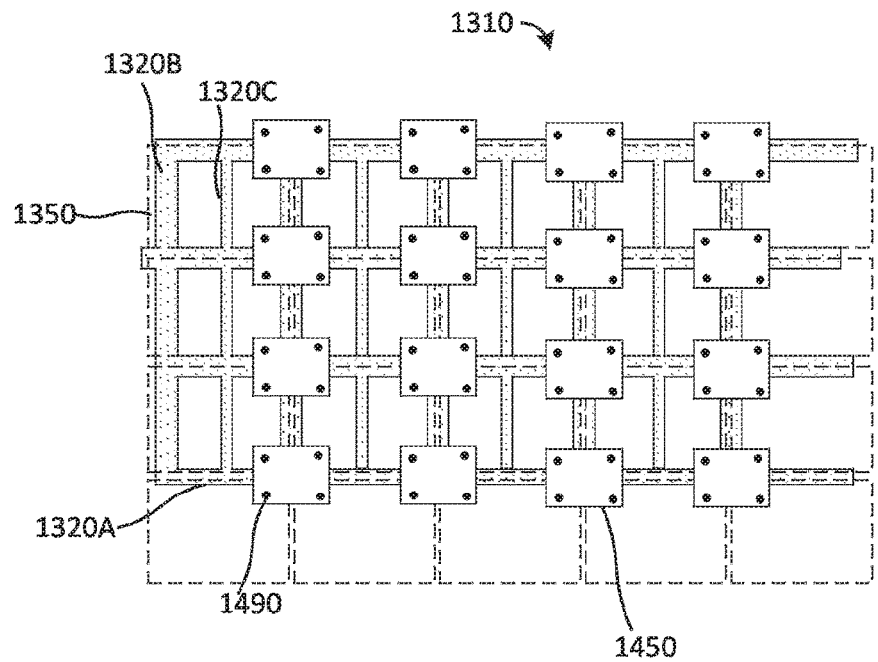
Figure 21C:
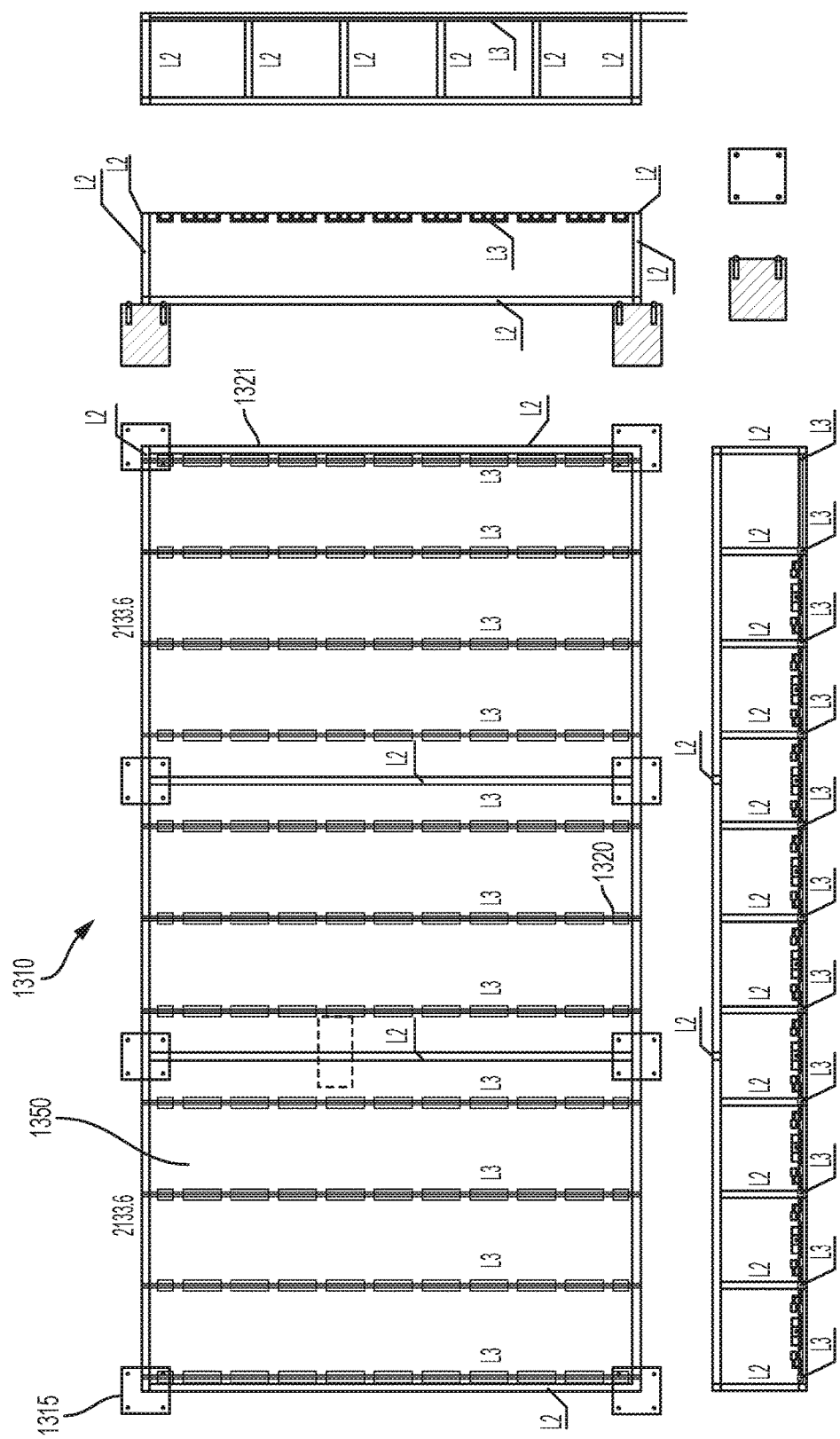

FIG. 21, which includes FIGS. 21A-21C, illustrates an alternative embodiment of the modular display panel attached to a supporting frame in accordance with an embodiment of the present invention. FIGS. 21B and 21C illustrate alternative structural embodiments of the supporting frame.

This embodiment differs from embodiment described in FIG. 14 in that the horizontal beams 1320A may be used to support the display panels 1350. In one embodiment, both horizontal beams 1320A and vertical beams 1320B may be used to support the display panels 1350. In another embodiment, horizontal beams 1320A but not the vertical beams 1320B may be used to support the display panels 1350.

FIG. 21B illustrates an alternative embodiment including additional beams 1320C, which may be narrower than the other beams of the frame. One or more of the thinner beams 1320C may be placed between the regular sized vertical beams 1320B.

FIG. 21C illustrates a further embodiment illustrating both a top view, bottom view and side view of a frame. The frame 1310 may be attached to a wall or other structure using plates 1315. The frame 1310 may comprise a plurality of vertical beams and horizontal beams. In one embodiment, the frame 1310 comprises an outer frame having a top bar, a bottom bar, a left bar and a right bar. A display panel 1350 may be supported between two adjacent beams 1320 marked as L3 beams, which may be thinner (smaller diameter) and lighter than the thicker and heavier load bearing beams 1321 marked as L2 beams used for forming the outer frame. As an illustration, the L2 beams may be 4" while the L3 beams may be 3" in one example.

Figure 22:
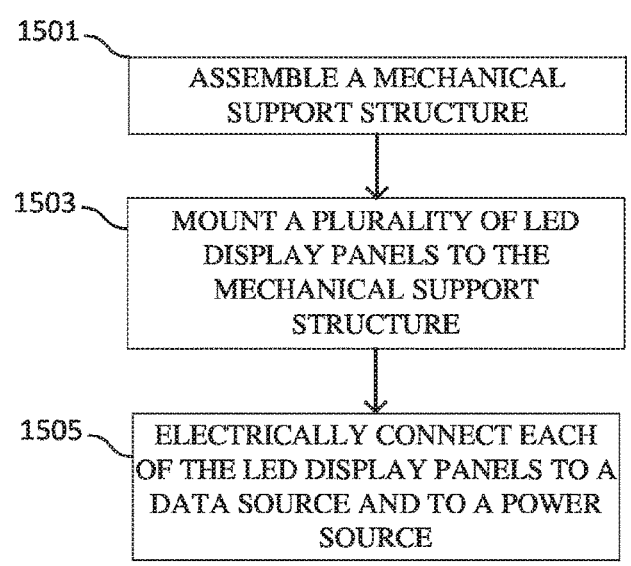
FIG. 22 illustrates a method of assembling a modular multi-panel display system in accordance with an embodiment of the present invention.

FIG. 22 illustrates a method of assembling a modular multi-panel display system in accordance with an embodiment of the present invention. FIG. 22 illustrates a method of assembling the multi-panel display system discussed in various embodiments, for example, FIG. 14.

A mechanical support structure such as the frame 1310 described above is assembled taking into account various parameters such as the size and weight of the multi-panel display, location and zoning requirements, and others (box 1501). For example, as previously described, the mechanical support structure includes a plurality of vertical bars and horizontal bars. The mechanical support structure may be fabricated from a corrosion resistant material in one or more embodiments. For example, the mechanical support structure may be coated with a weather-proofing coating that prevents the underlying substrate from corroding.

A plurality of LED display panels are mounted on to the mechanical support structure so as to form an integrated display panel that includes an array of rows and columns of LED display panels as described in various embodiments (box 1503). Each of the LED display panels is hermetically sealed. Mounting the LED display panels may comprise mounting each LED display panel to a respective vertical beam using an attachment plate.

Each of the LED display panels is electrically connected to a data source and to a power source (box 1505). For example, a first LED display panel in each row is electrically coupled to the display source. The other LED display panels in each row may be daisy-chain coupled to an adjacent LED display panel (e.g., as illustrated in FIG. 20).

Since the assembled display structure is light weight, significant assembly advantages can be achieved. For example, the panels can be assembled within a warehouse that is remote from the final location where the display will be utilized. In other words, the panels can be assembled at a first location, shipped to a second location and finalized at the second location.

Figure 39:
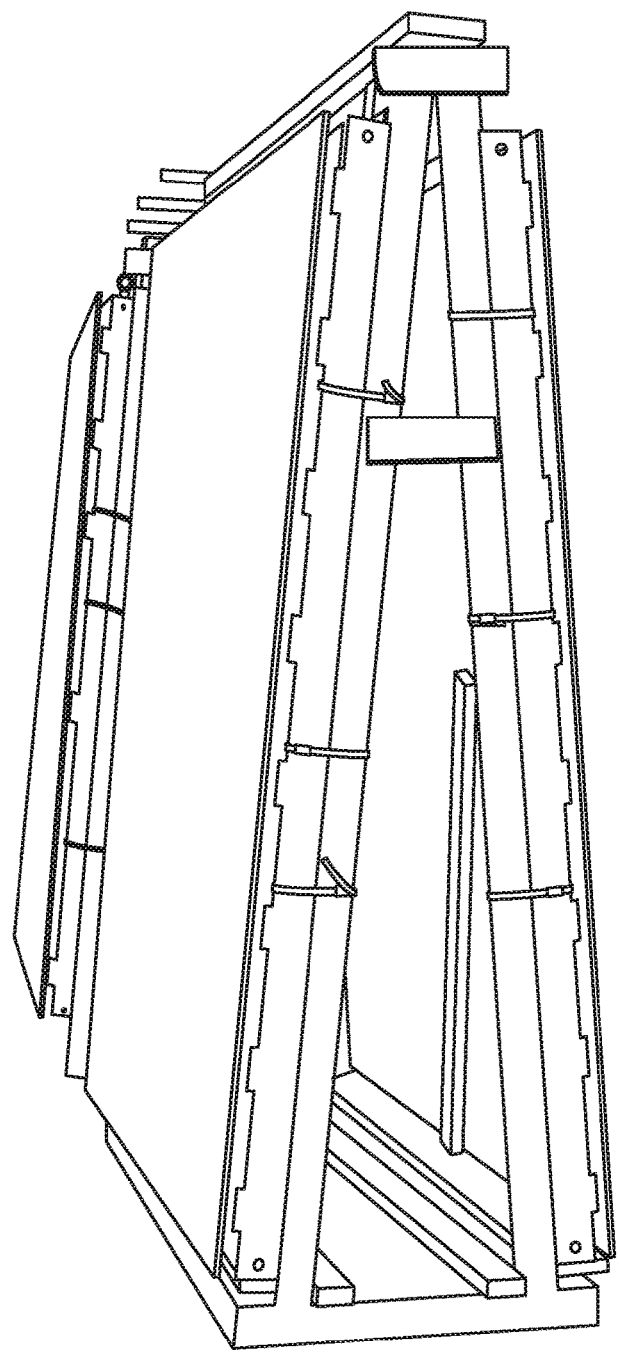
FIG. 39 illustrates an assembled multi-panel display that is ready for shipment.

An illustration of two assembled displays that are ready for shipment is provided in FIG. 39. These displays can be quite large, for example much larger than a 14×48 panel display. In some cases, a single display system is shipped as a series of sub-assemblies, e.g., as shown in the figure, and then assembled into a full display on location.

In various embodiments, the assembled multi-panel display system includes no cabinets. The assembled multi-panel display system is cooled passively and includes no air conditioning or fans.

Figure 23:
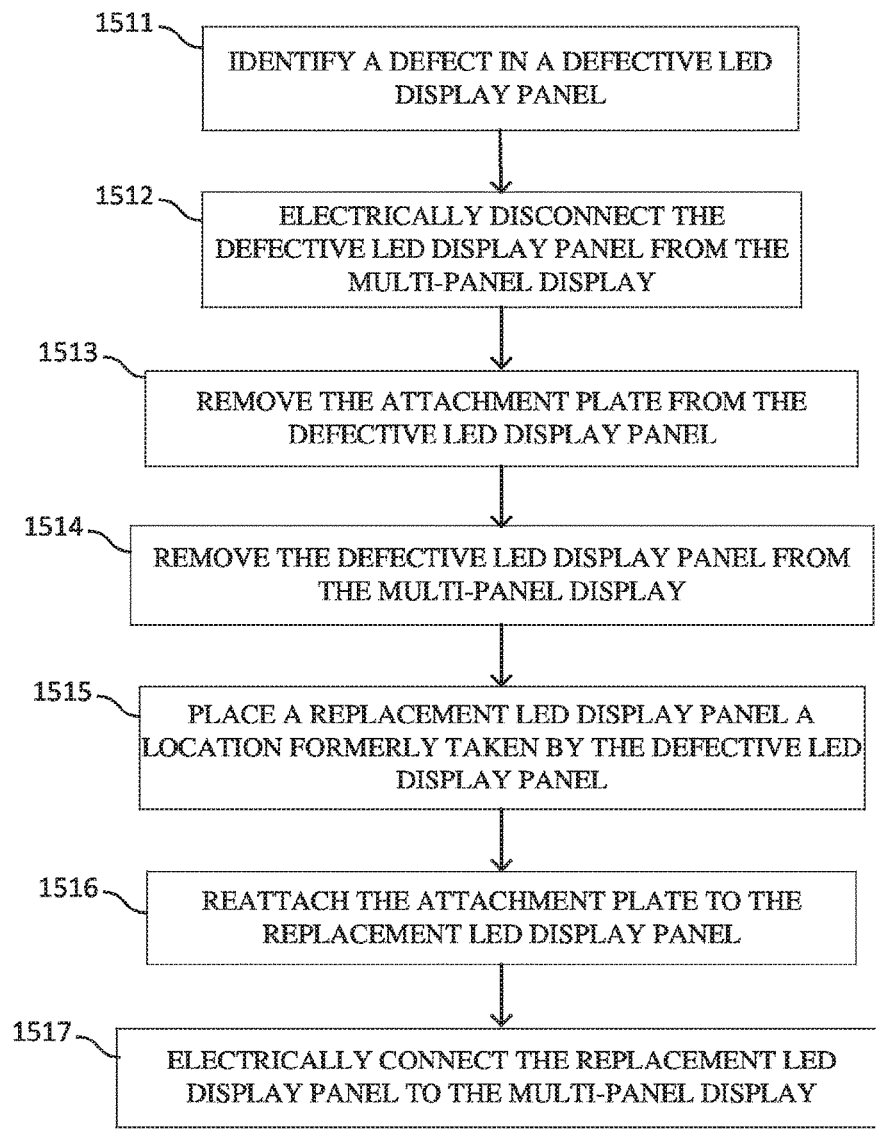
FIG. 23 illustrates a method of maintaining a modular multi-panel display that includes a mechanical support structure and a plurality of LED display panels detachably coupled to the mechanical support structure without a cabinet in accordance with an embodiment of the present invention.

FIG. 23 illustrates a method of maintaining a modular multi-panel display that includes a mechanical support structure and a plurality of LED display panels detachably coupled to the mechanical support structure without a cabinet. Each LED display panel is mechanically coupled to the mechanical support structure and three other lighting panels by a corner plate.

Referring to FIG. 23, a defect is identified in one of the LED display panels so as to identify a defective LED display panel (box 1511). The identification of the defective LED display panel may be performed manually or automatically. For example, a control loop monitoring the display system may provide a warning or error signal identifying the location of the defect.

In one embodiment, the health of a panel and/or the health of individual pixels can be determined. To determine the health of the panel, the power supply for each of the panels is monitored. If a lack of power is detected at any of the supplies a warning message is sent. For example, it can be determined that one of the power supplies has ceased to supply power. In the illustrated example, the message is sent from the power supply to the communication chip within the panel and then back to the receiving card. From the receiving card a message can be sent to the sending card or otherwise. For example, the message could generate a text to be provided to a repair station or person. In one example, a wireless transmitter is provided in the receiving card so that the warning message can be sent via a wireless network, e.g., a cellular data network. Upon receipt of the warning message, a maintenance provider can view the display, e.g., using a camera directed at the display.

In another embodiment, the health of individual pixels is determined, for example, by having each panel include circuitry to monitor the power being consumed by each pixel. If any pixel is determined to be failing, a warning message can be generated as discussed above. The pixel level health check can be used separately from or in combination with the panel level health check.

These embodiments would use bi-directional data communication between the panels and the receiver box. Image data will be transferred from the receiver box to the panels, e.g., along each row, and health and other monitoring data can be transferred from the panels back to the receiver. In addition to, or instead of, the health data discussed other data such as temperature, power consumption or mechanical data (e.g., sensing whether the panel has moved) can be provided from the panel.

If a decision is made to replace the defective LED display panel, the defective LED display panel is electrically disconnected from the multi-panel display (box 1512). The attachment plate securely holding the LED display panel to the frame is removed from the defective LED display panel (box 1513). In one or more embodiments, four attachment plates are removed so as to remove a single LED display panel. This is because one attachment plate has to be removed from a respective corner of the defective LED display panel.

The defective LED display panel is next removed from the multi-panel display (box 1514). A replacement LED display panel is placed in a location formerly taken by the defective LED display panel (box 1515). The attachment plate is reattached to the replacement LED display panel securely mounting the replacement LED display panel back to the display system (box 1516). Similarly, four attachment plates have to be reattached in the above example. The replacement LED display panel is electrically reconnected to the multi-panel display (box 1517).

Figure 24A:
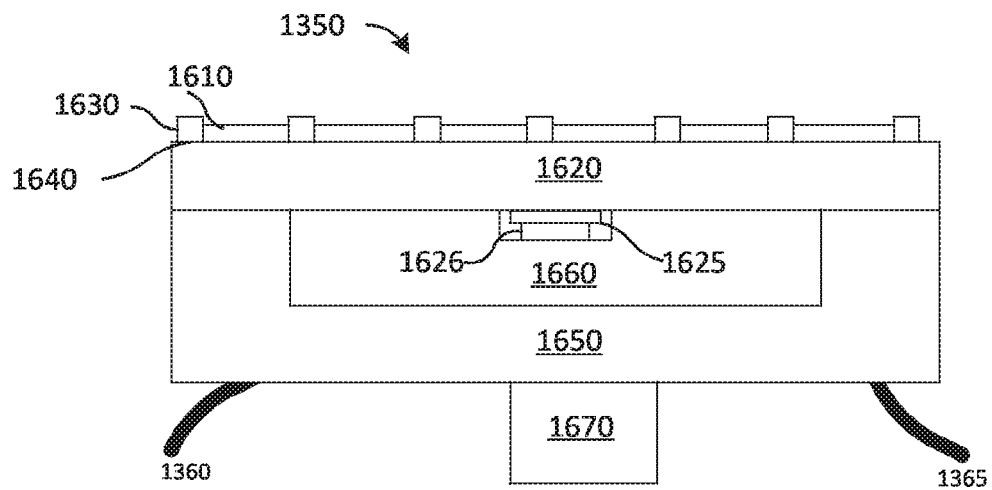
Figure 24B:
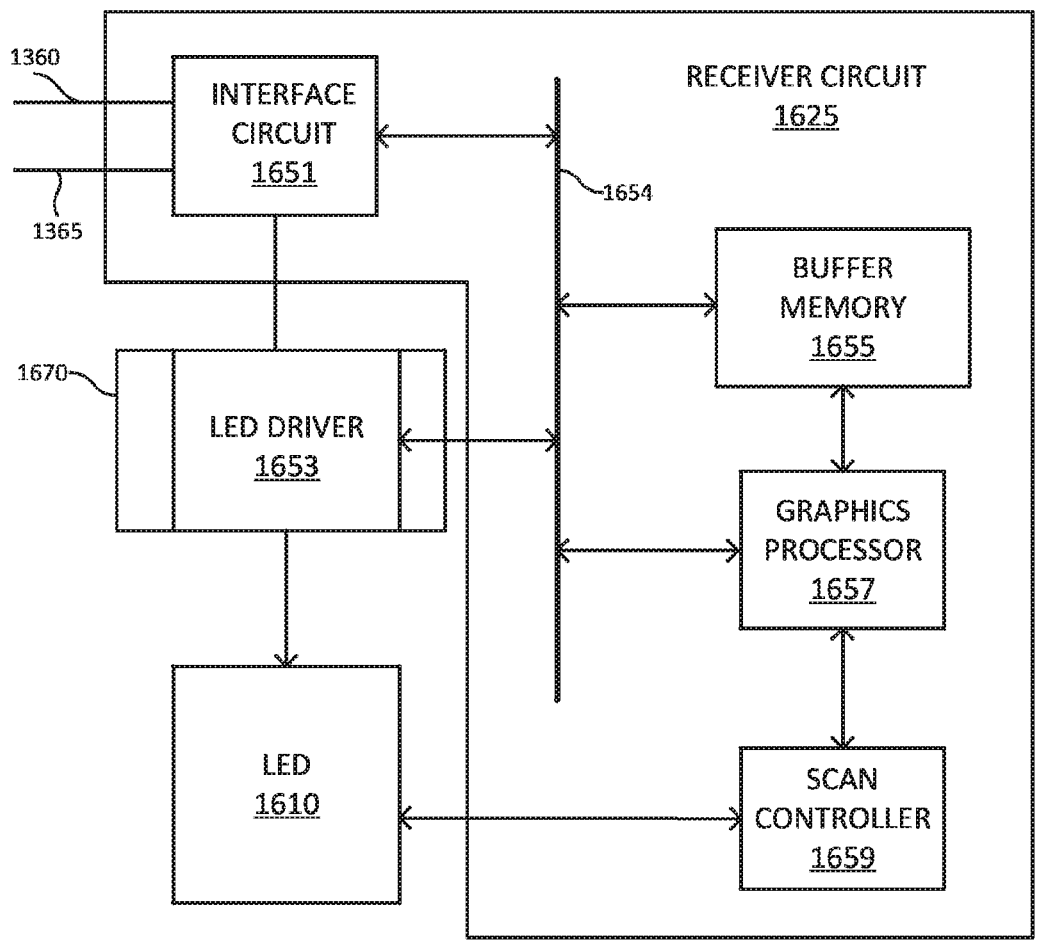
Figure 24C:
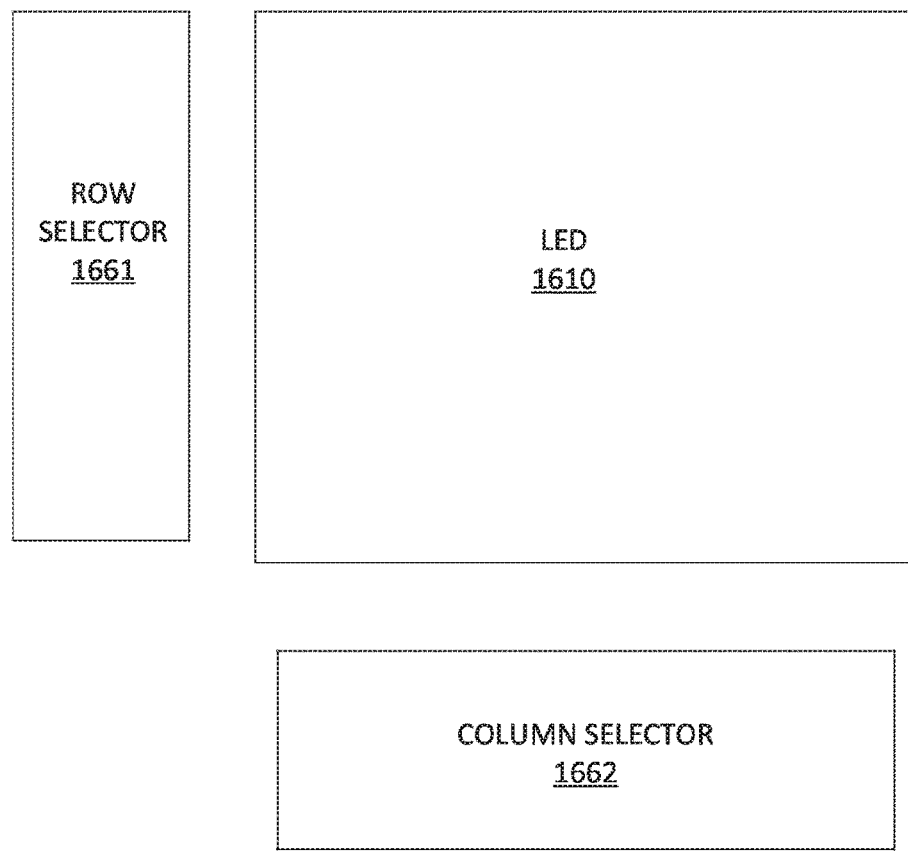

FIG. 24, which includes FIGS. 24A and 24B, illustrates a display panel in accordance with an embodiment of the present invention. FIG. 24A illustrates a cross-sectional view of a display panel while FIG. 24B illustrates a schematic of the display panel. FIG. 24C illustrates a schematic of the LED array as controlled by the receiver circuit in accordance with an embodiment of the present invention.

Referring to FIG. 24A, the modular LED display panel comprises a plurality of LEDs 1610 mounted on one or more printed circuit boards (PCBs) 1620, which are housed within a hermetically sealed enclosure or casing. A framework of louvers 1630 is attached to the PCB 1620 using an adhesive 1640, which prevents moisture from reaching the PCB. However, the LEDs 1610 are directly exposed to the ambient in the direction of light emission. The LEDs 1610 themselves are water repellent and therefore are not damaged even if exposed to water. The louvers 1630 rise above the surface of the LEDs and help to minimize reflection and scattering of external light, which can otherwise degrade the quality of light output from the LEDs 1610.

The PCB is mounted within a cavity of an enclosure, which may be a plastic casing 1650. A heat sink 1660 is attached between the PCB 1620 and the casing 1650 and contacts both the PCB 1620 and the casing 1650 to maximize heat extraction. A thermal grease may be used between the back side of the casing 1650 and the PCB 1620 to improve thermal conduction. In one example embodiment, the thermal grease is between the heat sink 1660 and the back side of the casing 1650. In a further example embodiment, the thermal grease is between the PCB 1620 and the heat sink 1660.

A receiver circuit 1625 is mounted on the PCB 1620. The receiver circuit 1625 may be a single chip in one embodiment. Alternatively, multiple components may be mounted on the PCB 1620. The receiver circuit 1625 may be configured to process the received media and control the operation of the LEDs 1610 individually. For example, the receiver circuit 1625 may determine the color of the LED to be displayed at each location (pixel). Similarly, the receiver circuit 1625 may determine the brightness at each pixel location, for example, by controlling the current supplied to the LED.

The air gap within the cavity is minimized so that heat is conducted out more efficiently. Thermally conductive standoffs 1626 may be introduced between the PCB 1620 to minimize the air gap, for example, between the receiver circuit 1625 and the heat sink 1660. The PCB 1620 is designed to maximize heat extraction from the LEDs 1610 to the heat sink 1660. As described previously, the casing 1650 of the display panel 1350 has openings through which an input cable 1360 and output cable 1365 may be attached. The cables may have connectors or plugs for connecting to an adjacent panel or alternatively the casing 1650 may simply have input and output sockets.

A power supply unit 1670 may be mounted over the casing 1650 for powering the LEDs 1610. The power supply unit 1670 may comprise a LED driver in various embodiments. The LED driver may include a power converter for converting ac to dc, which is supplied to the LEDs 1610. Alternatively, the LED driver may comprise a down converter that down converts the voltage suitable for driving the LEDs 1610. For example, the down converter may down convert a dc voltage at a first level to a dc voltage at a second level that is lower than the first level. This is done so that large dc currents are not carried on the power cables. The LED driver is configured to provide a constant dc current to the LEDs 1610.

Examples of down converters (dc to dc converters) include linear regulators and switched mode converters such as buck converters. In further embodiments, the output from the power supply unit 1670 is isolated from the input power. Accordingly, in various embodiments, the power supply unit 1670 may comprise a transformer. As a further example, in one or more embodiments, the power supply unit 1670 may comprise forward, half-bridge, full-bridge, or push-pull topologies.

The power supply unit 1670 may be placed inside a faraday cage to minimize RF interference to other components. The LED driver of the power supply unit 1670 may also include a control loop for controlling the output current. In various embodiments, the display panel 1350 is sealed to an IP 67 standard. As discussed herein, other ratings are possible.

FIG. 24B illustrates a system diagram schematic of the display panel in accordance with an embodiment of the present invention.

Referring to FIG. 24B, a data and power signal received at the input cable 1360 is processed at an interface circuit 1651. The incoming power is provided to the LED driver 1653. Another output from the incoming power is provided to the output cable 1365. This provides redundancy so that even if a component in the display panel 1350 is not working, the output power is not disturbed. Similarly, the output cable 1365 includes all the data packets being received in the input cable 1360.

The interface circuit 1651 provides the received data packets to the graphics processor 1657 through a receiver bus 1654. In some embodiments, the interface circuit 1651 provides only the data packets intended for the display panel 1350. In other embodiment, the interface circuit 1651 provides all incoming data packets to the graphics processor 1657. For example, the graphics processor 1657 may perform any decoding of the received media. The graphics processor 1657 may use the buffer memory 1655 or frame buffer as needed to store media packets during processing.

A scan controller 1659, which may include an address decoder, receives the media to be displayed and identifies individual LEDs in the LEDs 1610 that need to be controlled. The scan controller 1659 may determine an individual LED's color, brightness, refresh time, and other parameters associated to generate the display. In one embodiment, the scan controller 1659 may provide this information to the LED driver 1653, which selects the appropriate current for the particular LED.

Alternatively, the scan controller 1659 may interface directly with the LEDs 1610 in one embodiment. For example, the LED driver 1653 provides a constant current to the LEDs 1610 while the scan controller 1659 controls the select line needed to turn ON or OFF a particular LED. Further, in various embodiments, the scan controller 1659 may be integrated into the LED driver 1653.

FIG. 24C illustrates a schematic of the LED array as controlled by the receiver circuit in accordance with an embodiment of the present invention.

Referring to FIG. 24C, the row selector 1661 and column selector 1662, which may be part of the circuitry of the scan controller 1659 described previously, may be used to control individual pixels in the array of the LEDs 1610. For example, at each pixel location, the color of the pixel is selected by powering one or more combinations of red, blue, green, and white LEDs. The row selector 1661 and column selector 1662 include control circuitry for performing this operation as an example.

Figure 25A:
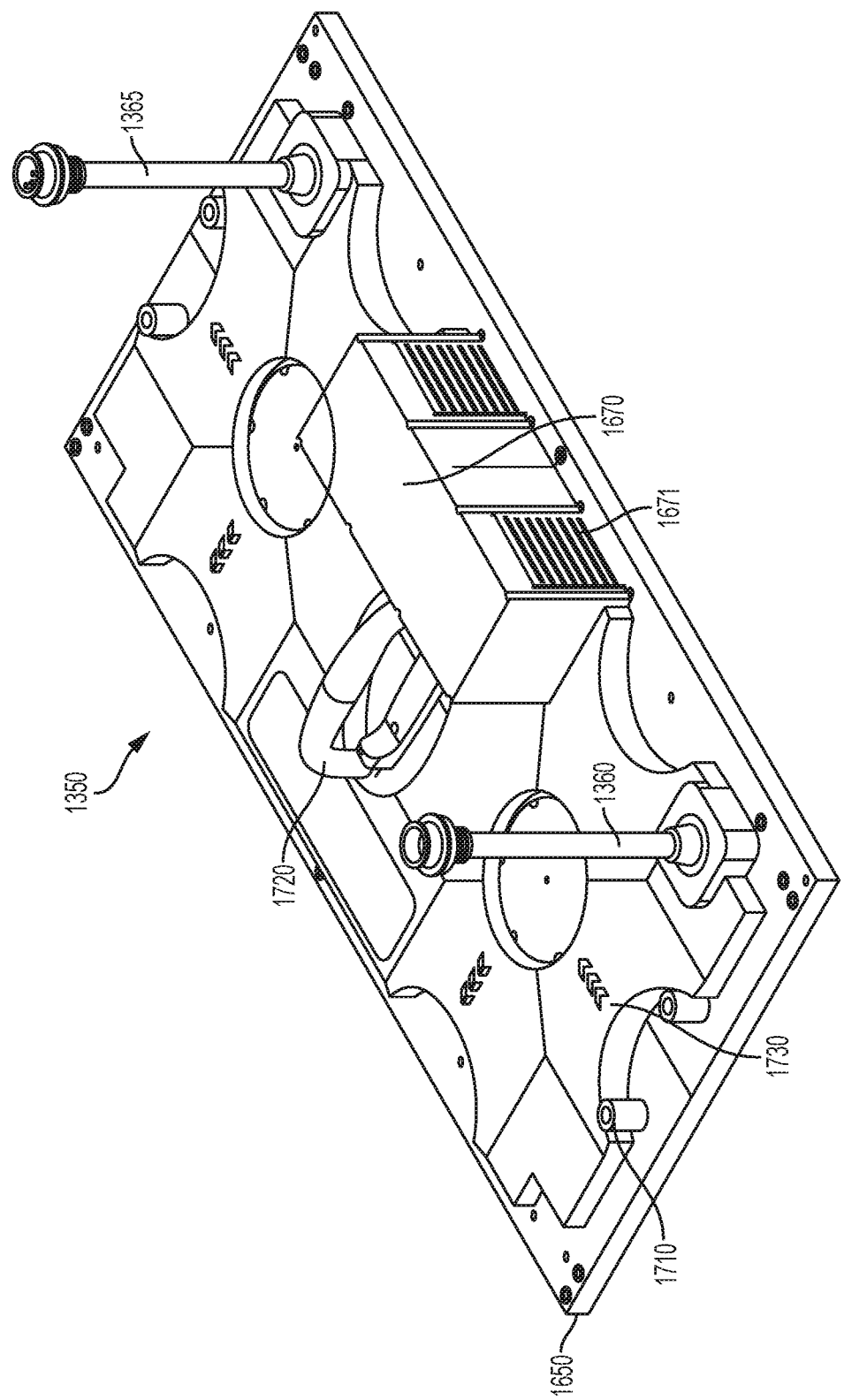

FIG. 25, which includes FIGS. 25A-25D, illustrates a display panel in accordance with an embodiment of the present invention.

FIG. 25A illustrates a projection view of the back side of the display panel, FIG. 25B illustrates a planar back side of the display panel, and FIG. 25C illustrates a planar bottom view while FIG. 25D illustrates a side view.

Referring to FIG. 25A, the display panel 1350 comprises a casing 1650, which includes casing holes 1710 for attaching the attachment features 1490 (e.g., FIG. 14) and openings for the input cable 1360 and the output cable 1365.

A power supply unit 1670 is mounted over the casing 1650 and protrudes away from the back side. The casing 1650 may also include stacking features 1730 that may be used to stack the display panels 1350 correctly. For example, the stacking features 1730 may indicate the path in which data cables are moving and which end of the casing 1650, if any, has to placed pointing up. The casing 1650 may further include a handle 1720 for lifting the display panel 1350.

The housing of the power supply unit 1670, which may be made of plastic, may include fins 1671 for maximizing heat extraction from the power supply unit 1670. The power supply unit 1670 may be screwed into the casing 1650.

Figure 26:
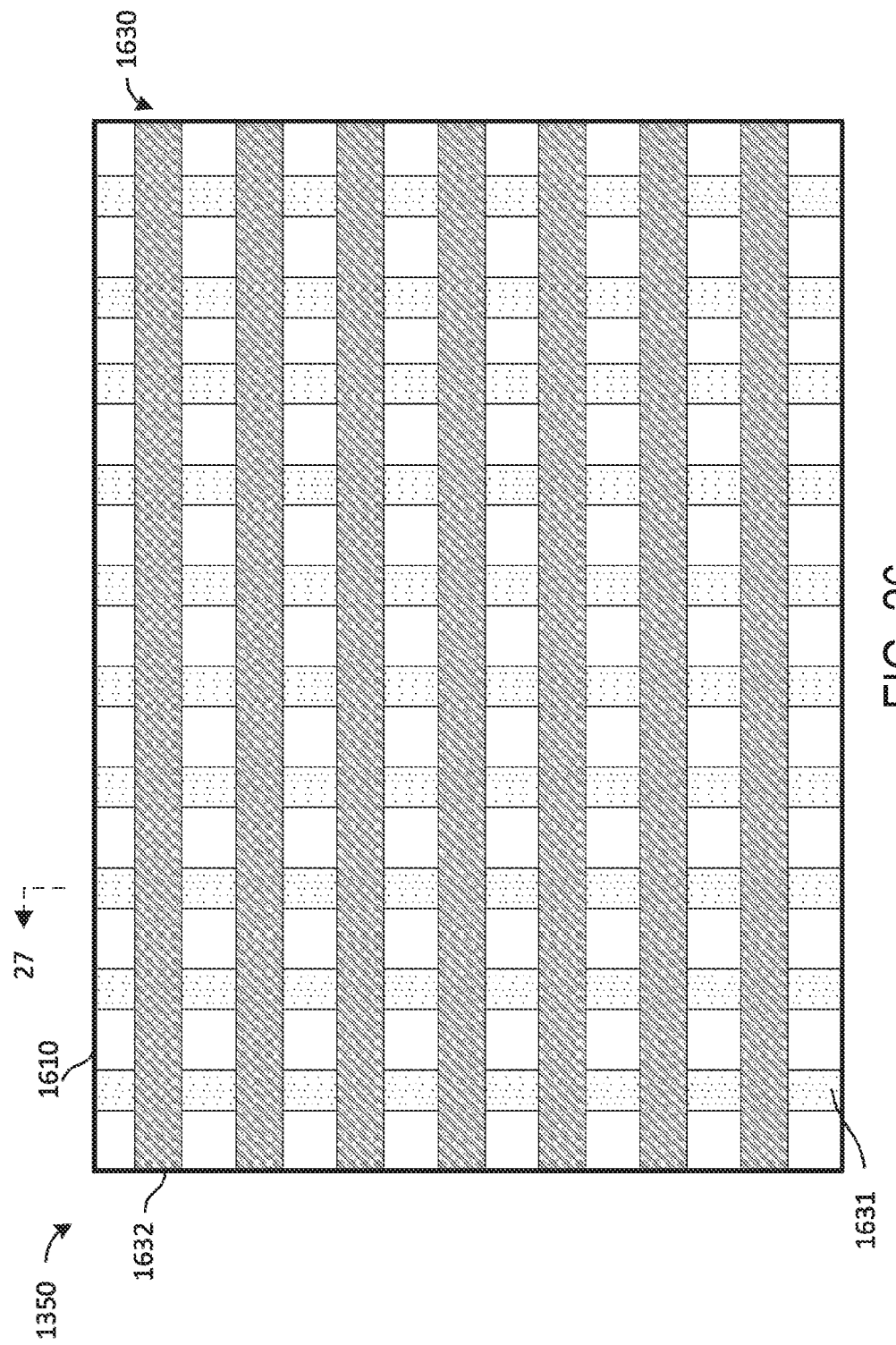
FIG. 26 illustrates a planar view of a portion of the front side of the display panel in according with an embodiment of the present invention.

FIG. 26 illustrates a planar view of a portion of the front side of the display panel in according with an embodiment of the present invention.

Referring to FIG. 26, a plurality of LEDs 1610 is exposed between the framework of louvers 1630 comprising a plurality of support strips 1631 and a plurality of ridges 1632. The plurality of support strips 1631 and the plurality of ridges 1632 are attached to the PCB below using an adhesive as described previously. The framework of louvers 1630 may also be screwed at the corners or spaced apart distances to provide improved mechanical support and mitigate issues related to adhesive peeling.

The display panel discussed thus far has the advantage of being self-cooling, waterproof and light-weight. A plastic material, e.g., an industrial plastic, can be used for the housing. Within the housing, the LED board (or boards) are enclosed without any significant air gaps (or no air gaps at all). In some embodiments, a heat conductive material can be attached to both the back of the LED board and the inner surface of the housing to facilitate heat transfer. This material can be a thermally conductive sheet of material such as a metal (e.g., an aluminum plate) and/or a thermal grease.

The power supply is mounted outside the LED board housing and can also be passively cooled. As discussed herein, a thermally conductive material can be included between the power supply and the LED board, e.g., between the power supply housing and the LED panel enclosure. A thermally conductive material could also line some or all of the surfaces of the power supply housing.

Figure 40A:
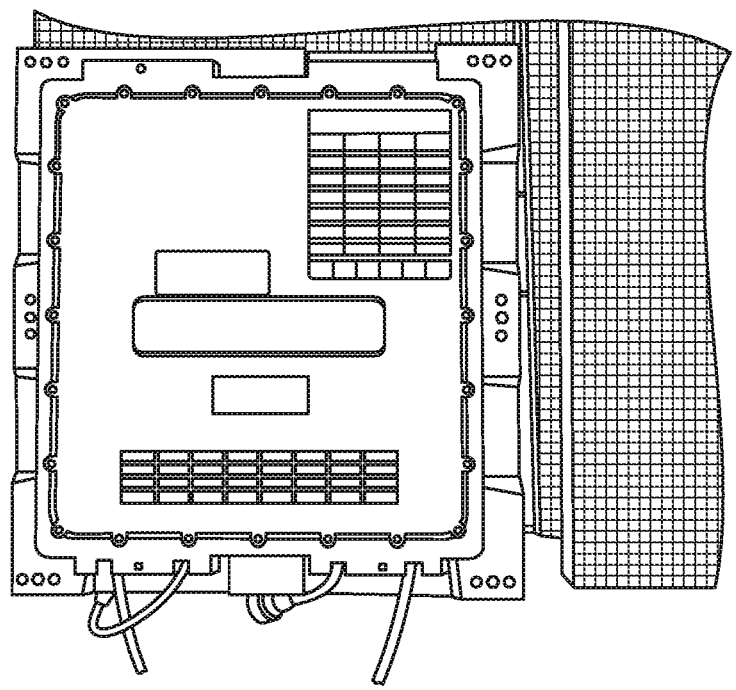
FIGS. 40A and 40B illustrate a lower cost panel that can be used with embodiments of the invention.
Figure 40B:
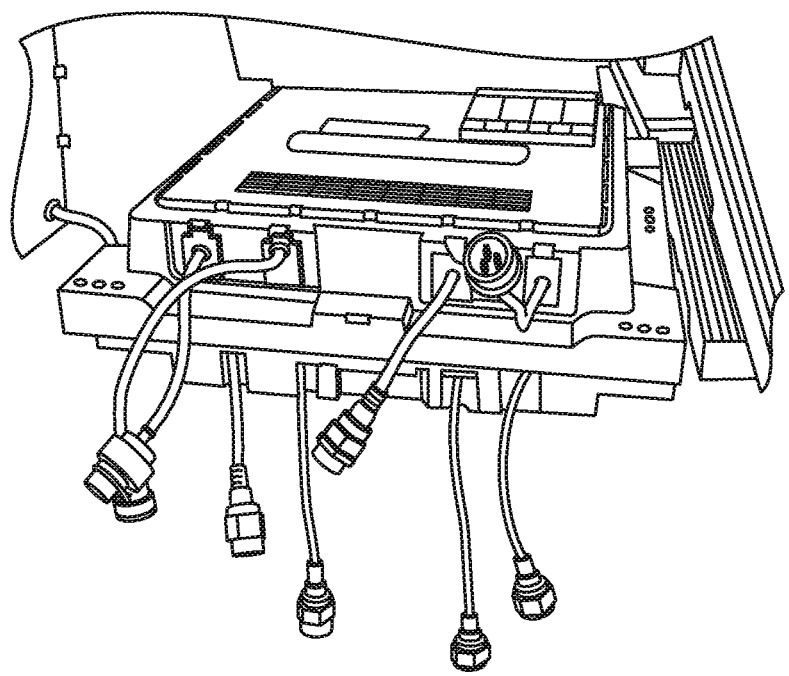

While the discussion thus far has related to the self-cooling panel, it is understood that many of the embodiments discussed herein also applied to fan-cooled assemblies. Two views of a fan cooled display panel are shown in FIGS. 40A and 40B. As an example, these panels can be mounted as disclosed with regard to FIG. 14 as well as the other embodiments. Other features described herein could also be used with this type of a display panel.

Figure 27A:
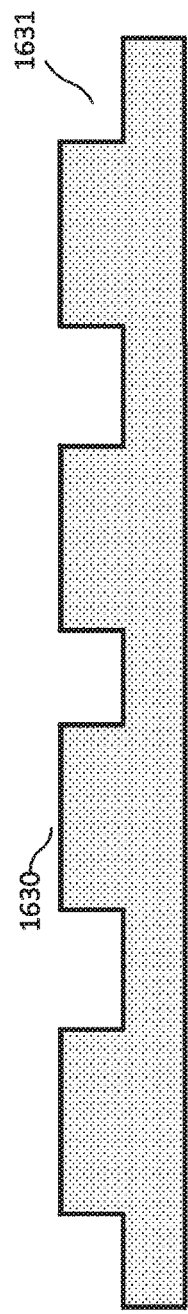
Figure 27B:
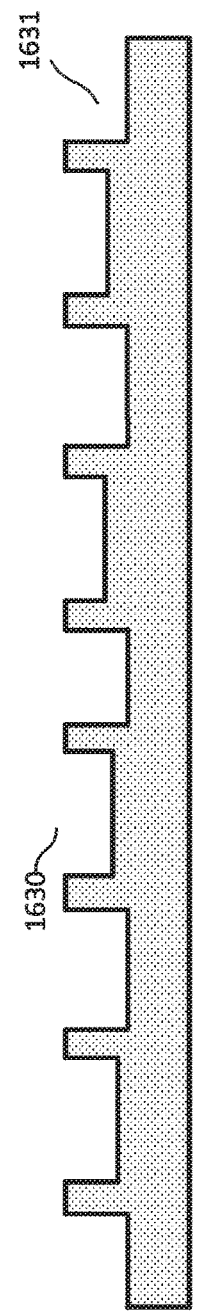
Figure 27C:
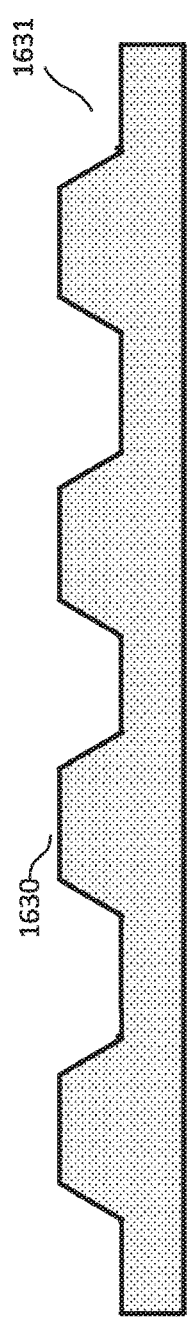

FIG. 27, which includes FIGS. 27A-27C, illustrates cross-sectional views of the framework of louvers at the front side of the display panel in accordance with an embodiment of the present invention. FIG. 27 illustrates a cross-sectional view along a direction perpendicular to the orientation of the plurality of ridges 1632 along the line 27-27 in FIG. 26.

In various embodiments, the plurality of ridges 1632 have a higher height than the plurality of support strips 1631. Horizontally oriented plurality of ridges 1632 may be advantageous to remove or block water droplets from over the LEDs 1610.

The relative height differences between the plurality of support strips 1631 and the plurality of ridges 1632 may be adjusted depending on the particular mounting location in one embodiment. Alternatively in other embodiments, these may be independent of the mounting location.

The sidewalls and structure of the plurality of ridges 1632 may be adjusted depending on various lighting conditions and need to prevent water from accumulating or streaking over the LEDs 1610. FIG. 27A illustrates a first embodiment in which the sidewalls of the plurality of ridges 1632 are perpendicular. FIG. 27B illustrates a second embodiment in which the sidewalls of the plurality of ridges 1632 are perpendicular but the inside of the plurality of ridges 1632 is partially hollow enabling ease of fabrication. FIG. 27C illustrates a different embodiment in which the sidewalls of the plurality of ridges 1632 are angled, for example, to prevent from other sources scattering of the LEDs 1610 and generating a diffuse light output.

Figure 28:
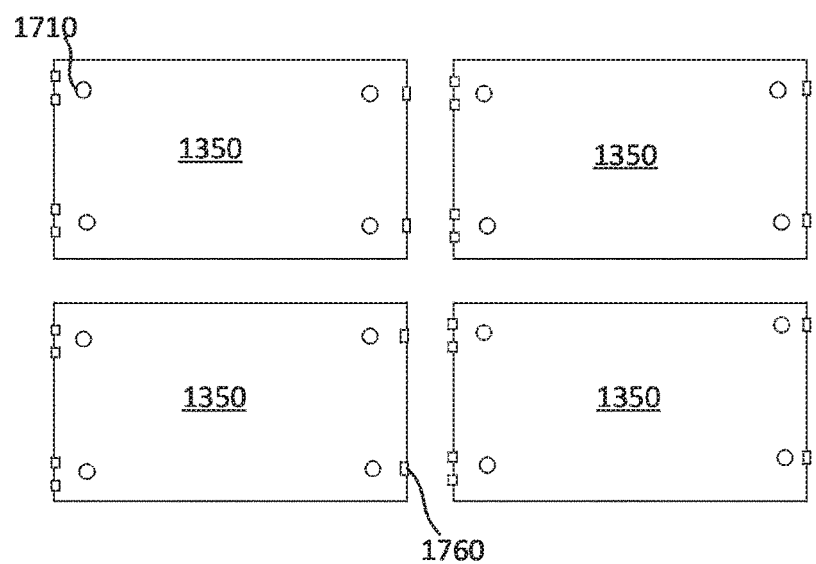
FIG. 28 illustrates a plurality of display panels arranged next to each other in accordance with embodiments of the present invention.

FIG. 28 illustrates a plurality of display panels arranged next to each other in accordance with embodiments of the present invention.

In addition to the features described previously, in one or more embodiments, the display panels may include locking features 1760 such as tabs and other marks that may be used to correctly align the display panels precisely. For example, the locking features 1760 may comprise interlocking attachment points that are attached to an adjacent LED display panel.

Figure 29A:
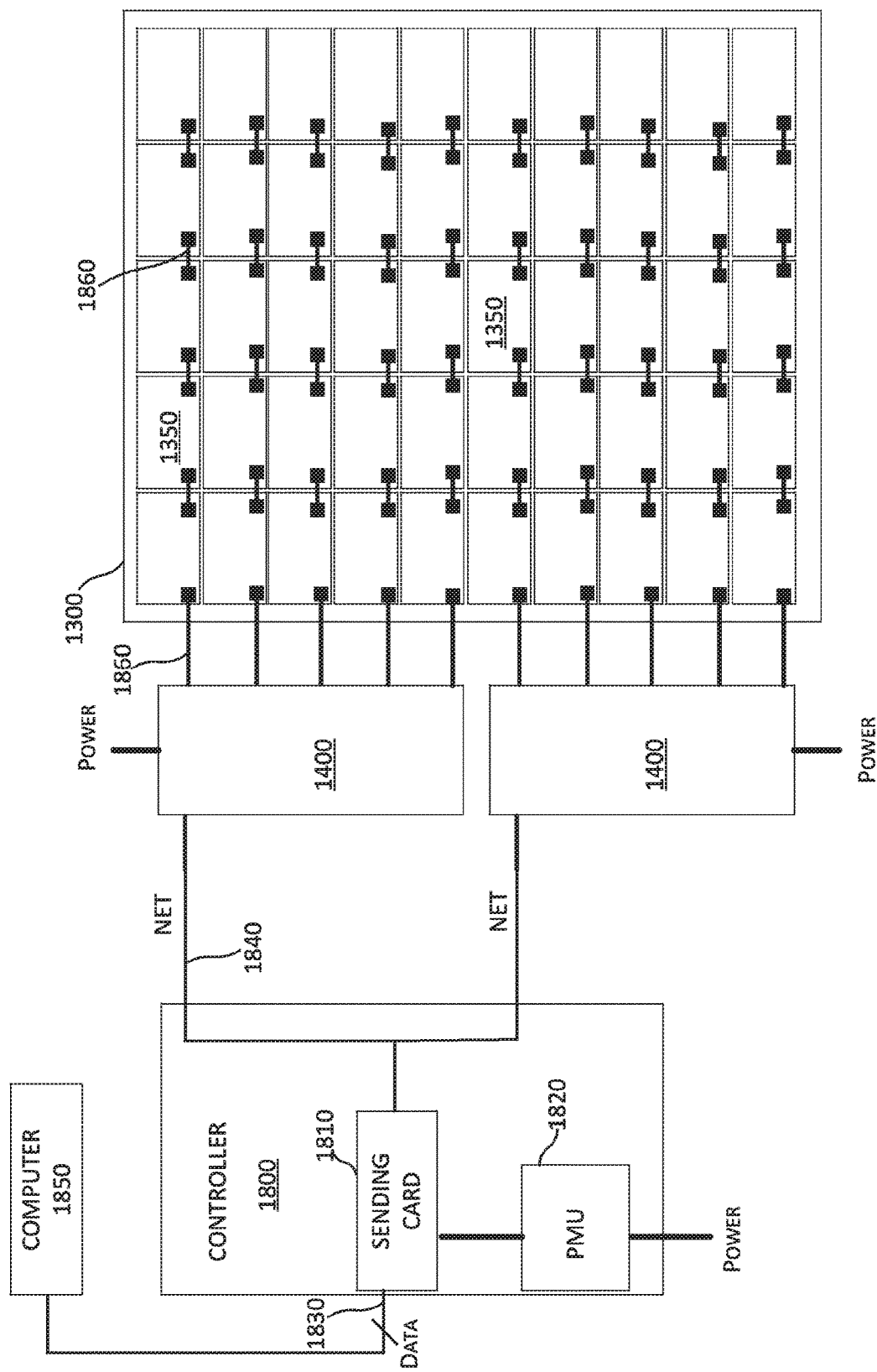
Figure 29B:
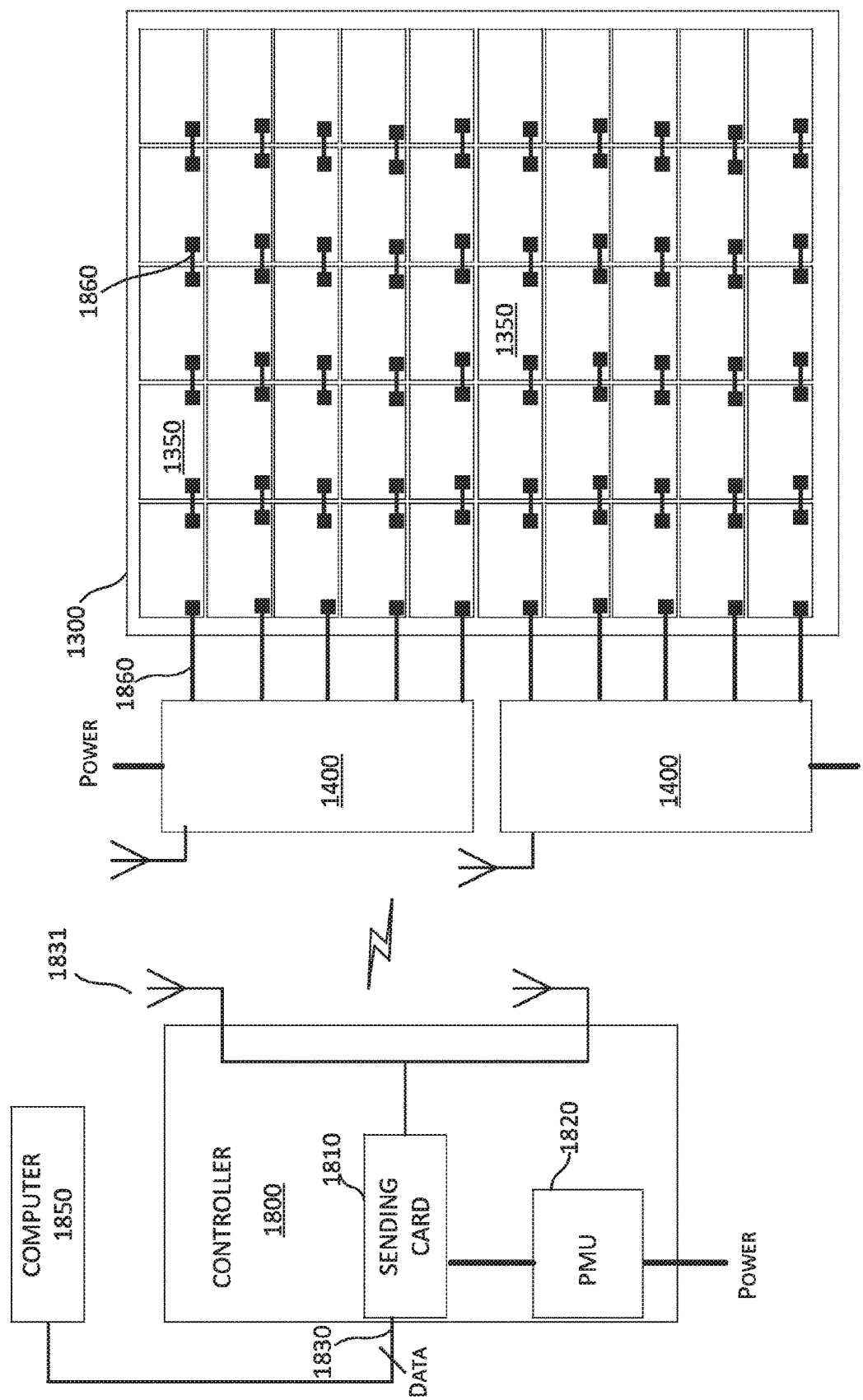
Figure 29C:
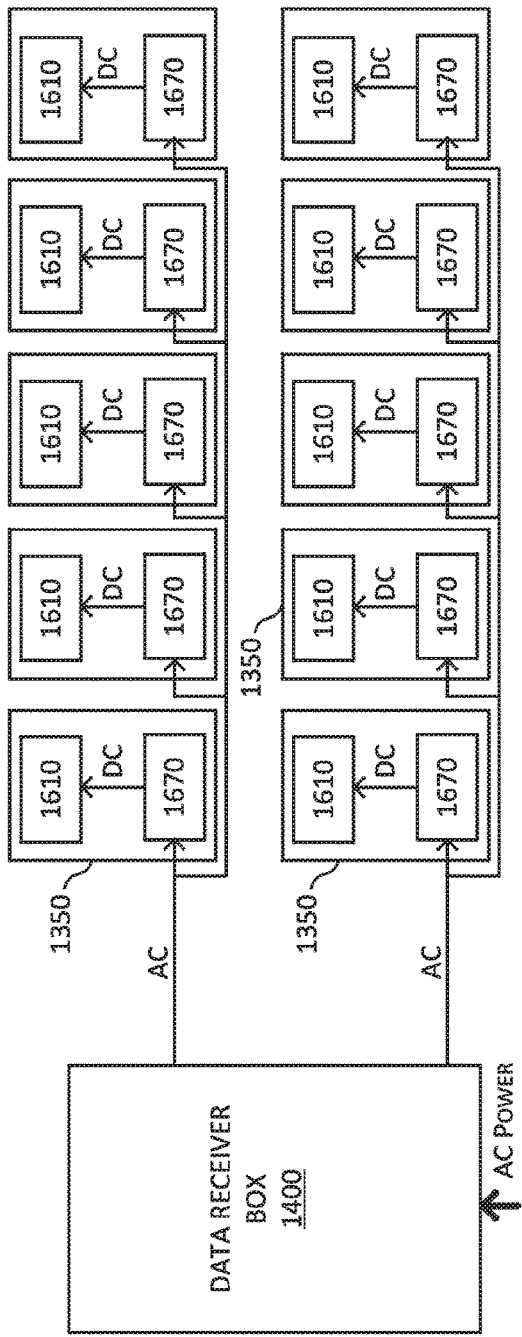
Figure 29D:
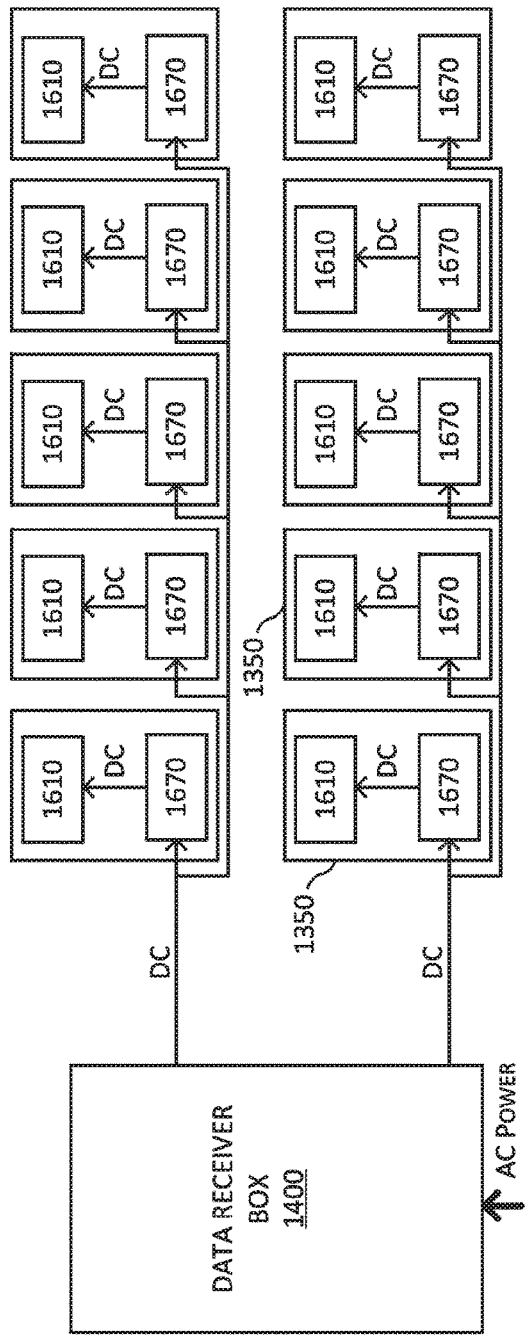

FIGS. 29A-29D illustrate a schematic of a control system for a modular multi-panel display system in accordance with an embodiment of the present invention. FIG. 29A illustrates a controller connected to the receiver box through a wired network connection. FIG. 29B illustrates a controller connected to the receiver box through a wireless network connection. FIGS. 29C and 29D illustrate the power transmission scheme used in powering the modular multi-panel display system.

Data to be displayed at the multi-panel display system may be first received from a computer 1850, which may be a media server, at a controller 1800. The controller 1800, which may also be part of the media server, may transmit the data to be displayed to one or more data receiver boxes 1400. A very large display may include more than one receiver box 1400. The data receiver boxes 1400 receive the data to be displayed from the controller 1800, and distribute it across to the multiple display panels.

As described previously, a data receiver box 1400 is mounted to the mechanical support structure or frame 1310. The data receiver box 1400 is configured to receive data from a controller 1800 and to provide power, data, and communication to the LED display panels 1350 through integrated power and data cables 1860. The input cable 1360 and the output cable 1365 in FIG. 18 are specific applications of the integrated power and data cables 1860 illustrated in FIGS. 29A and 29B. The data receive box 1400 can eliminate the need for a receiver card in each panel. In other words, the panels of certain embodiments include no receiver card.

The controller 1800 may be a remotely located or located on-site in various embodiments. The controller 1800 is configured to provide data to display to the data receiver box 1400. The output of the controller 1800 may be coupled through a network cable 1840 to the data receiver box 1400. The data receiver box 1400 is housed in a housing that is separate from housings of each of the LED display panels 1300 (for example, FIG. 14). Alternatively, the output of the controller 1800 may be coupled to an ingress router of the internet and the data receiver box 1400 may be coupled to an egress router if the controller 1800 is located remotely.

Referring to FIG. 29A, the controller 1800 comprises a sending card 1810 and a power management unit (PMU) 1820. The PMU 1820 receives power and provides operating voltage to the sending card 1810. The sending card 1810 receives data through data cables and provides it to the output. The sending card 1810 may comprise receiver and transmitter circuitry in various embodiments for processing the received video, up-converting, and down converting. In one or more embodiments, the sending card 1810 may be configured to receive data from the respective data receiver box 1400. The sending card 1810 may communicate with the data receiver box 1400 using an internet communication protocol such as Transmission Control Protocol and/or the Internet Protocol (TCP/IP) protocol in one embodiment. Alternatively, other suitable protocols may be used. In some embodiments, the communication between the sending card 1810 and the data receiver box 1400 may be performed using a secure protocol such as SSH or may be encrypted in other embodiments.

FIG. 29B illustrates a controller connected to the receiver box through a wireless network connection in which the data to be displayed is transmitted and received using antennas 1831 at the controller 1800 and the data receiver box 1400.

The data input 1830 may be coupled to a computer 1850, for example, to a USB or DVI output. The computer 1850 may provide data to the sending card 1810, for example, through the USB and/or DVI output.

The data receiver box 1400 connects the LED display panels with data to be displayed on the integrated display and with power to power each of the LED display panels 1350. The data receiver box 1400 may transmit the media or data to be displayed in a suitable encoded format. In one or more embodiments, the data receiver box 1400 transmits analog video. For example, in one embodiment, composite video may be outputted by the data receiver box 1400. Alternatively, in one embodiment, YPbPr analog component video may be outputted by the data receiver box 1400.

Alternatively, in some embodiments, the data receiver box 1400 transmits digital video. The output video comprises video to be displayed encoded in a digital video format by each of the display panels under the data receiver box 1400.

In one or more embodiments, the data receiver box 1400 creates multiple outputs, where each output is configured for each panel under its control. Alternatively, the display panels 1350 may be configured to decode the received data and select and display only the appropriate data intended to be displayed by that particular display panel 1350.

FIGS. 29C and 29D illustrate the power transmission scheme used in powering the modular multi-panel display system.

FIG. 29C illustrates the power conversion at the data receiver box 1400 produces a plurality of AC outputs that is transmitted to all the display panels. All the display panels 1350 on the same row receive output from the same AC output whereas display panels 1350 on a different row receive output from the different AC output. The power supply unit 1670 converts the received AC power to a DC current and supplies it to the LEDs 1610.

FIG. 29D is an alternative embodiment in which the AC to DC conversion is performed at the data receiver box 1400. The power supply unit 1670 down converts the received voltage from a higher voltage to a lower voltage.

In either of the power transmission embodiments, the power line can be configured so that power is run across all of the row (or any other group of panels). In this manner, if the power supply of any one of the panels fails, the other panels will continue to operate. One way to assist in the maintenance of the display system is to monitor the power at each panel to determine if any of the panels has failed.

Figure 30:
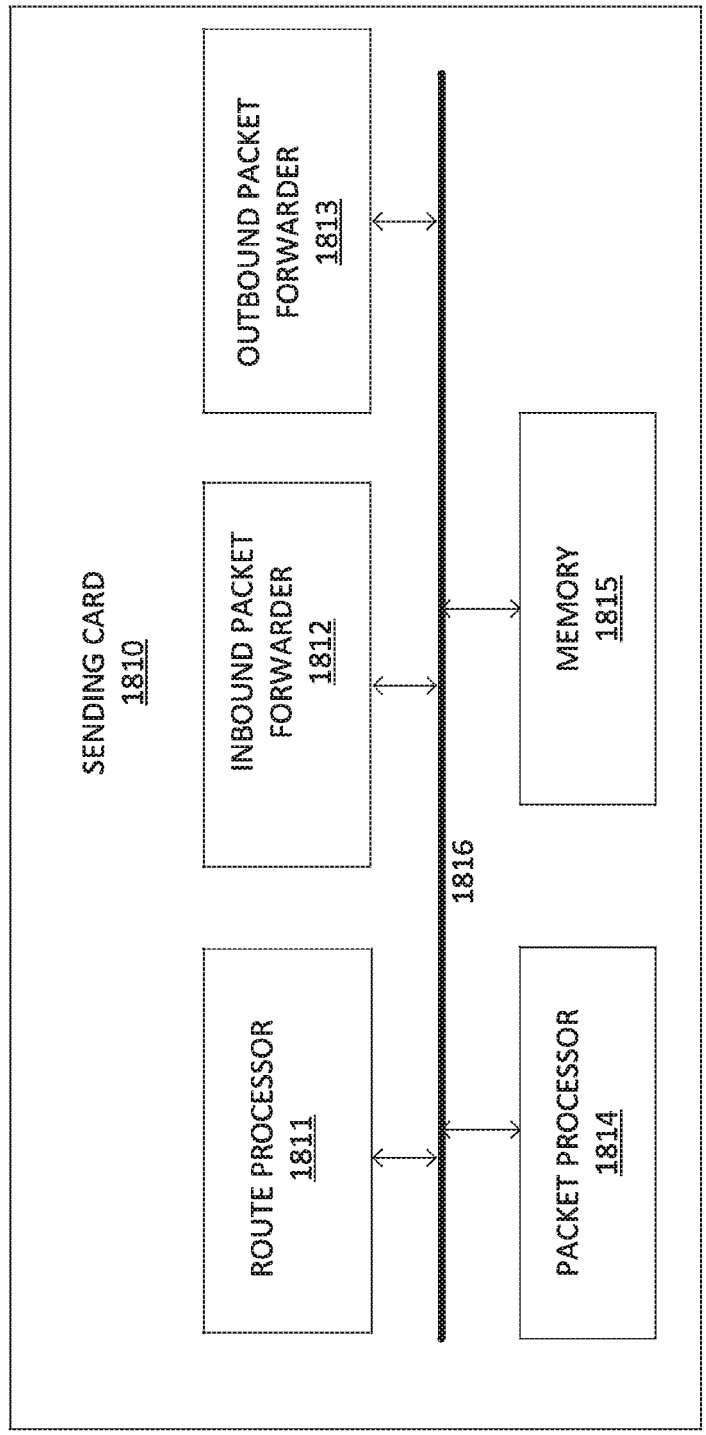
FIG. 30 illustrates a schematic of a sending card of the control system for modular multi-panel display system in accordance with an embodiment of the present invention.

FIG. 30 illustrates a schematic of a sending card of the control system for modular multi-panel display system in accordance with an embodiment of the present invention.

The sending card 1810 may include an inbound network interface controller, a processor for processing, an outbound network interface controller for communicating with the data receiver boxes 1400 using a specific physical layer and data link layer standards. Display packets (media packaged as data packets intended for display) received at the inbound network interface controller may be processed at the processor and routed to the outbound network interface controller. The display packets may be buffered in a memory within the sending card 1810 if necessary. As an illustration, the processor in the sending card 1810 may perform functions such as routing table maintenance, path computations, and reachability propagation. The inbound network interface controller and the outbound network interface controller include adapters that perform inbound and outbound packet forwarding.

As an illustration, the sending card 1810 may include a route processor 1811, which is used for computing the routing table, maintenance using routing protocols, and routing table lookup for a particular destination.

The sending card 1810 further may include multiple interface network controllers as described above. As an example, the inbound network interface controller may include an inbound packet forwarder 1812 to receive the display packet at an interface unit while the outbound network interface controller may include an outbound packet forwarder 1813 to forward the display packet out of another interface unit. The circuitry for the inbound packet forwarder 1812 and the outbound packet forwarder 1813 may be implemented separately in different chips or on the same chip in one or more embodiments.

The sending card 1810 also includes an optional packet processor 1814 for performing non-routing functions relating to the processing of the packet and a memory 1815, for example, for route caching. For example, the packet processor 1814 may also perform media encoding in some embodiments. Additionally, in some embodiments, the sending card 1810 may include a high performance switch that enables them to exchange data and control messages between the inbound and the outbound network interface controllers. The communication between the various components of the sending card 1810 may be through a bus 1816.

Figure 31:
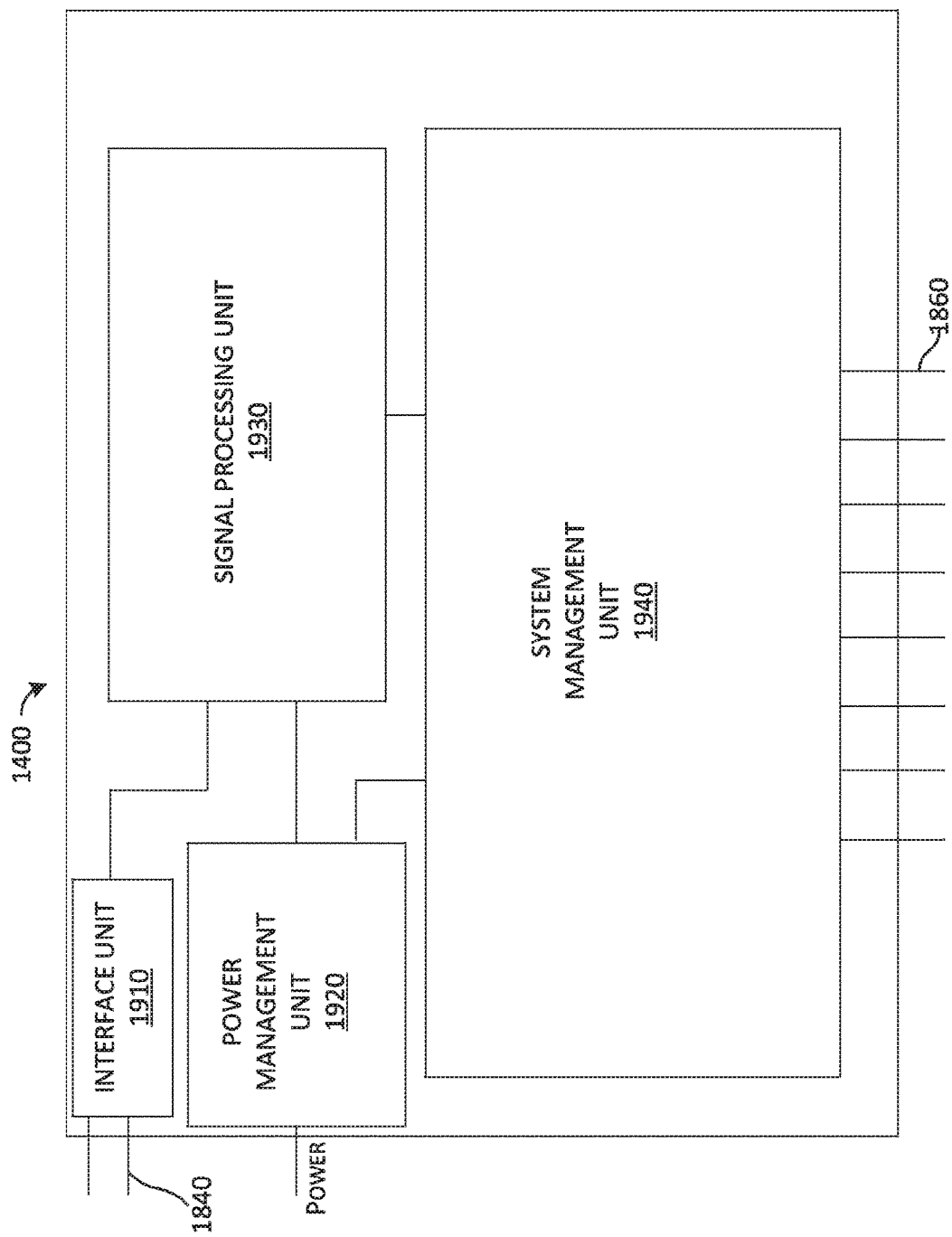
FIG. 31 illustrates a schematic of a data receiver box for modular multi-panel display system in accordance with an embodiment of the present invention.

FIG. 31 illustrates a schematic of a data receiver box for modular multi-panel display system in accordance with an embodiment of the present invention.

Referring to FIG. 31, a large multi-panel display modular system 1300 may include multiple data receiver boxes 1400 for displaying portions of the multi-panel modular display system 1300. The data receiver box 1400 receives the output of the controller 1800 through a network cable 1840. The data receiver box 1400 is configured to provide power, data, and communication to the LED display panels 1350 through integrated power and data cables 1860.

The data receiver box 1400 comprises an interface unit 1910 that receives the network data according to the internet protocol, e.g., TCP/IP. The data receiver box 1400 may include a designated IP address and therefore receives the output of the controller 1800 that is specifically sent to it. In case the controller 1800 and the data receiver box 1400 are part of the same local area network (LAN), the data receiver box 1400 may also receive data designated towards other similar data receiver boxes in the network. However, the interface unit 1910 is configured to select data based on the IP address and ignore data destined to other boxes. The interface unit 1910 includes necessary interface controllers, and may include circuitry for up-converting and down-converting signals.

The power management unit 1920 receives an ac input power for powering the data receiver box 1400 as well as the corresponding display panels 1350 that are controlled by the data receiver box 1400. In one embodiment, the power management unit 1920 comprises a switched mode power supply unit for providing power to the display panels 1350. The power management unit 1920 may be placed inside a faraday cage to minimize RF interference to other components. In various embodiments, the output from the power management unit 1920 is isolated from the input, which is connected to the AC mains. Accordingly, in various embodiments, the power management unit 1920 comprises a transformer. The primary side of the transformer is coupled to the AC mains whereas the secondary side of the transformer is coupled to the components of the data receiver box 1400. The power management unit 1920 may also include a control loop for controlling the output voltage. Depending on the output current and/or voltage, the primary side may be regulated.

As examples, in one or more embodiments, the power management unit 1920 may comprise flyback, half-bridge, full-bridge, or push-pull topologies.

The signal processing unit 1930 receives the media packets from the interface unit 1910. The signal processing unit 1930 may be configured to process media packets so as to distribute the media packets through parallel paths. In one or more embodiments, the signal processing unit 1930 may be configured to decode the media packets and encode them into another format, for example.

The system management unit 1940 receives the parallel paths of the media packets and combines with the power from the power management unit 1920. For example, the media packets destined for different rows of the display panels may be forwarded through different output paths using different integrated power and data cables 1860. The power for powering the display panels from the power management unit 1920 is also combined with the media packets and transmitted through the integrated power and data cables 1860.

Figure 32:
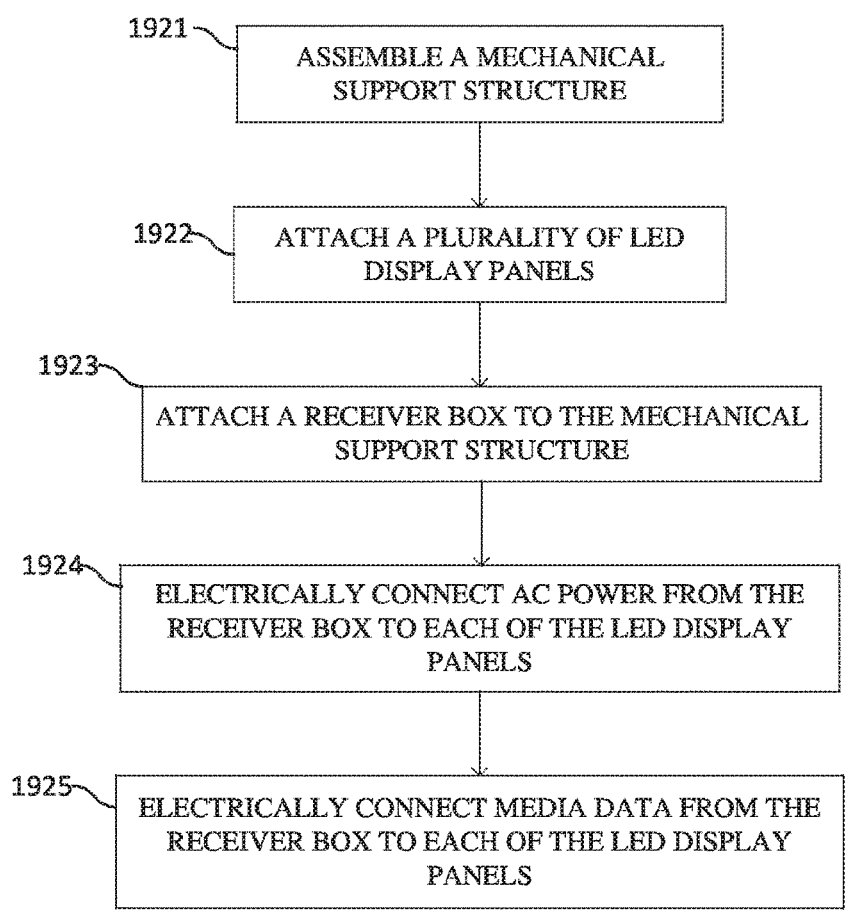
FIG. 32 illustrates a method of assembling a modular multi-panel display in accordance with an embodiment of the present invention.

FIG. 32 illustrates a method of assembling a modular multi-panel display in accordance with an embodiment of the present invention.

Referring to FIG. 32, a mechanical support structure such as a frame is assembled as described above in various embodiments (box 1921). A plurality of LED display panels is attached directly to the mechanical support structure using a plurality of coupling mechanisms (box 1922). A receiver box is attached to the mechanical support structure (box 1923). The receiver box includes power circuitry with an ac power input and an ac power output. The receiver box further includes digital circuitry configured to process media data to be displayed by the LED display panels. AC power from the receiver box is electrically connected to each of the LED display panels (box 1924). Media data from the receiver box is electrically connected to each of the LED display panels (box 1925). For example, a plurality of integrated data and power cables are interconnected.

FIGS. 33-37 illustrate particular embodiments relating to an integrated data and power cord for use with modular display panels.

Figure 33:
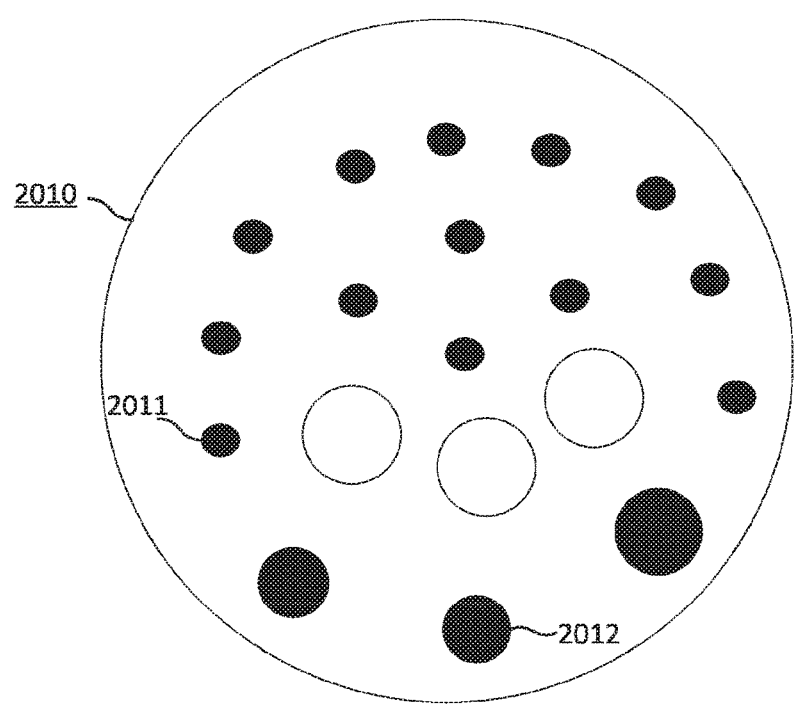
FIG. 33 illustrates a cross-sectional view of an integrated data and power cord in accordance with embodiments.

FIG. 33 illustrates a cross-sectional view of an integrated data and power cord in accordance with embodiments. For example, the integrated data and power cord may be used as the integrated power and data cable 1860 in FIGS. 29A and 29B and/or the input cable 1360 or the output cable 1365 in FIG. 18.

Referring to FIG. 33, the integrated power and data cable 1860 includes a first plurality of wires 2011 for carrying data and a second plurality of wires 2012 for carrying power. The power may be a/c or dc. The first plurality of wires 2011 may include twisted pair. The length of the first plurality of wires 2011 and the second plurality of wires 2012 may be controlled to prevent the signal propagation delay within each LED display panel within a specific time. The first plurality of wires 2011 may be configured to transport data at a high bit rate, e.g., at least 1 Mbit/s and may be 100-1000 Mbit/s. To minimize noise, the cable 2010 as a whole may be shielded or the first plurality of wires 2011 may be shielded separately. The shielding may be accomplished by a conductive outer layer formed around the first and the second plurality of wires 2011 and 2012.

Figure 34B:
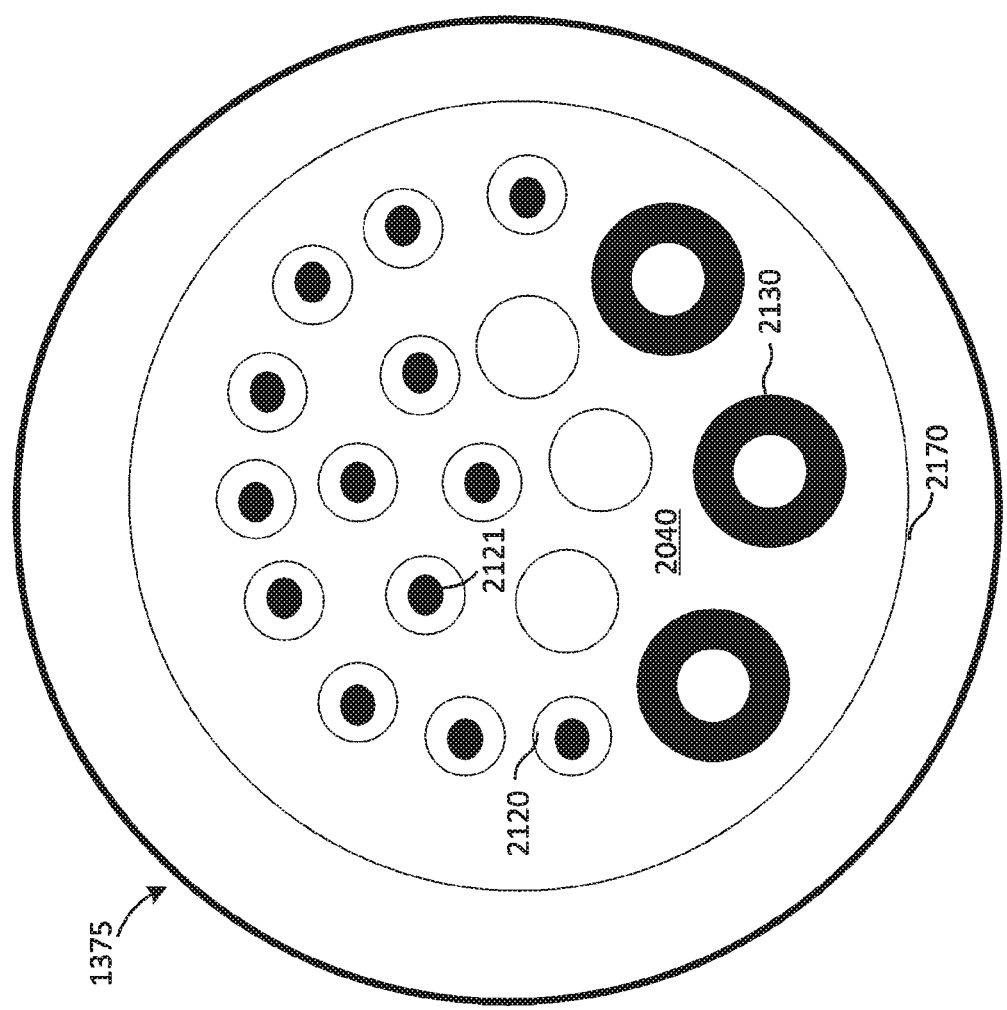

FIG. 34, which includes FIGS. 34A and 34B, illustrates cross-sectional views of connectors at the ends of the integrated data and power cable in accordance with embodiments of the present invention. FIG. 34A illustrates a first connector that is configured to fit or lock into a second connector illustrated in FIG. 34B. For example, the first connector 1370 and the second connector 1375 may be attached to corresponding input cable 1360 and output cable 1365 of the display panel 1350 as illustrated in FIG. 18.

In various embodiments, the endpoints of the input cable 1360 is opposite to the endpoints of the output cable 1365 so that they may be interlocked together or interlocked with an adjacent panel. For example, the endpoint of the integrated data and power input cable 1360 is interlocked with an endpoint of an integrated data and power output cable 1365 of an adjacent panel, for example, as illustrated in FIG. 19 and FIG. 20.

In one embodiment, a subset of the endpoints of the input cable 1360 is a male type pin while a remaining subset of the endpoints of the input cable 1360 is a female type pin. This advantageously allows the electrical connection to be made securely.

Referring to FIG. 34A, the first connector 1370 includes a plurality of first openings 2020 configured to receive a plurality of pins from another connector. The plurality of first openings 2020 comprises a conductive internal surface, which is a female pin, that is configured to establish an electrical contact with an incoming male pin. The first connector 1370 further includes a plurality of second openings 2030 configured to receive power male pins from another connector. Thus, the connector is designed to integrated power and data. The pins 2031 protrude out of the plurality of second openings 2030 and are configured to fit into corresponding openings (i.e., female pins) of another connector.

The diameters of the plurality of first openings 2020 and the plurality of second openings 2030 may be different to account for the different currents being carried through each.

The plurality of first openings 2020 and the plurality of second openings 2030 are formed inside a first protruding section 2070 that is configured to lock inside a second protruding section 2170 of another connector. The enclosing material 2040 provide insulation and protection against external elements such as water.

A sealing cover 1380 is configured to lock with the another connector and configured to prevent moisture from reaching inside the connector As further illustrated in FIG. 34B, the second connector 1375 is configured to receive a connector similar to the first connector 1370. Thus, the pins 2121 of the second connector 1375 are configured to fit into the corresponding first openings 2020 of the first connector 1370. The plurality of first openings 2120 may be optional and may not be used in some embodiments. Similarly, the plurality of second openings 2130 of the second connector 1375 comprises a conductive internal surface, which is a female pin, that is configured to establish an electrical contact with an incoming male pin.

Similar to FIG. 34A, the plurality of first openings 2020 and the plurality of second openings 2030 of the second connector 1375 in FIG. 34B are formed inside a second protruding section 2170 that is configured to lock with the first protruding section 2070 of another connector.

FIG. 35, which includes FIGS. 35A and 35B, illustrates cross-sectional views showing the first connector locked with the second connector in accordance with embodiments of the present invention. FIG. 35A illustrates the first connector aligned to the second connector, while FIG. 35B illustrates the first connector securely locked to the second connector with the sealing cover sealing the connectors.

Referring to FIG. 35A, the plurality of first openings 2020, pins 2031 are connected to corresponding to first and the second plurality of wires 2011 and 2012 respectively. As illustrated, the electrical pins/openings of the first connector 1370 are configured to be lock with the electrical pins/openings of the second connector 1375. Further, there may be additional mechanical locking points to secure the two connectors. In one embodiment, the first connector 1370 comprises a concentric opening 2041 configured to fit in a locking position with the concentric ring 2042 on the second connector 1375.

As illustrated in FIG. 35B, the first protruding section 2070 is disposed inside the second protruding section 2170 when locked. The sealing cover 1380 is moveable seals over the first and the second protruding sections 2070 and 2170 thereby preventing any moisture from entering into the connectors. The sealing cover 1380 may be able to screw over a portion of the second connector 1375 in the direction indicated by the arrow in FIG. 35B in one embodiment.

Figure 36A:
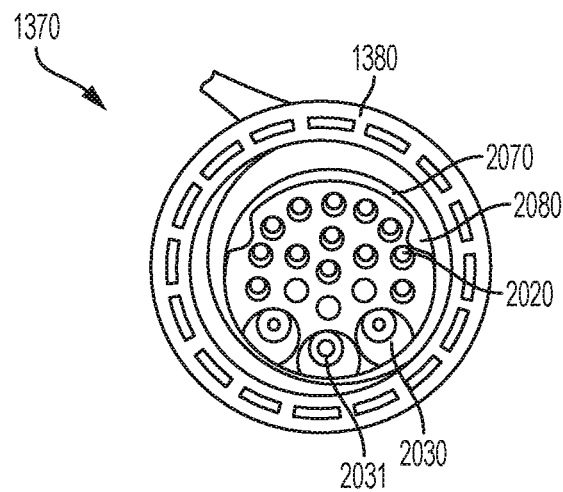
Figure 36B:
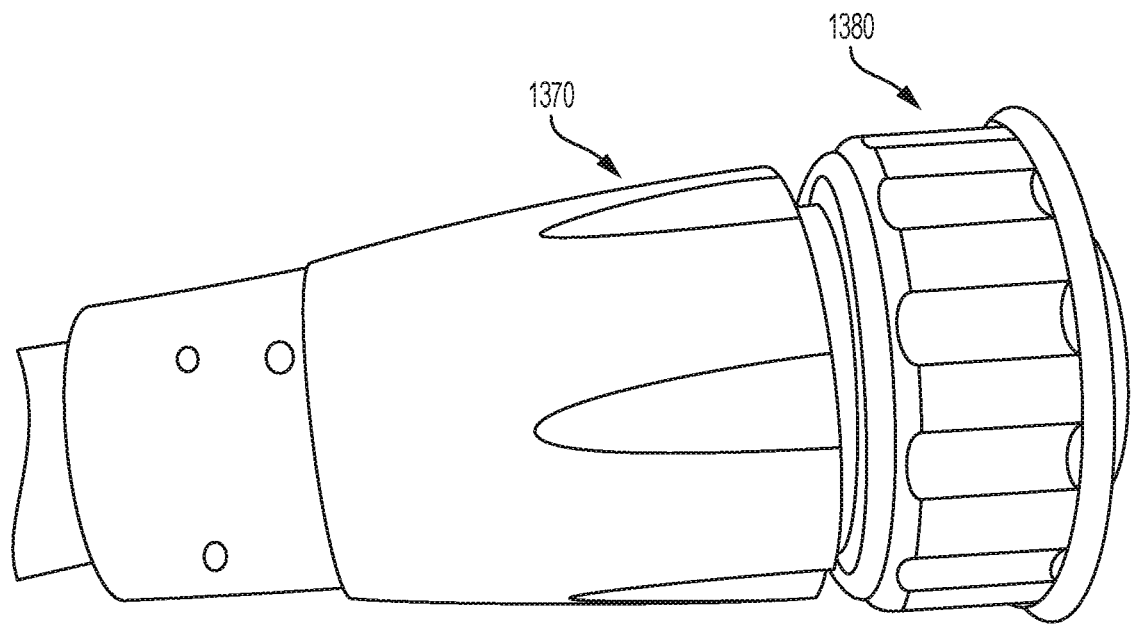

FIG. 36, which includes FIGS. 36A and 36B, illustrates one embodiment of the first connector previously illustrated in FIG. 34A and FIGS. 35A and 35B. FIG. 36A illustrates a planar top view while FIG. 36B illustrates a projection view.

Figure 37A:
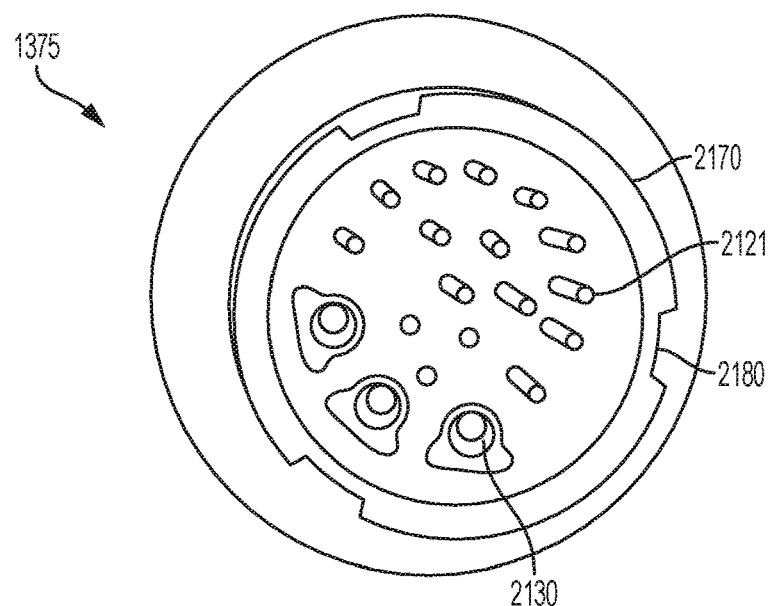
Figure 37B:
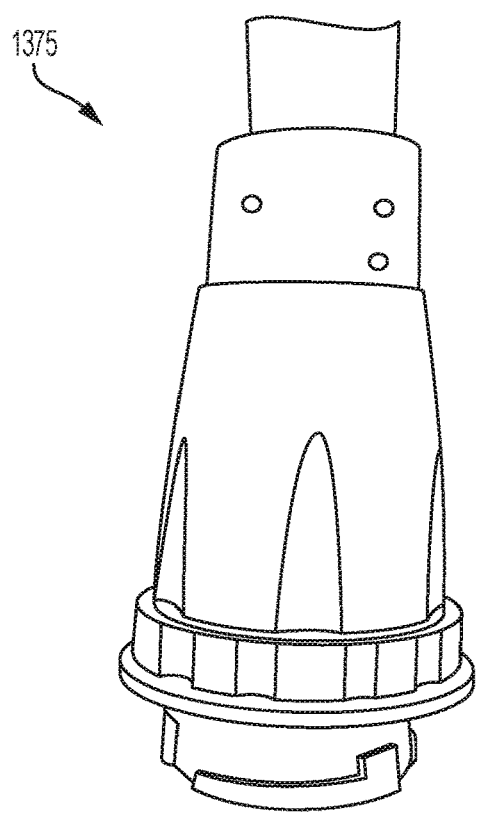

FIG. 37, which includes FIGS. 37A and 37B, illustrates one embodiment of the second connector previously illustrated in FIG. 34B and FIGS. 35A and 35B. FIG. 37A illustrates a planar top view while FIG. 37B illustrates a projection view.

Referring to FIGS. 36 and 37, besides the features previously discussed, embodiments of the present invention may also radial alignment features for radially aligning the first connector 1370 with the second connector 1375. FIG. 36A illustrates a first type of radial alignment features 2080 while FIG. 37A illustrates a second type of radial alignment features 2180. The first type of radial alignment features 2080 is configured to correctly align with the second type of radial alignment features 2180.

Although the preferred embodiment has been described in detail, it should be understood that various changes, substitutions and alterations can be made therein without departing from the spirit and scope of the invention as defined by the appended claims.

What is claimed is:

1. A modular display panel comprising:
   a printed circuit board having a first side and an opposite second side;
   a casing comprising a thermally conductive material, the casing being disposed at the opposite second side of the printed circuit board,
      wherein the casing contacts the opposite second side of the printed circuit board
      wherein the casing comprises plastic sidewalls and a plastic back wall substantially similar in area to the opposite second side of the printed circuit board, and
      wherein the plastic back wall of the casing comprises a first outer surface of the modular display panel;
   a driver circuit disposed in the casing at the opposite second side of the printed circuit board, the driver circuit electrically coupled to the printed circuit board;
   a plurality of light emitting diodes (LEDs) arranged as pixels and attached to the first side of the printed circuit board, wherein the pixels are arranged in a rectangular array comprising at least fifty pixels;
   a power supply housing mounted over the first outer surface of the casing, the power supply housing comprising sidewalls, a front wall, and an opposing back wall that is a second outer surface of the modular display panel;
   a power supply for powering the plurality of LEDs, the power supply being disposed in the power supply housing, wherein the power supply comprises a power converter for converting alternating current (AC) power to direct current (DC) power, wherein a combination of the sidewalls, front wall, and opposing back wall of the power supply housing encloses the power supply on all sides, and wherein both a first portion of the casing and a second portion of the power supply housing are disposed between the printed circuit board and the power supply;
   a heat conducting structure configured to extract heat disposed proximate to the power supply;
   a plurality of louvers attached to the first side of the printed circuit board;

a potting material disposed at the first side of the printed circuit board; and wherein the modular display panel is sealed to be waterproof.

2. The panel of claim 1, wherein the heat conducting structure comprises the same material as the thermally conductive material.

3. The panel of claim 1, wherein the heat conducting structure comprises a different material than the thermally conductive material.

4. The panel of claim 1, wherein the power supply housing forms a power supply unit, wherein the power supply unit protrudes from the plastic back wall of the casing along a direction opposite a display side of the modular display panel, and wherein the power supply housing comprises the heat conducting structure.

5. The panel of claim 4, wherein the power supply housing comprises fins for extracting heat from the power supply.

6. The panel of claim 1, wherein the power supply is disposed inside a cage, wherein the cage comprises the heat conducting structure.

7. The panel of claim 1, wherein the modular display panel comprises an ingress protection (IP) rating of at least IP 65.

8. The panel of claim 1, wherein the modular display panel comprises an ingress protection (IP) rating of at least IP 66.

9. The panel of claim 1, wherein the modular display panel comprises an ingress protection (IP) rating of IP 68.

10. The panel of claim 1, wherein the thermally conductive material comprises a metal.

11. The panel of claim 10, wherein the metal comprises aluminum.

12. The panel of claim 1, wherein the thermally conductive material comprises plastic.

13. The panel of claim 1, wherein the modular display panel has a height and a width, and wherein a ratio of the height to the width is 1:1 or 1:2.

14. A modular display panel comprising:
a printed circuit board having a first side and an opposite second side;
a light emitting diode (LED) board enclosure comprising a thermally conductive material, the opposite second side of the printed circuit board being attached to the LED board enclosure,
  wherein the LED board enclosure contacts the opposite second side of the printed circuit board,
  wherein the LED board enclosure comprises plastic sidewalls and a plastic back wall, and
  wherein the plastic back wall of the LED board enclosure comprises a first outer surface of the modular display panel;
a driver circuit disposed in the LED board enclosure at the opposite second side of the printed circuit board, the driver circuit electrically coupled to the printed circuit board;
a plurality of LEDs arranged as pixels and attached to the first side of the printed circuit board, wherein the pixels are arranged in a rectangular array comprising at least fifty pixels;
a power supply enclosure mounted over the first outer surface of the LED board enclosure, the power supply enclosure comprising sidewalls, a front wall, and an opposing back wall that is a second outer surface of the modular display panel;
a power supply for powering the plurality of LEDs, the power supply being disposed in the power supply enclosure, wherein the power supply comprises a power converter for converting alternating current (AC) power to direct current (DC) power, wherein a combination of the sidewalls, front wall, and opposing back wall of the power supply enclosure encloses the power supply on all sides, and wherein both a first portion of the LED board enclosure and a second portion of the power supply enclosure are disposed between the printed circuit board and the power supply;
a heat conducting structure disposed between the power supply and the power supply enclosure;
a plurality of louvers attached to the first side of the printed circuit board;
a potting material disposed at the first side of the printed circuit board; and
wherein the modular display panel is sealed to be waterproof.

15. The panel of claim 14, wherein the opposite second side of the printed circuit board is directly attached to the LED board enclosure.

16. A modular display panel comprising:
a light emitting diode (LED) board enclosure comprising plastic sidewalls and a plastic back wall, the LED board enclosure being part of a first outer surface of the modular display panel that is exposed to an external environment, the LED board enclosure configured to be attached with other modular display panels to form a multi-panel modular display;
a printed circuit board attached to the LED board enclosure;
a plurality of LEDs arranged as pixels attached to a first side of the printed circuit board, wherein the pixels are arranged in a rectangular array comprising at least fifty pixels;
a circuit for controlling the plurality of LEDs attached to a second side of the printed circuit board, the second side being opposite to the first side, wherein the circuit is disposed within the LED board enclosure;
a power supply enclosure mounted over the first outer surface of the LED board enclosure, the power supply enclosure comprising sidewalls, a front wall, and an opposing back wall that is a second outer surface of the modular display panel;
a power supply for powering the plurality of LEDs, the power supply being disposed in the power supply enclosure and comprising a power converter for converting alternating current (AC) power to direct current (DC) power, wherein a combination of the sidewalls, front wall, and opposing back wall of the power supply enclosure encloses the power supply on all sides, and wherein both a first portion of the LED board enclosure and a second portion of the power supply enclosure are disposed between the printed circuit board and the power supply;
a thermally conductive material disposed between the power supply and the power supply enclosure, wherein the plastic back wall of the LED board enclosure comprises the part of the first outer surface of the modular display panel;
a framework of louvers disposed over the printed circuit board, the framework of louvers disposed between rows of the plurality of LEDs; and
wherein the modular display panel is sealed to be waterproof.

17. The panel of claim 16, wherein the modular display panel is completely waterproof against submersion in up to 3 feet of water.

18. The panel of claim 16, wherein the modular display panel comprises an ingress protection (IP) rating of IP 65.

19. The panel of claim 16, wherein the modular display panel comprises an ingress protection (IP) rating of or IP 66.

20. The panel of claim 16, wherein the modular display panel comprises an ingress protection (IP) rating of IP 67 or IP 68.

21. A modular display panel comprising:
a casing comprising a first side and an opposite second side, wherein the first side of the casing comprises plastic sidewalls and a plastic back wall that is part of a first outer surface of the modular display panel;
a printed circuit board attached to the casing;
a plurality of LEDs arranged as pixels attached to a first side of the printed circuit board, wherein the pixels are arranged in a rectangular array comprising at least fifty pixels;
a potting compound overlying the first side of the printed circuit board;
a circuit for controlling the plurality of LEDs attached to a second side of the printed circuit board, the second side being opposite to the first side of the printed circuit board, wherein the circuit is disposed within the casing;
a power supply housing mounted outside the casing over the first outer surface of the casing, the power supply housing comprising sidewalls, a front wall, and an opposing back wall that is a second outer surface of the modular display panel;
a power supply for powering the plurality of LEDs, the power supply being disposed in the power supply housing, wherein the power supply comprises a power converter for converting alternating current (AC) power to direct current (DC) power, wherein a combination of the sidewalls, front wall, and opposing back wall of the power supply housing encloses the power supply on all sides, and wherein both a first portion of the casing and a second portion of the power supply housing are disposed between the printed circuit board and the power supply; and
a thermally conductive material to extract heat disposed proximate to the power supply, wherein the modular display panel is sealed to be waterproof.

22. The panel of claim 21, further comprising:
a first integrated data and power cable connector electrically coupled to the printed circuit board and the power supply; and
a second integrated data and power cable connector electrically coupled to the printed circuit board and the power supply.

23. The panel of claim 21, further comprising a framework of louvers disposed over first side of the printed circuit board, the framework of louvers disposed between rows of the LEDs.

24. The panel of claim 21, wherein the modular display panel is completely waterproof against submersion in up to 3 feet of water.

25. The panel of claim 21, wherein the modular display panel comprises an ingress protection (IP) rating of IP 65.

26. The panel of claim 21, wherein the modular display panel comprises an ingress protection (IP) rating of IP 66.

27. The panel of claim 21, wherein the modular display panel comprises an ingress protection (IP) rating of IP 67 or IP 68.

28. The panel of claim 21, wherein the modular display panel comprises only one printed circuit board.

\* \* \* \* \*